US012577261B2

(12) United States Patent
Thompson et al.

(10) Patent No.: US 12,577,261 B2
(45) **Date of Patent: *Mar. 17, 2026**

(54) CARBENE COMPOUNDS AND ORGANIC ELECTROLUMINESCENT DEVICES

(71) Applicant: UNIVERSITY OF SOUTHERN CALIFORNIA, Los Angeles, CA (US)

(72) Inventors: Mark E. Thompson, Anaheim Hills, CA (US); Peter I. Djurovich, Long Beach, CA (US); Rasha Hamze, Los Angeles, CA (US); Shuyang Shi, Los Angeles, CA (US); Moon Chul Jung, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/193,678

(22) Filed: Mar. 31, 2023

(65) Prior Publication Data

US 2023/0250111 A1 Aug. 10, 2023

Related U.S. Application Data

(63) Continuation of application No. 16/191,604, filed on Nov. 15, 2018, now Pat. No. 12,180,230.

(Continued)

(51) Int. Cl.

*C07F 1/08* (2006.01)
*C07F 1/10* (2006.01)

(Continued)

(52) U.S. Cl.

CPC .................. *C07F 1/10* (2013.01); *C07F 1/08* (2013.01); *C07F 1/12* (2013.01); *H10K 50/11* (2023.02);

(Continued)

(58) Field of Classification Search

CPC . H10K 85/371; C07F 1/10; C07F 1/08; C07F 1/12

See application file for complete search history.

(56) References Cited

U.S. PATENT DOCUMENTS

| | | | | |
|---|---|---|---|---|
| 2015/0108451 A1* | 4/2015 | Thompson ........... | H10K 85/371 548/103 |
| 2016/0072081 A1* | 3/2016 | Metz .................... | H10K 85/342 252/301.16 |
| 2016/0133839 A1* | 5/2016 | Li ........................ | H10K 85/371 257/40 |

FOREIGN PATENT DOCUMENTS

WO 2017/046572 3/2017

OTHER PUBLICATIONS

Communication pursuant to Article 94(3) EPC issued on Mar. 6, 2020 in corresponding European Application No. EP 18208699.1.

(Continued)

*Primary Examiner* — Jennifer A Boyd
*Assistant Examiner* — Rachel Simbana
(74) *Attorney, Agent, or Firm* — DUANE MORRIS LLP

(57) ABSTRACT

Provided is a compound having Formula I (Continued)

where rings A and B are independently a five-membered or six-membered, carbocyclic or heterocyclic ring, each of which is optionally aromatic; together with nitrogen atoms bonded to ring A and ring B, ring W is a 5-membered N-heterocyclic carbene; and the remaining variables are as defined herein.

17 Claims, 28 Drawing Sheets

Related U.S. Application Data

(60) Provisional application No. 62/725,069, filed on Aug. 30, 2018, provisional application No. 62/721,299, filed on Aug. 22, 2018, provisional application No. 62/652,640, filed on Apr. 4, 2018, provisional application No. 62/591,406, filed on Nov. 28, 2017.

(51) Int. Cl.

| | |
|---|---|
| ***C07F 1/12*** | (2006.01) |
| ***C09K 11/06*** | (2006.01) |
| ***H10K 50/11*** | (2023.01) |
| ***H10K 50/12*** | (2023.01) |
| ***H10K 85/30*** | (2023.01) |
| ***H10K 85/60*** | (2023.01) |
| ***H10K 101/10*** | (2023.01) |

(52) U.S. Cl.

CPC ....... *H10K 85/371* (2023.02); *H10K 2101/10* (2023.02)

(56) References Cited

OTHER PUBLICATIONS

Collins, Lee R. et al., "Copper Diamidocarbene Complexes: Characterization of Monomeric to Tetrameric Species", Inorg. Chem., 2014, 53, pgd. 2699-2707.

Di, D.; Romanov, A.S.; Yang, L.; Richter, J.M.; Rivett, J.P.; Jones, S.; Thomas, T.H.; Abdi Jalebi, J.; Friend, R.H.; Linnolahti, M., 2017, Highly efficient light-emitting diodes based on intramolecular rotation, Science, 356, 159-163 (Year: 2017).

Lv, S.; Wang, J.; Zhang, C.; Xu, S.; Shi, M.; Zhang, J., 2015, Silver-Catalyzed Amidiniumation of Alkynes: Isolation of a Silver Intermediate, Synthesis of Enamine Amido Carbene Precursors, and an Unprecedented Umpolung of Propiolamide, Angew. Chem. Int. Ed. 51, 14941-14946 (Year: 2015).

Arumugam, K.; Varghese, B.; Brantley, J.N.; Kanda, S.S.; Lynch, V.M.; Bielawski, C.W., 2014, 1,6-Enye Cyclizations Catalyzed by N-Heterocyclic Carbene Supported Gold Complexes: Deconvoluting Sterics and Electronics, Eur. J. Org. Chem. 493-497. (Year: 2014).

Collins, L.R.; Riddlestone, I.M.; Mahon, M.F.; Whittlesey, M.K., 2015, A comparison of the Stability and Reactivity of Diamido-and Diaminocarbene Copper Alkoxide and Hydride Complexes, Chem. Eur. J. 21, 14075-14084 (Year: 2015).

Shi, S.; Collins, L.R.; Mahon, M.F.; Djurovich, P.I.; Thompson, M.E.; Whittlesey, M.K., 2017, Synthesis and characterization of phosphorescent two-coordinate copper(I) complexes bearing diamidocarbene ligands, Dalton Trans., 46, 7 45-752 (Year: 2017).

Shen, W.; Li, J.; Zhang, C.; Shi, M.; Zhang, J., 2016, Copper, Silver, and Sodium Salt-Mediated Quaternization by Arylation: Syntheses of N-Heterocyclic Carbene Precursors and 6-H-Phenanthridine Derivatives, Chem. Asian J., 11, 1883-1886 (Year: 2016).

Frey, G.D.; Donnadieu, B.; Soleilhavoup, M.; Bertrand, G.; 2011, Synthesis of a Room-Temperature-Stable Dimeric Copper (I) Hydride, Chem. Asian, J., 6, 402-405 (Year: 2011).

* cited by examiner (MAAC*)Cu($CzCN_2$) (1)

(MAAC*)Cu(CzCN) (2)

(MAAC*)Cu(Cz) (3)

(DAC*)Cu(CzCN) (4)

(DAC*)Cu(Cz) (5)

6a

6c

6d

10b

7

8

9

11

HATCN
NPD
mCBP
Bphen (a)

TPBi

CARBENE COMPOUNDS AND ORGANIC ELECTROLUMINESCENT DEVICES

CROSS-REFERENCE TO RELATED APPLICATIONS

This application is a continuation of co-pending U.S. patent application Ser. No. 16/191,604, filed-on Nov. 15, 2018, which claims priority under 35 U.S.C. § 119(e) to United States Provisional Application Nos.: 62/725,069 filed Aug. 30, 2018; 62/721,299 filed Aug. 22, 2018; 62/652,640 filed Apr. 4, 2018; and 62/591,406 filed Nov. 28, 2017; the entire contents of each are incorporated herein by reference.

GOVERNMENT RIGHTS

This invention was made with government support under Award No. DE-EE0007077 awarded by Office of Energy Efficiency and Renewable Energy (EERE) and United States Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The invention relates to organic light emitting devices that emit white light, and lighting applications of such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

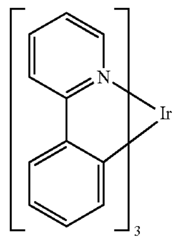

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

To our knowledge, the only reported luminescent 2-coordinate Cu(I) compounds are: neutral, 2-coordinate carbene-Cu-amide compounds described in U.S. Pat. No. 9,853,229, assigned to University of Southern California; a cationic bis-lutidine compound which is luminescent only at 77K, Simon, J. A., Palke, W. E. & Ford, P. C. Inorganic Chemistry 1996, 35, 6413-21; cationic bis-carbene compounds, Shi, S. Y. et al. Dalton Transactions 2017, 46, 745-752, and Gernert, M., et al., Chemistry A European Journal 2017, 23, 2206-16; neutral carbene-Cu halides, aryls, acetylides, alkoxides, thiolates, and amides. See, Romanov, A. S. et al. Chemical Communications 2016, 52, 6379-6382, Hamze, R. et al. Chemical Communications 201753, 9008-11, Bochmann, M. et al. Chemistry A European Journal 2017, 23, 4625-37. Additionally, a series of Cu(I) compoundes featuring a sterically-demanding thiolate ligand and a monodentate phosphine, lutidine, ether, thioketone, and NHC were reported in 2008, and did not include any photophysical characterization.

Bochmann and coworkers report the mechanism of luminescence for a 2-coordinate carbene-Cu(carbazole) compound. See, Di, D. W. et al. High-performance light-emitting diodes based on carbene-metal-amides. Science 2017, 356, 159-163, and Bochmann, M., et al., WO2017046572. The group reports molecular rotation around carbene-Cu or Cu—N bond, which in turn allows for spin-inversion and a stabilization of the first excited singlet state below the lowest triplet manifold. This process is termed "rotation-assisted spin inversion" (RASI). We propose an alternative photopysical mechanism in which there are two triplet states in equilibrium, one ligand localized and the other charge transfer in character. Bochman et al. does not report PLQY or $k_r$ of their compounds. Although Cu(I) compounds have been reported to have $k_r \geq 10^5\ s^{-1}$, the majority of which are dinuclear (CuX)n compounds that make use of the additional SOC induced by the halide, X. In contrast, the few mononuclear Cu(I) compounds with high radiative rates ($k_r \geq 10^5\ s^{-1}$) also have high non-radiative rates in fluid and polymeric matrices. Bochmann has also reported a vacuum-deposited OLED with CAAC-AuCz complex as a dopant. See, Conaghan et al., "Efficient Vacuum-Processed Light-Emitting Diodes Based on Carbene-Metal-Amides" Advanced Materials 0, 1802285, doi:10.1002/adma.201802285 (2018)

OLED devices based on two-coordinate mononuclear Cu compounds include a two-coordinate bis-CAAC Cu OLED which showed inefficient energy transfer from the host to the dopant as well as a CAAC-Cu-Cz OLED which shows an EQE of 9%. Both OLEDs were fabricated through solution process.

SUMMARY

Two-coordinate metal (I)carbene compounds selected from the group consisting of Formula I, Formula II, and Formula III, Formula I

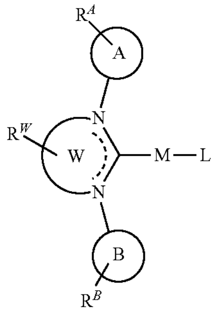

Formula II

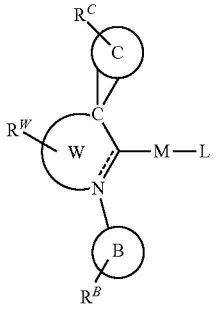

Formula III

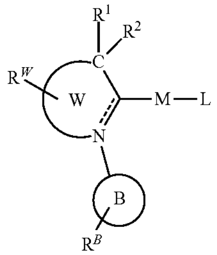

wherein ring A, ring B, and ring C are independently a five-membered or six-membered, carbocyclic or heterocyclic ring, each of which is optionally aromatic;

ring W of Formula I is a 6-membered heterocyclic ring, and ring W of Formula II or Formula III is a 5-membered or 6-membered heterocyclic ring;

L is a monodentate ligand with a metal coordinating member selected from the group consisting of C, N, O, S, and P;

M is a metal selected from the group consisting of Cu, Au, and Ag;

$R^A$, $R^B$, $R^C$, and $R^W$ represent mono to the maximum allowable substitution, or no substitution, and each $R^A$, $R^B$, and $R^C$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, and combinations thereof; or optionally, any two adjacent $R^A$, $R^B$, $R^C$, or $R^W$ can join to form a ring, which is optionally substituted; and wherein for the compounds of Formula I, the two $R^W$ do not join to form a naphthalene fused to ring W;

wherein the compounds of Formulae II and III do not include a carbene ligand A

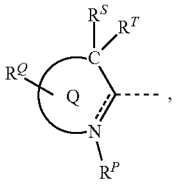

ligand A ring Q is a five-membered or six-membered ring, $R^Q$, $R^S$ and $R^T$ are independently selected from the group consisting of hydrogen, a $C_{1-20}$ alkyl, and two $R^Q$, or $R^S$ and $R^T$, can join to form an optionally substituted saturated cyclic hydrocarbyl ring with an optional heteroatom; and $R^P$ is selected from an optionally substituted alkyl, an optionally substituted alkenyl, an optionally substituted aryl, and an optionally substituted heteroaryl.

According to another aspect, a compound having Formula I

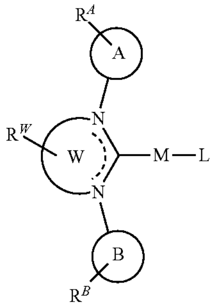

is disclosed; wherein ring A and ring B are independently a five-membered or six-membered, carbocyclic or heterocyclic ring, each of which is optionally aromatic;

together with nitrogen atoms bonded to ring A and ring B, ring W is a 5-membered N-heterocyclic carbene;

L is a monodentate ligand with a coordinating member selected from the group consisting of C, N, O, S, and P;

M is a metal selected from the group consisting of Cu, Au, and Ag; $R^A$, $R^B$, and $R^W$ represent mono to the maximum allowable substitution, or no substitution, and each $R^A$ and $R^B$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, and combinations thereof;

$R^W$ is selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof; or optionally, any two adjacent $R^A$, $R^B$, or $R^W$ can join to form a ring, which is optionally substituted; and two $R^W$ do not join to form a naphthalene fused to ring W.

An organic electroluminescent device that includes an anode, a cathode, and an organic layer comprising a compound selected from Formula I, Formula II, or Formula III as defined herein.

A consumer product comprising an organic light-emitting device (OLED), the OLED including an anode, a cathode, and an organic layer comprising a compound selected from Formula I, Formula II, and Formula III as defined herein.

DETAILED DESCRIPTION

We describe a class of luminescent two-coordinate metal (I) carbene compounds with planar or twisted geometry (i.e., opposite coordinating ring systems out of plane) about the metal. The metal(I) is selected from,Cu(I), Ag(I), and Au(I). The compounds can be further described as a combination of a monodentate carbene ligand and a monodentate neutral ligand, or a combination of a monodentate carbene ligand and a monodentate monoanionic ligand, to provide two-coordinated metal(I) compounds that have an overall cationic or neutral charge, respectively. An exemplary family of carbenes include the cyclic alkyl amino carbenes (CAACs), as well as conventional and non-conventional N-heterocyclic carbene ligands such as imidazol-2-ylidene (BzI), monoamido-aminocarbene (MAACs), and diamidocarbene (DACs).

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
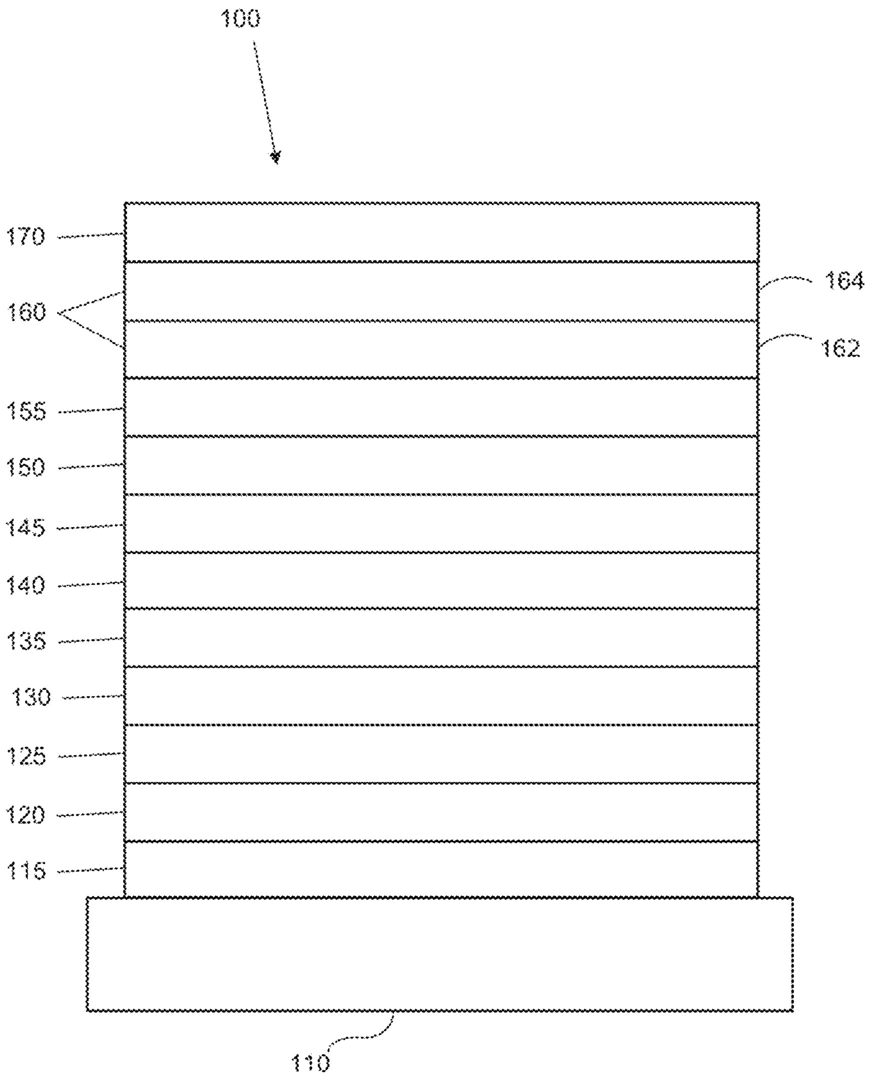
FIG. 1. shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with Fa-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
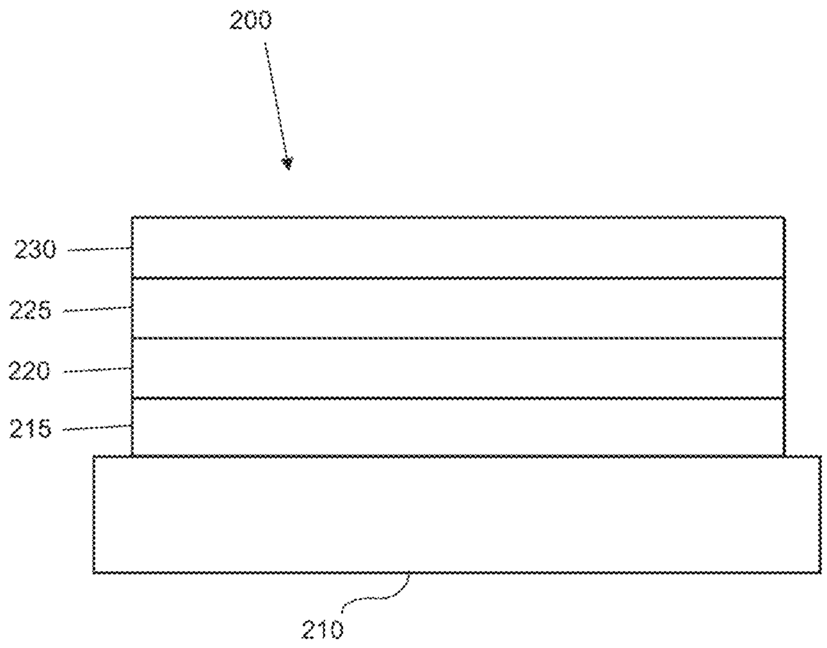
FIG. 2. shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree c. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —SR, radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each R. can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl,and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The tens "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., Angew Chem. Int. Ed. (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

As used herein, "electron-withdrawing substituent" refers to an individual atom, e.g., fluorine, or a functional group that withdraws electron density from a conjugated ring system, e.g., an aromatic ring system. Some examples of electron-withdrawing groups include —F, —$CF_3$, —$NO_2$, and ester.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

We describe carbene compounds selected from the group consisting of Formula I, Formula II, and Formula III, Formula I

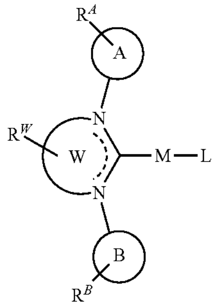

Formula II

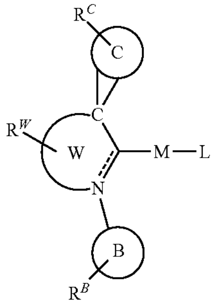

Formula III

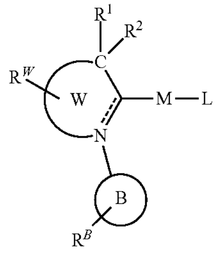

wherein ring A, ring B, and ring C are independently a five-membered or six-membered, carbocyclic or heterocyclic ring, each of which is optionally aromatic;

ring W of Formula I is a 6-membered heterocyclic ring, and ring W of Formula II or Formula III is a 5-membered or 6-membered heterocyclic ring;

L is a monodentate ligand with a metal coordinating member selected from the group consisting of C, N, O, S, and P;

M is a metal selected from the group consisting of Cu, Au, and Ag; $R^A$, $R^B$, $R^C$, and $R^W$ represent mono to the maximum allowable substitution, or no substitution, and each $R^A$, $R^B$, and $R^C$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, and combinations thereof; or optionally, any two adjacent $R^A$, $R^B$, $R^C$, or $R^W$ can join to form a ring, which is optionally substituted; and wherein for the compounds of Formula I, the two $R^W$ do not join to form a naphthalene fused to ring W;

wherein the compounds of Formulae II and III do not include a carbene ligand A

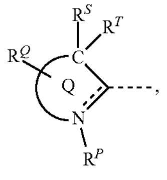

ligand A wherein ring Q is a five-membered or six-membered ring, $R^Q$, $R^S$ and $R^T$ are independently selected from the group consisting of hydrogen, a $C_{1-20}$ alkyl, and two $R^Q$, or $R^S$ and $R^T$, can join to form an optionally substituted saturated cyclic hydrocarbyl ring with an optional heteroatom; and $R^P$ is selected from an optionally substituted alkyl, an optionally substituted alkenyl, an optionally substituted aryl, and an optionally substituted heteroaryl.

In some instances, $R^A$, $R^B$, $R^C$, and $R^W$ are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the $R^A$, $R^B$, $R^C$, and $R^W$ are selected from the group consisting of deuterium, fluorine, alkyl, cycloalkyl, alkoxy, aryloxy, amino, silyl, aryl, heteroaryl, sulfanyl, and combinations thereof.

In yet other instances, a preferred listing of $R^A$, $R^B$, $R^C$, and $R^W$ are selected from the group consisting of deuterium, fluorine, alkyl, cycloalkyl, aryl, heteroaryl, and combinations thereof.

Luminescent two-coordinate metal(I) carbene compounds that are of particular interest will have an overall neutral charge and include a monodentate organoamide ligand, a monodentate alkylide ligand, a monodentate arylide ligand, a monodentate organooxide, or a monodentate organosulfide ligand. In one embodiment, the compounds are likely to have a carbene ligand selected from CAAC, BzI, MAAC, or DAC. The organoamide, alkylide, arylide, organooxide, or organosulfide ligand will likely have a core molecular ring structure that is optionally substituted, and in many instances the core structure will be an aromatic ring system that includes two or more, e.g., a two to five fused ring structure, that is substantially planar. In some instances, the amide, oxide, or sulfide ligand will include substituents that crowd or protect the metal center, which is believed to enhance the stability of the compound in its ground and/or its electronically excited states. Perhaps, more importantly, the substantially planar ring systems will tend to be twisted out of the plane relative to the ring system of the opposite carbene ligand. The angle of twist out of the plane can be in a range from 300 to as much as 90°, and more likely in a range from 500 to 900 or from 65° to 90°.

Some of the exemplary monodentate monoanionic ligands investigated include substituted and non-substituted carbazolides, diphenylamides, substituted phenyl, a substituted phenyl oxide, or a substituted phenyl sulfide, as well as the corresponding aza-analogs of each. Representative monodentate neutral ligands include, but not limited to, tertiary amines, N-heteroaryl ligands (e.g., pyridyl, pyrimidine, triazole), phosphines, e.g., triaryl or triaryloxy phosphines. Again, any one of such ligands are likely to be substituted to sterically enhance the stabilization of the excited state in each metal(I) carbene compound, and therefore, improve upon corresponding device lifetimes. The compounds can exhibit high quantum efficiency up to 100% in fluid and polymeric matrices with radiative rates on the order of $10^5$ $s^{-1}$, which are unknown for Cu(I), Ag(I) or Au(I) metal centers. These radiative rates are comparable to state of the art known organoiridium and organoplatinum phosphorescent complexes.

The character of the radiative transition is believed to be charge transfer from the electron rich monodentate ligand, e.g., an organoamide or alkylide, to the electron-deficient carbene with little metal centered contribution. The associated charge transfer (CT) state is characterized by a high extinction coefficient in absorption ($\in \sim 10^3$ $M^{-1}.cm^{-1}$). Furthermore, the CT state in question exhibits a small energy splitting between its singlet and triplet manifolds, with $\Delta E_{1CT-3CT} \leq 150$ meV, preferably less than 100 meV, resulting in compounds that resemble highly-efficient thermally activated delayed fluorescence (TADF) compounds. In many instances this singlet and triplet manifolds ($\Delta E_{1CT-3CT}$) is defined in a range from 10 meV to 150 meV, 20 meV to 100 meV, 20 meV to 80 meV, or 30 meV to 60 meV.

For many of the carbene metal(I) amide compounds, and in particular, for the amide carbazolide compounds described below, we note the presence of a closely-lying localized triplet state, $^3$LE, which is amide-centered, e.g., carbazolide-centered. This$^3$LE can admix with $^3$CT to varying degrees, depending on the solvating matrix as well as on the nature of the carbene. Accordingly, emission color (and the related $^{1/3}$CT/$^3$LE ordering) can be tuned as desired by modulating the electron-accepting ability of the carbene and the electron donating ability of the amide. The design of such compounds can provide for color tuning over 240 nm, i.e., from deep blue/violet, to red, and therefore, cover most, if not all, of the visible spectrum.

The compounds can be used in an organic electroluminescent device as light-emitting dopants or as non-emitting host materials. For example, as light-emitting dopants the fine tuning of the metal(I) coordination environment can result in a blue emitting dopant, a green emitting dopant, an orange (amber) emitting dopant, or a red emitting dopant. The term "red emitting dopant" refers to a compound of the invention with a peak emissive wavelength of from 580 nm to 680 nm, or from 600 nm to 660 nm, or from 615 nm to 635 nm. The term "green emitting dopant" refers to a compound of the invention with a peak emissive wavelength of 500 mn to 580 nm, or from 510 nm to 550 nm. The term "blue emitting dopant" refers to a compound of the invention with a peak emissive wavelength of from 410 nm to 490 nm, or from 430 nm to 480 mn, or from 440 nm to 475 nm. Lastly, the term "amber emitting dopant" refers to a compound of the invention with a peak emissive wavelength of from 570 nm to 600 nm.

The two-coordinate metal(I) carbene compounds of the invention can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic ring.

As stated, many of the two-coordinate, metal(I) carbene compounds are characterized by those of ordinary skill in the art as TADF emitters. Accordingly, the device emits a luminescent radiation at room temperature when a voltage is applied across the organic light emitting device, and the luminescent radiation comprises a first radiation component. The first radiation component is from a delayed fluorescent process or triplet exciton harvesting process. In one embodiment, the lifetime of the first radiation component is at least 1 microsecond.

In another embodiment, the organic emissive layer that includes the compounds of the invention described above will further include a first phosphorescent emitting material such that the luminescent radiation comprises a second radiation component. The second radiation component arises from the first phosphorescent emitting material. In some instances, the organic emissive layer further includes a second phosphorescent emitting material.

In one embodiment, the luminescent radiation is a white light. In some instances, a first device comprises a second organic light emitting device, and the second organic light emitting device is stacked on the first device.

In one embodiment, the first radiation component is a blue light with a peak wavelength of about 400 nm to about 500 nm. In another embodiment, the first radiation component is a yellow light with a peak wavelength of about 530 nm to about 580 nm.

In addition, many of the two-coordinate metal(I) carbene compounds exhibit remarkably-strong permanent dipoles $\mu_D$ in a range from 4D to 24D, e.g., from 8 D to 20 D. In fact, many of the two-coordinate metal(I) carbene compounds exhibit remarkably-strong permanent dipoles of with $\mu_D$ greater than 11 D (calculated), which gives rise to remarkable solvatochromic properties. Another observed property of the compounds is their relatively unusual and high thermal stability, which allows for obtaining the compounds with high purity via sublimation, which provides for the fabrication of vapor-deposited organic layers, e.g., an organic emitting layer, in OLEDs. For example we describe the making of OLEDs with the compounds (MAAC*)M(I)Cz, (MAAC*) M(I) (CzCN), and ($CAAC^{Men}$) M(I)Cz as emitter dopants in a host material. Again, M(I) is selected from Cu(I), Ag(I), or Au(I). Many devices exhibited high external quantum efficiency (EQE) up to 10% and a brightness of 43,304 cd/$m^2$. In addition, the short emission decay lifetime reduces the efficiency roll-off at high driving currents, which addresses a known technical problem in many of the previously reported Cu OLEDs with mononuclear dopants. Blue OLEDs can also be made utilizing a high energy 2-coordinate Cu phosphor as a host material, making it the first device with an all copper emissive layer, i.e., a copper metal compound as a host and another copper metal compound as a dopant emitter. The 2-coordinate metal(I) carbene phosphor host will tend to have a higher $^3$LE than the 2-coordinate metal(I) emitter dopant.

The 2-coordinate metal(I) carbene compounds have an advantage of minimizing or avoiding certain modes of excited-state distortion, and thereby allowing for the suppression of non-radiative decay rates ($k_{nr}$). The 2-coordinate metal(I) compounds also provide an opportunity to structurally modify either side (monodentate ligand) of the complexes, which leads to electronic, e.g., the donor-acceptor properties of the complex, and steric modification, e.g., device stability. The result is that one can tune the photophysical properties, i.e. emission energies can be tuned throughout visible spectrum and frontier orbital energies can be tuned for devices. Moreover, selective ligand modification can provide for charge transport and charge trapping to occur on the ligands themselves with little contribution from the metal. This minimizes large reorganization energies associated with MLCT transitions in the metal(I) complexes.

In addition, by incorporating select group substitutions on the carbene or the anionic/neutral ligand with a sterically bulky substituent group one can design provide a more stericcaly encumbered 2-coordinate metal(I) complexes. This steric protection of the metal center can lead to an increase in stability of the compound in its electronic excited state and the corresponding lifetime stability of fabricated devices. Such coordination geometries can hinder rotation around the C-M/M-N bonds, thereby allowing for the elucidation of the role of molecular rotation and of the coordination environment on the photophysical properties of M(I)-carbene compounds of the invention.

In one embodiment, the 2-coordinate metal(I) compounds have an advantage of highly-luminescent compounds with fast radiative rates in fluid and polymeric media. The compounds exhibit efficient TADF with small $\Delta E_{1C\text{-}3CT}$ (≤150 meV) and large radiative rate constants ($k_r \geq 10^5\ s^{-1}$), which is not common in prior metal(I) TADF emitters. The use of redox active ligands bridged by the d-orbitals of the metal(I) center is believed to provide the above unique photophysical features, and thereby, circumventing the TADF conundrum typical of organic systems while minimizing reorganization energies typical of metal(I) systems.

In a particular embodiment, the 2-coordinate Cu(I) compounds have an advantage of highly-luminescent compounds with fast radiative rates in fluid and polymeric media. The compounds exhibit efficient TADF with small $\Delta E_{1CT\text{-}3CT}$ (≤150 meV) and large radiative rate constants ($k_r \geq 10^5\ s^{-1}$), which is not common in prior Cu(I) TADF emitters. The use of redox active ligands bridged by the d-orbitals of the Cu(I) center is believed to provide the above unique photophysical features, and thereby, circumventing the TADF conundrum typical of organic systems while minimizing reorganization energies typical of Cu(I) systems.

A series of 2-coordinate, neutral Cu(I), Ag(I), and Au(I) compounds have been synthesized and characterized, and the photophysical properties of many compounds are reported in various media. The results from our preliminary temperature-dependent photoluminescent experiments are in agreement with TADF as likely the mechanism of luminescence. All complexes have fast radiative rates and high $\Phi_{PL}$ in non-rigid media. As stated, the Ag(I) compounds have sub-microsecond excited state lifetimes. The thermal and photo-stability of all the compounds can be improved upon by crowding the coordinate environment about the metal such as by using relatively bulky substituent groups to block access to the metal.

Figure 3:
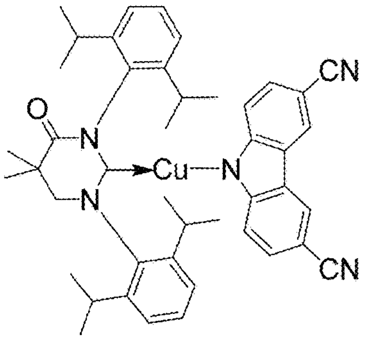
FIG. 3. Molecular structures of compounds 1 to 5.
Figure 3:
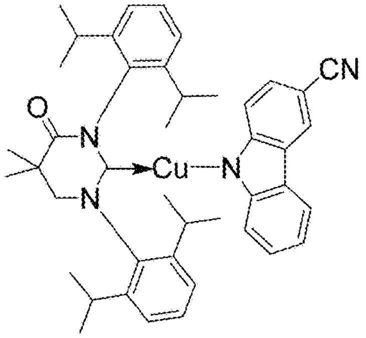
Figure 3:
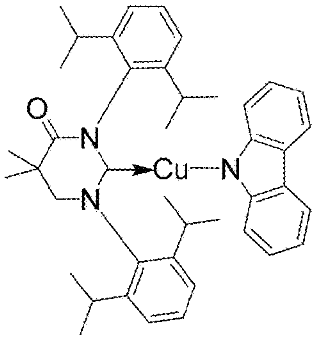
Figure 3:
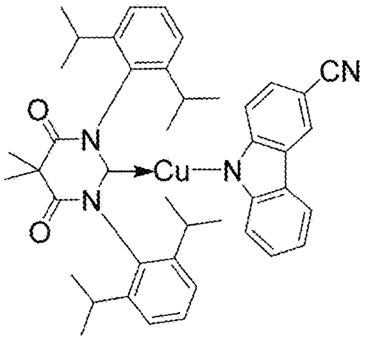
Figure 3:
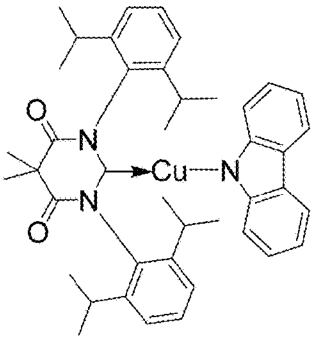

In our continued work with 2-coordinate Cu(I) carbene compounds (see, U.S. patent application Ser. No. 14/478,838, filed Sep. 5, 2014) we now describe a series of two-coordinate Cu(I) carbene compounds that also include amide ligands, e.g., carbazole (Cz) and benzimidazole (BzI) as well as N-heterocyclic carbene ligands monoamido aminocarbene (MAAC*) and diamidocarbene (DAC*) compounds, see the copper compounds of FIG. 3. Quite unexpectedly, many of these compounds exhibit highly efficient TADF. The compounds are found to exhibit high quantum efficiency up to 100% in polystyrene films with short decay lifetimes of less than 20 μs, e.g. from 0.1 μs to 20 μs, from 1 μs to 12 μs, or from 0.5 μs to 6 μs. The radiative rate constants of the compounds are in the order of $10^5\ s^{-1}$ which are extraordinary for Cu(I) compounds and comparable to those efficient phosphorescent emitters with noble metals like Ir and Pt.

We also investigated the analogous 2-coordinate silver, Ag(I), and gold, Au(I), carbene compounds with amide ligands. Of particular interest are the Ag(I) compounds as these compounds are not only highly luminescent but also have sub-microsecond radiative lifetimes that take advantage of triplet excited states. This constitutes an order-of-magnitude enhancement over the radiative lifetimes of state-of-the-art phosphorescent dopants based on six-coordinate Ir(III) compounds, which are presently used as visible light emitters in OLEDs and high-end consumer display products. The sub-microsecond radiative lifetimes for these compounds is important for mediating second-order quenching processes complicit in device degradation. Moreover, the luminescence of these coinage metal complexes can be tuned efficiently over the visible spectrum; we isolated deep blue, sky blue, green, and yellow emitters with high photoluminescent quantum yields (PLQY, $Dp_L$) and high radiative rates.

The compounds of Formula I and Formula III above are of particular interest as are those compounds of Formula I, II, or III in which ring B is selected from the group consisting of:

an optionally substituted cycloalkyl with 5 to 10 carbons;
an optionally substituted aryl with 6 to 10 carbons;
an optionally substituted heterocyclic with 3 to 8 carbons and 1 to 3 heteroatoms; and
an optionally substituted heteroaryl with 3 to 8 carbons and 1 to 4 heteroatoms.

Additional compounds of interest will have ring A and/or ring B as a 2,6-disubstituted phenyl or an aza-derivative thereof, wherein C1 of the 2,6-disubstituted phenyl group is connected to the nitrogen of the ring W.

In one embodiment, L is an amide of the formula $NR^XR^Y$, and $R^X$ and $R^Y$ are independently selected from the group consisting of hydrogen, deuterium, alkyl, cycloalkyl, heteroalkyl, heterocycloalkyl, aryl, heteroaryl, and combinations thereof; or optionally, $R^X$ and $R^Y$, can join to form a five-membered or six-membered, carbocyclic or heterocyclic ring, which is optionally substituted. Given that the amide is a formal −1 ligand, the metal(I) carbene compound would be neutral.

In another embodiment, L is a phosphide of the formula $PR^XR^Y$, and $R^X$ and $R^Y$ are independently selected from the group consisting of hydrogen, deuterium, alkyl, cycloalkyl, heteroalkyl, heterocycloalkyl, aryl, heteroaryl, and combinations thereof; or optionally, $R^X$ and $R^Y$, can join to form a five-membered or six-membered, carbocyclic or heterocyclic ring, which is optionally substituted. Given that the phosphide is a formal −1 ligand, the metal(I) carbene compound would be neutral.

In another embodiment, L is of the formula $CR^XR^YR^Z$, and $R^X$, $R^Y$, and $R^z$ are independently selected from the group consisting of hydrogen, deuterium, alkyl, cycloalkyl, heteroalkyl, heterocycloalkyl, aryl, heteroaryl, and combinations thereof; or optionally, $R^X$ and R can join to form a five-membered or six-membered, carbocyclic or heterocyclic ring, which is optionally substituted. Again, the metal(I) carbene compound would be neutral.

In another embodiment, L is an aryl ring, e.g. phenyl, optionally with one or two heteroatoms, including an optionally substituted phenyl ring. The phenyl ring is optionally substituted, particularly in one or both of the ortho positions (in relation to the C-M bond). Of particular interest is where L is selected from the group consisting of benzene, naphthalene, and anthracene, or a heteroaryl ring coordinated to the metal through a ring carbon, the heteroaryl ring selected from pyridine, pyrimidine, pyrazine, or benzo-analogs of each thereof. For example, the aryl ring can also be part of a fused polycyclic ring system, e.g, quinoline. Given that an aryl (Y is C) is a formal −1 ligand, the metal(I) carbene compound would be neutral.

In another embodiment, L is an organoxide or an organosulfide of the formula $—OR^x$ or $—SR^X$, respectively, and $R^X$ is defined above. Of particular interest is where $R^X$ is a substituted aryl or heteroaryl ring, preferably substitution at one or both of the ortho-positions. Given that an oxide or sulfide is a formal −1 ligand, the metal(I) carbene compound would be neutral.

In another embodiment, L is a five-membered or six-membered, heterocyclic ring (Y is O or S), which is optionally substituted. In this instance, the metal(I) carbene compound would have an overall charge of +1.

In another embodiment, L is an amine of the formula $NR^XR^YR^Z$, and $R^X$, $R^Y$, and $R^z$ are independently selected from the group consisting of hydrogen, deuterium, alkyl, cycloalkyl, heteroalkyl, heterocycloalkyl, aryl, heteroaryl, and combinations thereof; or optionally, $R^X$ and R can join to form five-membered or six-membered, carbocyclic or heterocyclic ring, which is optionally substituted. In this instance, the metal(I) carbene compound would have an overall charge of +1.

In another embodiment, L is a phosphine of the formula $PR^XR^YR^Z$, and $R^X$, $R^Y$ and $R^Z$ are independently selected from the group consisting of hydrogen, deuterium, alkyl, cycloalkyl, heteroalkyl, heterocycloalkyl, aryl, heteroaryl, and combinations thereof; or optionally, $R^X$ and R can join to form a five-membered or six-membered, carbocyclic or heterocyclic ring, which is optionally substituted. In this instance, the metal(I) carbene compound would have an overall charge of +1.

In another embodiment, L is a N-heterocyclic carbene ligand where Y is a carbene carbon, and forms a five-membered or six-membered heterocyclic ring, which is optionally substituted. In this instance, the metal(I) carbene compound would have an overall charge of +1.

In another embodiment, a compound is selected from the group consisting of Formula IA, Formula IB, and Formula IC Formula IA

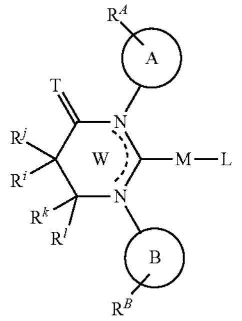

Formula IB

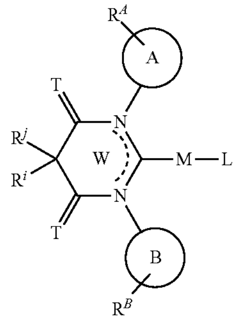

Formula IC

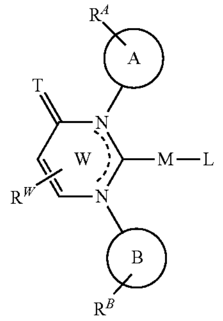

wherein

L is as defined above;

T is selected from O, S, $CR'''R''$, $SiR'''R''$, or $GeR'''R''$; and $R^i$, $R^j$, $R^k$, $R^l$, $R'''$, and $R''$ are independently selected from the group consisting of hydrogen, deuterium, halogen, alkyl, cycloalkyl, heteroalkyl, arylalkyl, amino, silyl, aryl, heteroaryl, and combinations thereof; or optionally, any two $R^i$, $R^j$, $R^k$, and $R^l$, and any two adjacent $R'''$ and $R''$, can join to form a ring, which is optionally substituted. In many instances, T is selected from O or $CR'''R''$. Rings A and B as well as $R^A$, $R^B$, and $R^W$, are as defined above.

In many instances, $R^i$, $R^j$, $R^k$, $R^l$, $R^m$, and $R^n$ are independently selected from the group consisting of hydrogen, deuterium, alkyl, cycloalkyl, heteroalkyl, aryl, heteroaryl, and combinations thereof; or optionally, $R^i$joins with $R^j$ to form a ring, or two $R^W$ join to form a ring, each of which is optionally substituted.

In another embodiment, we describe metal (I) carbene compounds of Formula I N, Formula II N, or Formula III N below.

Formula I N

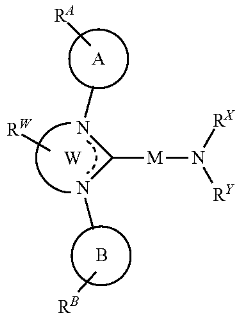

Formula II N

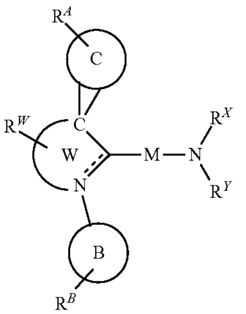

Formula III N

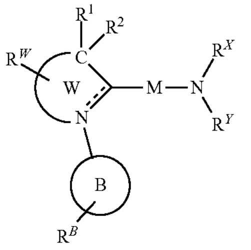

wherein ring A, ring B, and ring C are independently a five-membered or six-membered, carbocyclic or heterocyclic ring, each of which is optionally aromatic;

ring W of Formula I is a 6-membered heterocyclic ring, and ring W of Formula II N or Formula III N is a 5-membered or 6-membered heterocyclic ring;

M is a metal selected from the group consisting of Cu, Au, and Ag;

$R^A$, $R^B$, $R^C$, and $R^W$ represent mono to the maximum allowable substitution, or no substitution, and each $R^A$, $R^B$, and $R^C$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, and combinations thereof; or optionally, any two $R^A$, $R^B$, $R^C$, and $R^W$ can join to form a ring, which is optionally substituted; and $R^1$, $R^2$, $R^X$, and $R^Y$ are independently selected from the group consisting of hydrogen, deuterium, fluorine, alkyl, cycloalkyl, cycloalkenyl, heteroalkyl, heterocycloalkyl, aryl, heteroaryl, and combinations thereof; each of which is optionally substituted;

or optionally, $R^X$ and $R^Y$, can join to form a ring, which is optionally substituted;

wherein for the compounds of Formula I N, the two $R^W$ do not join to form a naphthalene fused to ring W;

wherein the compounds of Formulae II N and III N do not include a carbene ligand A

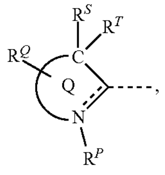

ligand A ring Q is a five-membered or six-membered ring, $R^Q$, $R^S$ and $R^T$ are independently selected from the group consisting of hydrogen, a $C_{1-20}$ alkyl, and two $R^Q$, or $R^S$ and $R^T$, can join to form an optionally substituted saturated cyclic hydrocarbyl ring with an optional heteroatom; and $R^P$ is selected from an optionally substituted alkyl, an optionally substituted alkenyl, an optionally substituted aryl, and an optionally substituted heteroaryl.

The compounds of Formula I N and Formula III N are of particular interest as are those compounds in which ring B is selected from the group consisting of:

an optionally substituted cycloalkyl with 5 to 10 carbons;

an optionally substituted aryl with 6 to 10 carbons;

an optionally substituted heterocyclic with 3 to 8 carbons and 1 to 3 heteroatoms; and an optionally substituted heteroaryl with 3 to 8 carbons and 1 to 4 heteroatoms.

Additional compounds of interest will have ring A and/or ring B as a 2,6-disubstituted phenyl or an aza-derivative thereof, wherein C1 of the 2,6-disubstituted phenyl group is connected to the nitrogen of the ring W.

The compounds selected from the group consisting of Formula I N1, Formula I N2, and Formula I N3 are of interest.

Formula I N1

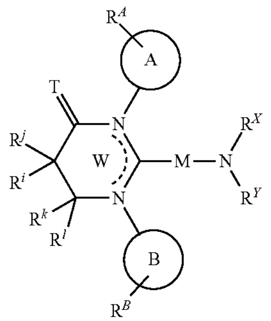

-continued

Formula I N2

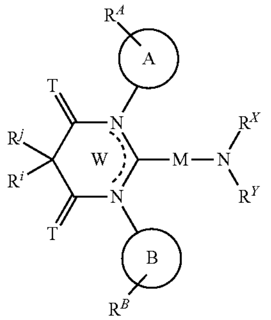

Formula I N3

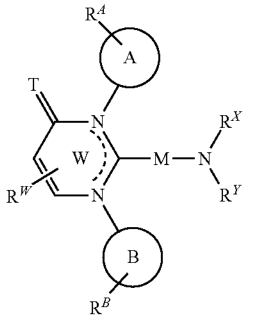

wherein

T is selected from O, S, $CR'''R''$, $SiR'''R''$ or $GeR'''R''$; and $R^i$, $R^j$, $R^k$, $R^l$, $R'''$, and $R''$ are independently selected from the group consisting of hydrogen, deuterium, halogen, alkyl, cycloalkyl, heteroalkyl, arylalkyl, amino, silyl, aryl, heteroaryl, and combinations thereof; or optionally, any two $R^i$, $R^j$, $R^k$, and $R^l$, and any two adjacent $R'''$ and $R''$, can join to form a ring, which is optionally substituted. In many instances, T is selected from O or $CR'''R''$. Rings A and B as well as $R^A$, $R^B$, $R^X$, $R^Y$, and $R^W$ are as defined above.

In many instances, $R^i$, $R^j$, $R^k$, $R^l$, $R'''$, and $R''$ are independently selected from the group consisting of hydrogen, deuterium, alkyl, cycloalkyl, heteroalkyl, aryl, heteroaryl, and combinations thereof; or optionally, $R^i$ joins with $R^j$ to form a ring, or two $R^W$ join to form a ring, each of which is optionally substituted.

In many instances, for any compounds structurally defined above, L is $NR^XR^Y$ and is selected from the group consisting of:

an optionally substituted carbazolyl, or an aza-derivative thereof;

an optionally substituted diphenylamino, or an aza-derivative thereof;

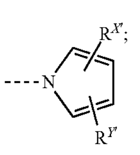

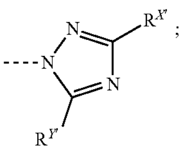

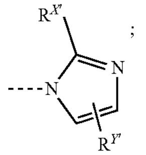

-continued

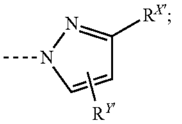

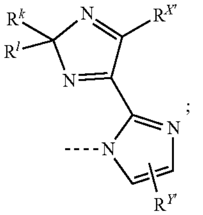

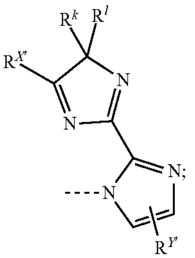

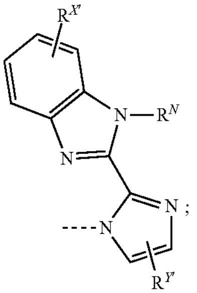

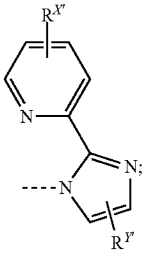

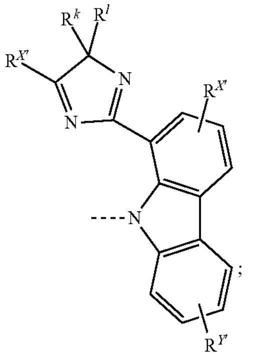

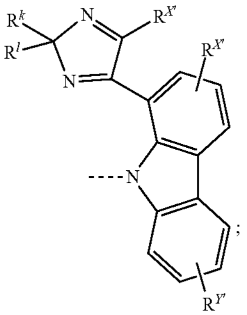

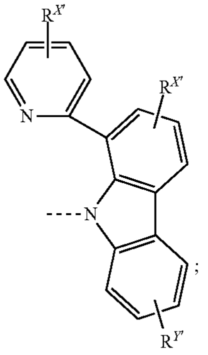

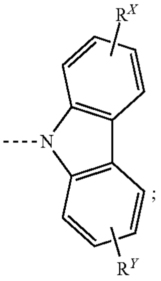

and

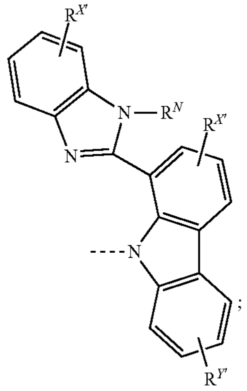

wherein $R^{X'}$, $R^{Y'}$, and $R^N$ are independently selected from the group consisting of hydrogen, deuterium, halogen, alkyl, cycloalkyl, heteroalkyl, arylalkyl, amino, silyl, aryl, heteroaryl, and combinations thereof; and $R^k$ and $R^l$ are as defined above.

We also describe an OLED that includes an anode, a cathode, and an organic layer comprising an organic layer, the organic layer comprising a metal(I)-carbene compound of Formula I, Formula II, or Formula III defined above. In another embodiment, we describe an OLED that includes an anode, a cathode, and an organic layer comprising an organic layer, the organic layer comprising a metal(I)-carbene compound of Formula IA, Formula IB, or Formula IC defined above.

In another embodiment, we describe an OLED that includes an anode, a cathode, and an organic layer comprising an organic layer, the organic layer comprising a metal (I)-carbene compound of Formula I N1, Formula II N, or Formula III N defined above. In another embodiment, we describe an OLED that includes an anode, a cathode, and an organic layer comprising an organic layer, the organic layer.comprising a metal(I)-carbene compound of Formula I N1, Formula I N2, or Formula I N3 defined above.

In one embodiment, we describe two-coordinate, neutral Cu(I) carbene compounds (see, FIG. 3, and below for quick reference) of (MAAC*)Cu($CzCN_2$) (1), (MAAC*)Cu (CzCN) (2), (MAAC*)CuCz (3), (DAC*)Cu(CzCN) (4) and (DAC*)CuCz (5) (* represents isopropyl substitution of the phenyl groups on N atoms of the carbene ligands, as shown). The incorporation of carbonyls into the cyclic carbene ligand, e.g., the MAACs and DACs, provides a gradual lowering of the LUMO energy concomitant with an increase in it-accepting properties. The isopropyl groups on the carbene ligands seem to provide enough steric hindrance to minimize the distortion of the compounds in the excited state. Moreover, the compounds are thermally stable, and therefore can be purified by sublimation. Also, the relatively high thermal stability allows the compounds to be vapor deposited with an emitter host material to form an emitter layer of an OLED. Accordingly, we also describe OLEDs with (MAAC*)CuCz, (MAAC*)Cu(CzCN) and ($CAAC^{Men}$)CuCz as emitter dopants that are made using vapor deposition. Each compound exhibits high external quantum efficiency (EQE), e.g., up to 10%, with no outcoupling design structures. In addition, the short emission decay lifetime reduces the efficiency roll-off at high driving currents, yielding a maximum brightness that can reach or exceed 43,300 cd/m$^2$.

(1)

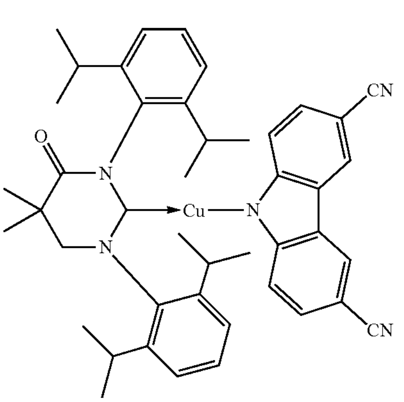

(MAAC*)Cu($CzCN_2$)

-continued (2)

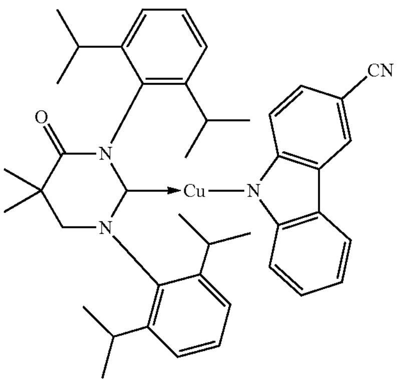

(MAAC*)Cu(CzCN)

(3)

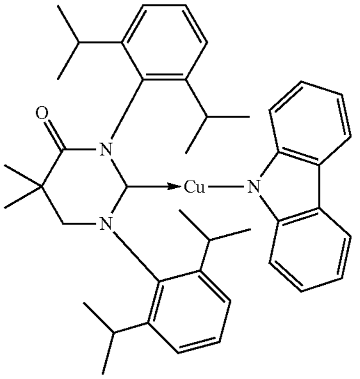

(MAAC*)Cu(Cz)

(4)

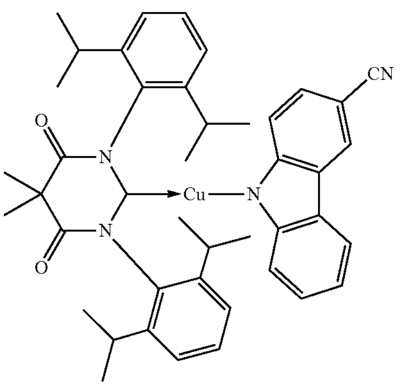

(DAC*)Cu(CzCN)

-continued (5)

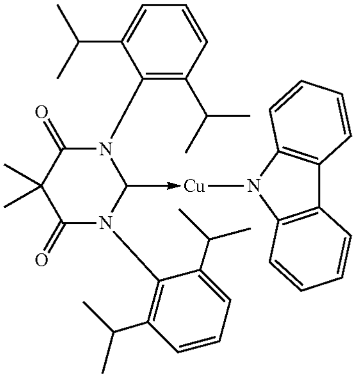

(DAC*)Cu(Cz)

Photophysical Properties

Absorption and emission spectra. Molar absorptivity of compounds 1 to 5 in MeTHF exhibit strong and broad spin-allowed charge-transfer (CT) transitions, and which are red-shifted from 1 to 4. Vibronic absorption is observed at ca. 360 nm for all compounds, which is consistent with the absorption of cabazolide (Cz). For compounds 1 and 2, the CT bands and the Cz absorption overlap with each other, whereas the CT bands of compounds 3 and 4 are lower energy than the Cz bands. The extinction coefficients of the CT absorption bands of all compounds are between 4000-6000 $M^{-1}$ $cm^{-1}$.

Figure 4A:
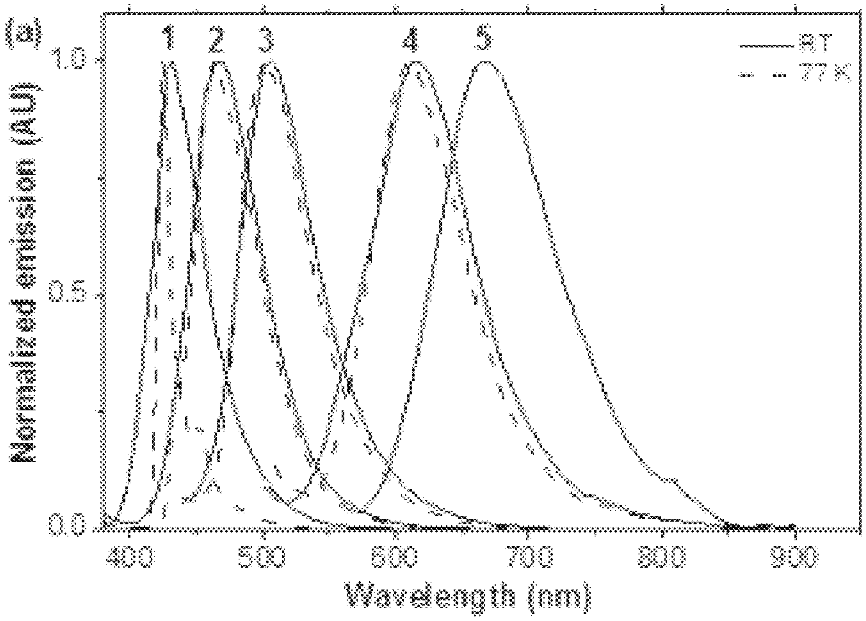
FIG. 4*a*. The emission spectra of compounds 1 to 5 as 1% polystyrene (PS) films at room temperature (RT) and 77 K.

Emission spectra of compounds 1 to 5 in 1% polystyrene films are shown in FIG. 4*a*. Photophysical data for compounds 1 to 6 in different media and as a neat solid are summarized in Table 1. As shown, the emission color changes from deep blue to red from compounds 1 to 5. Collectively, the quantum efficiency at room temperature ranges from 2% to 100% with extremely short decay lifetimes of about 1 μs, i.e. the data lists decay lifetimes from 0.052 to 2.3 s. In compounds 2 to 5, the emission spectra are broad and featureless (relative to compound 1) at both room temperature (RT) and 77 K, which is indicative of emission from CT states. Moreover, the emission spectra of compounds 2 to 4 show little or no shift (differences in position and shape) from RT to 77 K and the lifetimes increase by 2 to 5 orders of magnitude. Accordingly, the luminescence of compounds 2 to 5 is best described as thermally-activated-delayed fluorescence (TADF), which occurs when the higher lying singlet Si is thermally populated from the lowest triplet Ti. This thermal activation requires small energy separation between $S_1$ and $T_1$, and that explains the small shift or differences between the emission spectra at the different temperatures. The radiative rate constants of compounds 2 to 4 are in the order of $10^5$ $s^{-1}$ which are comparable to those of efficient phosphorescent emitters with noble metals such as Ir(III) and Pt(II). The non-radiative rate constants increase as the emission is red-shifted most likely due to energy gap law.

Figure 4B:
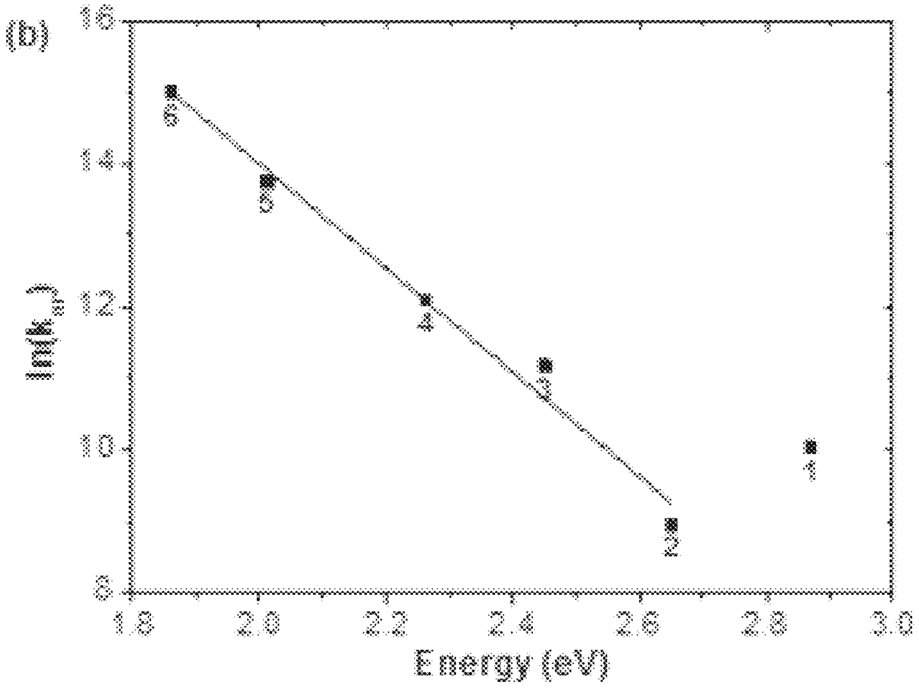
FIG. 4*b*. The natural log of the non-radiative rate plotted against ΔE for compounds 1 to 5 as 1% polystyrene films at room temperature.
Figure 5A:
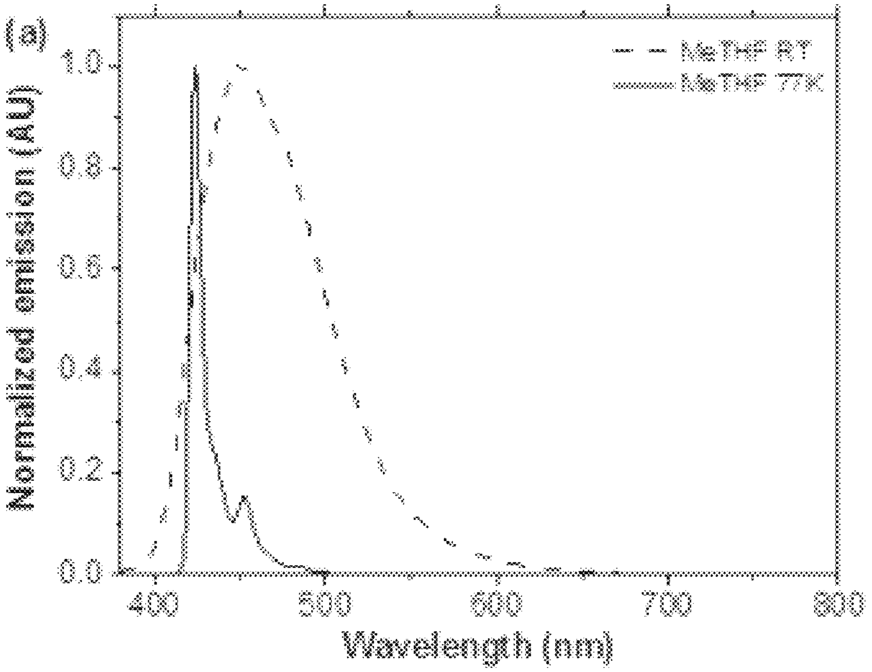
FIG. 5*a*. Emission spectra of compound 1 in methylcyclohexane (MeCy) at RT and 77 K.
Figure 5B:
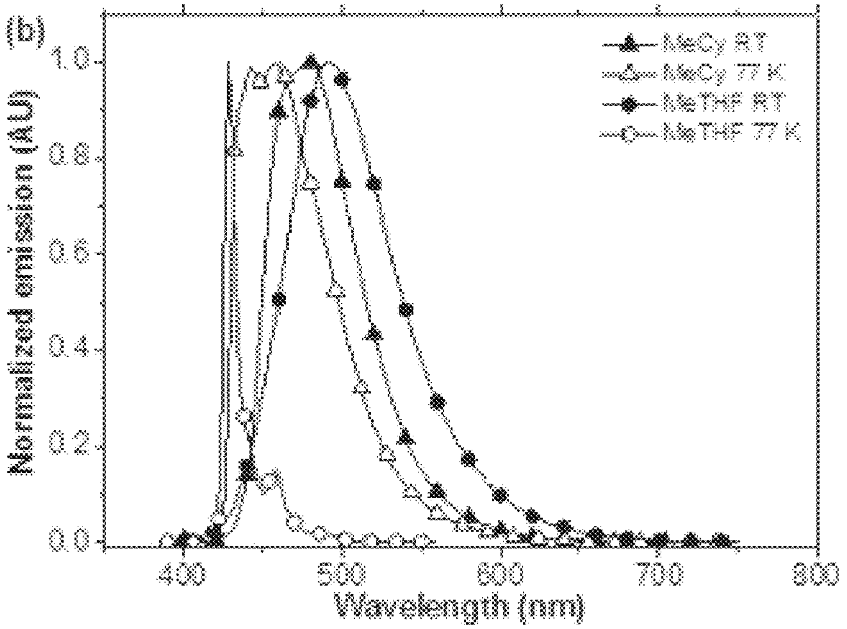
FIG. 5*b*. Emission spectra of compound 2 in MeCy and 2-methy-ltetrahydrofuran (MeTHF) at RT and 77 K.
Figure 5C:
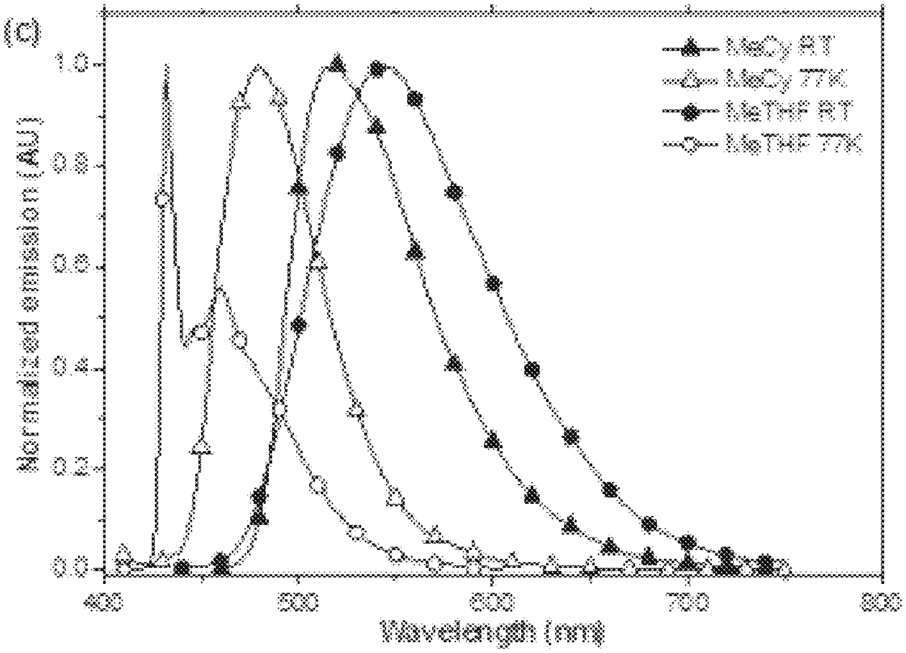
FIG. 5*c*. Emission spectra of compound 3 in MeCy and MeTHF at RT and 77 K.
Figure 5D:
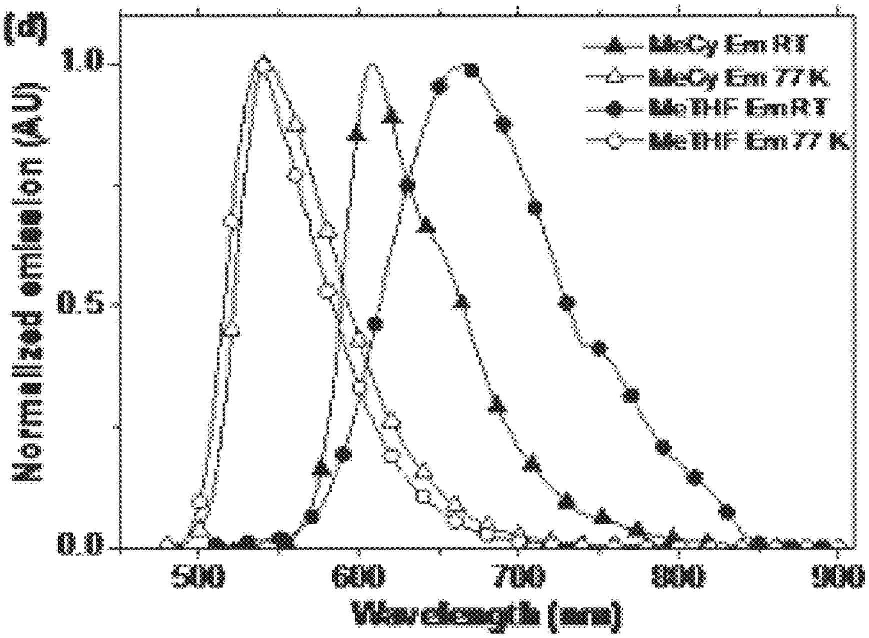
FIG. 5*d*. Emission spectra of compound 4 in MeCy and MeTHF at RT and 77 K.

For compound 1, the emission is featureless at RT, though it is well-resolved and shows a characteristic vibrational structure of carbazolide at 77 K. Moreover, the onset of the emission spectrum at RT is blue-shifted relative to 77 K, and the lifetime increases from a few microseconds at RT to 3.2 ms at 77 K. The vibronic spectrum along with the long lifetime at 77 K is indicative of emission from underlying triplet locally-excited ($^3$Cz) state. As temperature increases, internal conversion (IC) from the $^3$Cz state to $^3$CT state occurs, followed by up-conversion intersystem crossing (ISC) from the $^3$CT state to the $^1$CT state. Accordingly, both IC and ISC processes determine the overall decay rate, and this explains the relatively long lifetime of compound 1 at RT compared to that of compounds 2 to 4. A plot of $\ln(k_{nr})$ against ΔE is plotted, where ΔE is the energy separation between the lowest singlet excited state and the ground state obtained from the emission peak at RT, see FIG. 4*b*. For a series of materials which have similar ground and excited states but with varying energy of the excited state, a linear relationship is seen between the log of the non-radiative rate constant and the energy gap of the transition. As shown, a good linear fit is obtained for compounds 2 to 5. but not for compound 1.

The emission spectra of compounds 1, 2, 3, and 4 at both RT and 77 K are shown in FIG. 5*a*, 5*b*, 5*c*, and 5*d*, respectively (solvent matrix as indicated). For each compound the emission spectra is blue-shifted upon cooling in fluid solvents like MeTHF and methylcyclohexane (MeCy) resulting from destabilization of the CT states in more rigid environment. The shift is greater in methylTHF, which is likely attributed to its greater polarity than methylcyclohexane. The effect is minimized in polystyrene films due to the more rigid solution environment. Due to the relative positions of the $^3$CT and $^3$Cz states, each compound behaves differently at lower temperature. Compound 1 shows vibronic emission from the lower lying $^3$Cz state at 77 K in both polystyrene films and methylTHF because thermal activation from the lower lying $^3$Cz to the $^3$CT states is hindered. The decay lifetime at 430 nm are in the range of milliseconds. The same phenomenon is observed for compound 2 in MeTHF. However, for compound 2 the $^3$CT and $^3$Cz states are close in methylcyclohexane, and hence a combination of $^3$Cz and $^3$CT emission at 77 K is observed with CT dominating the emission. For compound 3, which has the CT states lower than the $^3$LE state, a strong combination of $^3$Cz and $^3$CT emission is only observed in methylTHF at 77K, whereas only broad CT emission is shown in methylcyclohexane. Compound 4 shows broad CT emission in all matrices at 77 K that is likely due to the significant lower energy of the CT states than $^3$Cz state. DFT calculations further prove this rationale (see next section).

TABLE 1

Luminescent properties of complexes 1-6 in different media.

| Complex | $\lambda_{max, RT}$ | $\Phi_{RT}$ | $\tau_{, RT}$ (μs) | $k_{r, RT}$ $10^5$ $s^{-1}$ | $k_{nr, RT}$ $10^5$ $s^{-1}$ | $\lambda_{max, 77K}$ | $\tau_{, 77K}$ (μs) |
|---|---|---|---|---|---|---|---|
| solution in 2-MeTHF | | | | | | | |
| 1 | 448 | 0.24 | 2.3 | 1.0 | 3.3 | 424 | 9300 |
| 2 | 492 | 1.00 | 1.2 | 8.3 | <0.083 | 428 | 2200 |
| 3 | 542 | 0.55 | 1.1 | 5.0 | 4.1 | 432 | 430 nm:<br>2100 (62%)<br>342 (38%)<br>520 nm: 181 |
| 4 | 602 | 0.05 | 0.080 | 6.2 | 119 | 492 | 18 |
| 5 | 666 | 0.02 | 0.052 | 3.8 | 180 | 536 | 213 |

TABLE 1-continued

| Luminescent properties of complexes 1-6 in different media. | | | | | | | |
|---|---|---|---|---|---|---|---|
| Complex | $\lambda_{max,\ RT}$ | $\Phi_{RT}$ | $\tau,_{\ RT}$ (μs) | $k_{r,\ RT}$ $10^5\ s^{-1}$ | $k_{nr,\ RT}$ $10^5\ s^{-1}$ | $\lambda_{max,\ 77K}$ | $\tau,_{\ 77K}$ (μs) |
| 1 wt % in polystyrene film | | | | | | | |
| 1 | 432 | 0.80 | 2.6 (47%) | 0.9[a] | 0.23[a] | 424 | 3200 |
| 2 | 468 | 1.00 | 1.3 | 7.7 | <0.077 | 464 | 99 |
| 3 | 506 | 0.90 | 1.4 | 6.4 | 0.71 | 502 | 227 |
| 4 | 548 | 0.78 | 1.2 | 6.5 | 1.8 | 544 | 153 |
| 5 | 616 | 0.30 | 0.75 | 4.0 | 9.3 | 612 | 408 |
| 6 | 704 | 0.03 | 0.19 | 1.6 | 51 | 682 | 146 |
| neat solid | | | | | | | |
| 1 | 438 | 0.05 | 0.37 (33%) | 0.38[a] | 7.2[a] | 438 | 7100 |
| 2 | 474 | 0.76 | 0.75 | 10.0 | 3.2 | 468 | 91 |
| 3 | 492 | 0.53 | 0.84 | 6.3 | 5.5 | 482 | 164 |
| 4 | 550 | 0.68 | 1.0 | 6.8 | 3.2 | 558 | 280 |
| 5 | 616 | 0.15 | 0.33 | 4.5 | 26 | 598 | 180 |
| 6 | 658 | 0.12 | 0.39 | 3.1 | 22 | 634 | 306 |

[a]Calculated from weighted average of the two contributions to τ.

Figure 6:
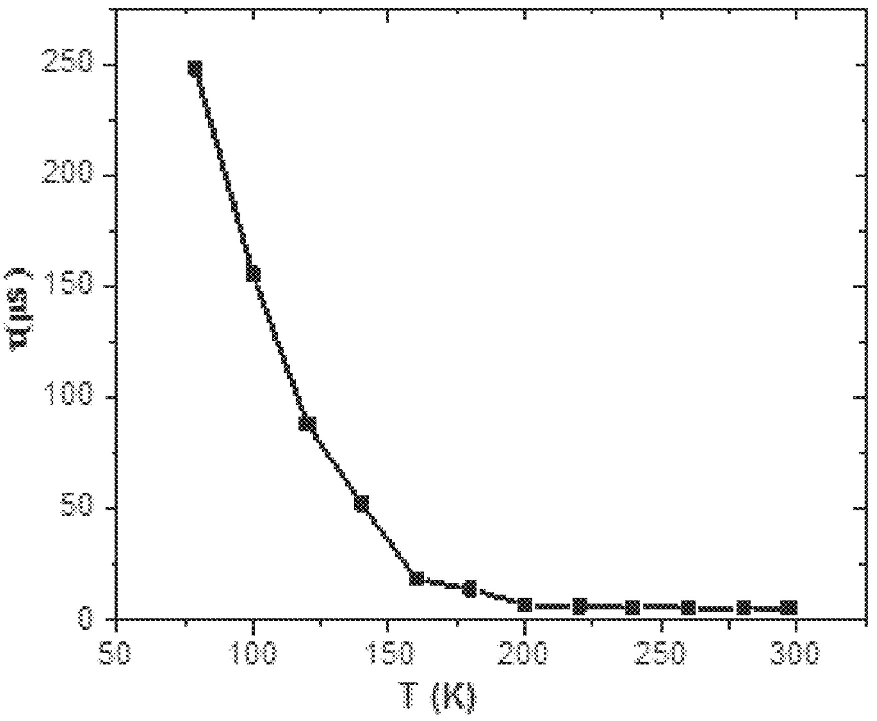
FIG. 6. Emission lifetime versus temperature of complex 3.

The radiative rate constants of the Cu(I) carbene-amide compounds are as fast as those of phosphorescent emitters with heavy metal like Ir and Pt. The energy separation between the lowest excited singlet and triplet states needs to be small to obtain a short radiative TADF decay lifetime, which is important to maximize the photoluminescent quantum efficiency. The emission spectra of compounds 2-5 at 77 K are barely shifted from those at RT which is also indicative of the small energy separation between the lowest triplet and singlet state. Therefore, it is of vital importance to measure $\Delta E(S_1-T_1)$ of these Cu compounds by temperature-dependent measurement. FIG. 6 plots emission lifetime of compound 3 at different temperatures. $\Delta E(S_1-T_1)$ is obtained by fitting the temperature dependent lifetime measurements to the Arrhenius equation. The activation energy, or $\Delta E(S_1-T_1)$, is calculated to be 31.7 meV (256 $cm^1$) for compound 3, which is smaller than the upper limit (130 meV) of $\Delta E(S_1-T_1)$ for fast up-intersystem crossing from $^3$CT to $^1$CT states to occur. In fact, many of the carbene-Cu(I) amide compounds will have a $\Delta E(S_1-T_1)$ in a range from 10 meV to 150 meV, 20 meV to 120 meV, or 20 meV to 80 meV, which again, tells us that the compounds are very promising TADF emitters.

To obtain parameters governing the temperature dependent luminescent properties, the emission lifetime of complex 3 in PS film was measured between 5 K and 320 K. The lifetime steadily increases upon cooling until near 150 K, where the increase becomes more pronounced, until 50 K where the rate of increase slows. The increase in lifetime at low temperature is attributed to successive depopulation of states at high energy that have radiative rate constants faster than the lowest lying state. At temperatures above 50 K, the emission is dominated by a higher-lying Si state, whose rate of thermal population increases with heating. At temperatures below 50 K, thermal activation between triplet substates is observed. Under an assumption of a fast thermalization between states, the temperature dependent decay curve can be fit to the Boltzmann distribution equation (equation 1).

$$\tau = \frac{2 + e^{-\frac{\Delta E(III-I)}{k_B T}} + e^{-\frac{\Delta E(S_1-I)}{k_B T}}}{2\left(\frac{1}{\tau_{I,II}}\right) + \left(\frac{1}{\tau_{III}}\right)e^{-\frac{\Delta E(III-I)}{k_B T}} + \left(\frac{1}{\tau_{S_1}}\right)e^{-\frac{\Delta E(S_1-I)}{k_B T}}} \quad (1)$$

Here, $S_1$ represents the lowest singlet state, whereas I, II and III represent the triplet substates $^{I}T_1$, $^{II}T_1$ and $^{III}T_1$, and $k_B$ is the Boltzmann constant. Substates I and II are treated as being degenerate since the energy splitting between these two states are normally very small (<10 $cm^{-1}$) in copper complexes. Fits of the experimental lifetime data to equation 1 reveal the decay rate of each state and the energy separation between them. Fits are poor to a Boltzmann equation that does not include a second term to account for splitting of the triplet substates and plateau at T<50 K. The exchange energy is characterized by $\Delta E(S_1-^{III}T_1)$, which is determined to be 415 $cm^{-1}$ (51.5 meV). This energy separation is among the smallest values reported for Cu-based TADF emitters. The decay lifetime of the $S_1$ state ($\tau_{S_1}$=73.4 ns) is among the fastest values of $\tau_{S_1}$ for Cu complexes and consistent with the high $k_r$ as mentioned above. The decay lifetimes for the $^{III}T_1$ and $^{I}T_1/^{II}T_1$ substates are 58.2 μs and 206 μs, respectively. The zero-field splitting (ZFS), which corresponds to ΔE(III-II/I), is 74 $cm^{-1}$. The ZFS in compound 3, induced by the effective spin orbit coupling (SOC) with the metal center, is exceptionally large for a Cu(I) complex.

The values obtained for $k_r(S_1-S_0)$, $\Delta E(S_1-^{III}T_1)$ and ZFS from the temperature dependence analysis of compound 3 are unique in comparison to data reported for luminescent four-coordinate Cu(I) complexes. In compound 3, $k_r(S_1-S_0)$ is large and $\Delta E(S_1-^{III}T_1)$ is small relative to values reported for other Cu(I) lumiphores. The deviation of compound 3 from trends in other Cu(I) emitters is likely due to two factors; the linear, coplanar arrangement of ligands and the minimal, but essential, participation of metal center to the $^1$ICT transition. The geometry of the complex maximizes π-overlap between the $2p_z$ orbitals on the $C_{NHC}$ and $Nc_z$ atoms ligated to Cu, and the highly polarizable **3*d*** orbitals of the metal provide enough electron density to impart high oscillator strength to the $^1$ICT transition. On the other hand, overlap between the HOMO and LUMO remains poor enough to minimize stabilization of the unpaired electrons in the $^3$ICT state, thereby minimizing the exchange energy.

We also fabricated vapor-deposited OLED devices with a neat emitter layer of compound 3. The device demonstrated both high EQE and low efficiency roll-off at high voltage, qualities attributed to the high quantum efficiency and the short exciton decay time of these efficient copper-based emitters. The high EQE of the host-free devices demonstrates the potential of the metal(I) carbene compounds used as neat emitters in OLED devices.

Figure 7:
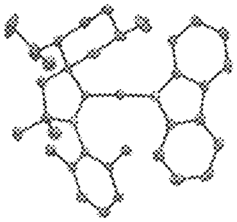
FIG. 7. X-ray structures of compounds 6*a*, 6*c*, 6*d*, 7, 8, 9, 10*b*, and 11. Hydrogen atoms and methyl groups on the Dipp group are removed for clarity.
Figure 7:
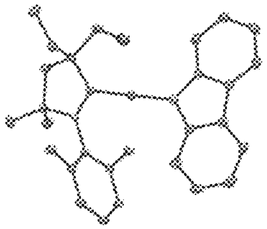
Figure 7:
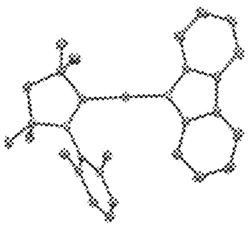
Figure 7:
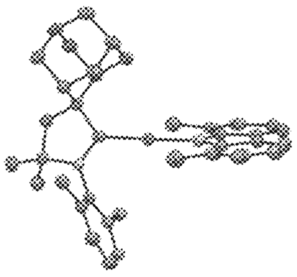
Figure 7:
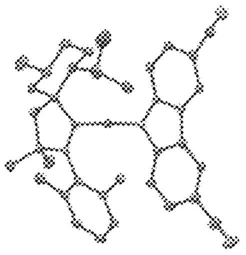
Figure 7:
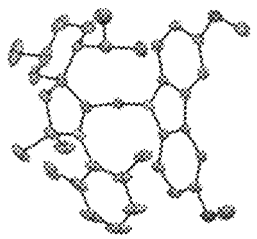
Figure 7:
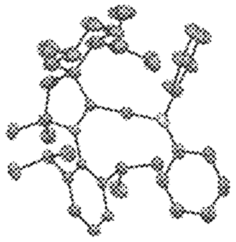
Figure 7:
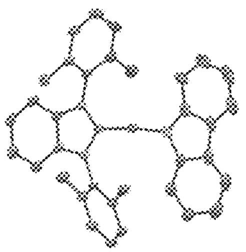

Each of compounds 6*a*, 6*c*, 6*d*, 7, 8, 9, and 1*l*(see, FIG. 7) exhibit linear coordination around the Cu center with the carbene and carbazolide ligands arranged in a coplanar conformation, with the exception of compound 10*b* in which the carbene and the carbazole planes are orthogonal to each other.

Figure 8:
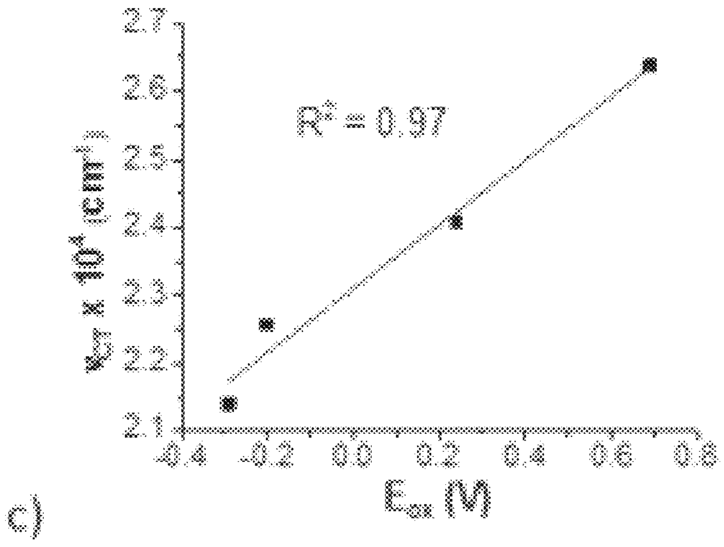
FIG. 8. Plot of $v_{CT}$ (in MeCy) versus oxidation energy for compounds 6*a*, 7, 8, 9, in MeCy.

Compounds 6*a*, 8, and 9 each include the same carbene ligand but the donor strength of the carbazolide ligand is increased in the order of 6, 8, and 9. The result is an increasingly-stabilized CT band in compound 9. The CT band of compound 9 exhibits negative solvatochromism and is subsequently more red-shifted in non-polar solvents such as MeCy. The dependence of the energy of the CT transition on the donating strength of the amide is linear, as shown in FIG. 8, further establishing the redox active nature of the ligands and the CT nature of the lowest energy transition in these complexes. In contrast, the absorption spectrum of compound 7, which has a relatively electron-deficient amide (—CN substitution), does not exhibit a distinct CT band in either THF or MeCy, which indicates that the lowest energy transition in compound 7 is likely not CT-dominant in nature. An increase in the steric bulk of the carbene appears to have little if any effect on the energies or extinctions of the major transitions. However, an increase in steric bulk around the carbazolide ligand, which forces the ligands into an orthogonal conformation as in compound 10, appears to decrease the extinction coefficient of the CT transition.

Figure 9:
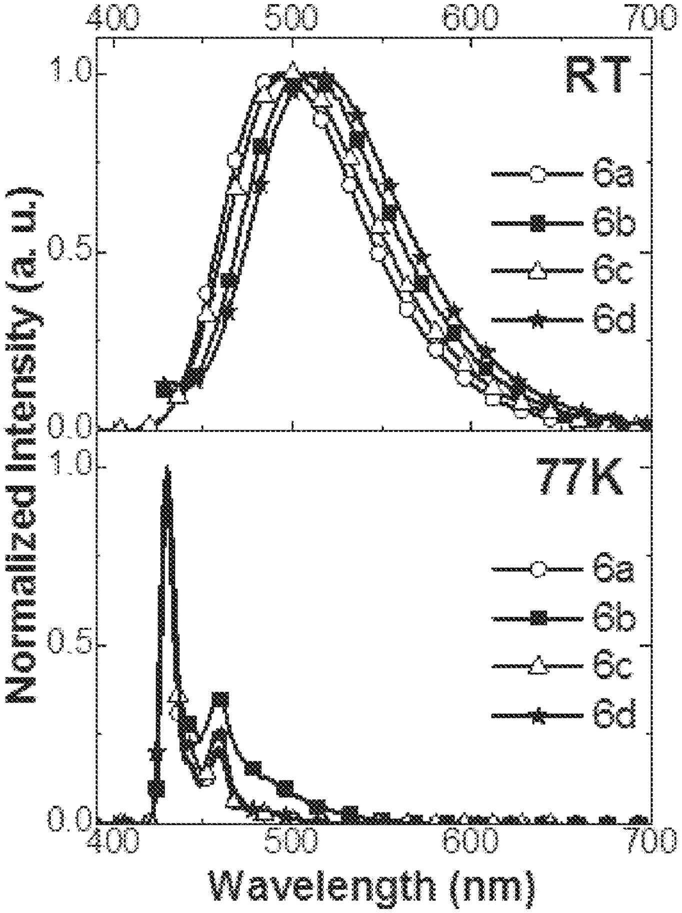
FIG. 9. Emission spectra of compounds 6*a*-6*d* in MeTHF at RT (top) and 77K (bottom).

Room temperature emission spectra of the compounds 6*a*, 6*b*. 6*c*, and 6*d* with increasing steric bulk for the carbene ligand CAAC in 2-MeTHF is shown FIG. 9 (*top*). The emission spectra for each compound is broad and featureless and exhibits very little differentiation, which again, is indicative of the CT nature of the radiative transition. The bulkier compounds, however, exhibit increasing photoluminescent quantum yields (PLQY, $\Phi_{PL}$) and suppressed non-radiative decay rates (see,Table 2), with the most encumbered compound 6*a* having a remarkable $\Phi_{PL}$=100% and $k_r$=3.9×10$^5$ s$^{-1}$. In frozen 2-MeTHF matrices at 77K, the emission of compounds 6*a-d* becomes narrow and highly structured, with lifetimes on the order of ms, see, FIG. 9 (bottom). This is consistent with emission out of a localized excited state ($^3$LE), which is in fact the closely-lying carbazolide triplet state, $^3$Cz.

Figure 10:
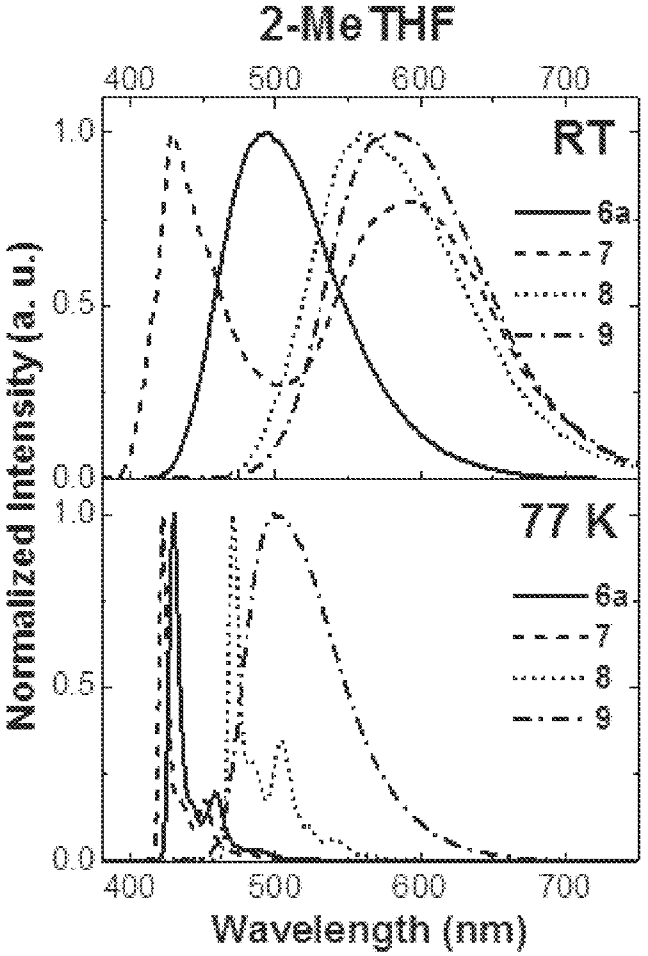
FIG. 10. Emission spectra of compounds 6*a*, 7, 8, and 9, in MeTHF at RT (top) and 77K (bottom).

On can functionalize the carbazole ligand with electron-withdrawing (compound 7) and electron-donating (compound 8) groups to provide an emissive blue-shift and a red-shift, respectively, FIG. 10. Compound 9 with the strongest electron-donating diphenylamide exhibits the lowest-energy emission in all solvents and an enhanced $\Phi_{PL}$ in PS due to suppression of modes of non-radiative deactivation in the more rigid matrix. Compound 8 exhibits broad and featureless CT emission in 2-MeTHF, MeCy, and PS films. Compound 7 exhibits narrower emission spectra in all matrices, with weak vibronic structure at high energies. This observation is consistent with the absorption spectra of compound 7 which shows that the CT transition is not in fact the lowest-energy transition. The CT/$^3$LE manifolds can indeed be weakly admixed, where the lowest-energy adiabatic state in compound 7 is largely $^3$Cz in character. This is further corroborated by the ms lifetime of the emissive state in compound 7 in PS (Table 2). We also note the peak appearing at lower energy in emission spectra of 7 in MeCy and 2-MeTHF, which disappears in PS. This peak is characterized by concentration-dependent emission intensity as well as a rise time in PL decay. All these observations allow us to assign the low-energy emission from compound 7 in fluid media to excimer formation, which is suppressed in the more rigid PS matrix.

Figure 11:
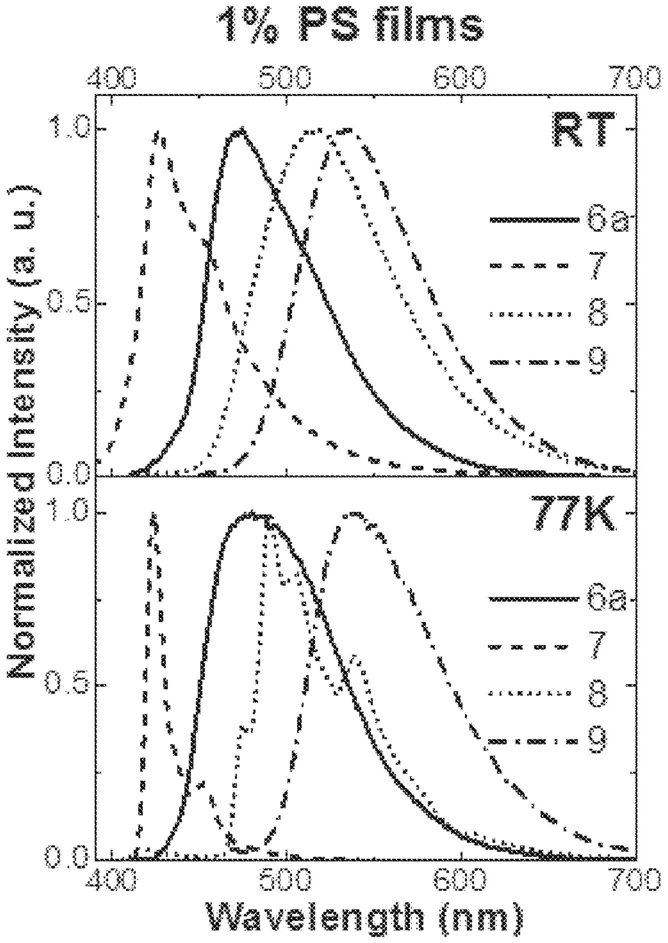
FIG. 11. Emission spectra of compounds 6*a*, 7, 8, and 9, as 1% PS films at RT (top) and 77K (bottom).
Figure 12:
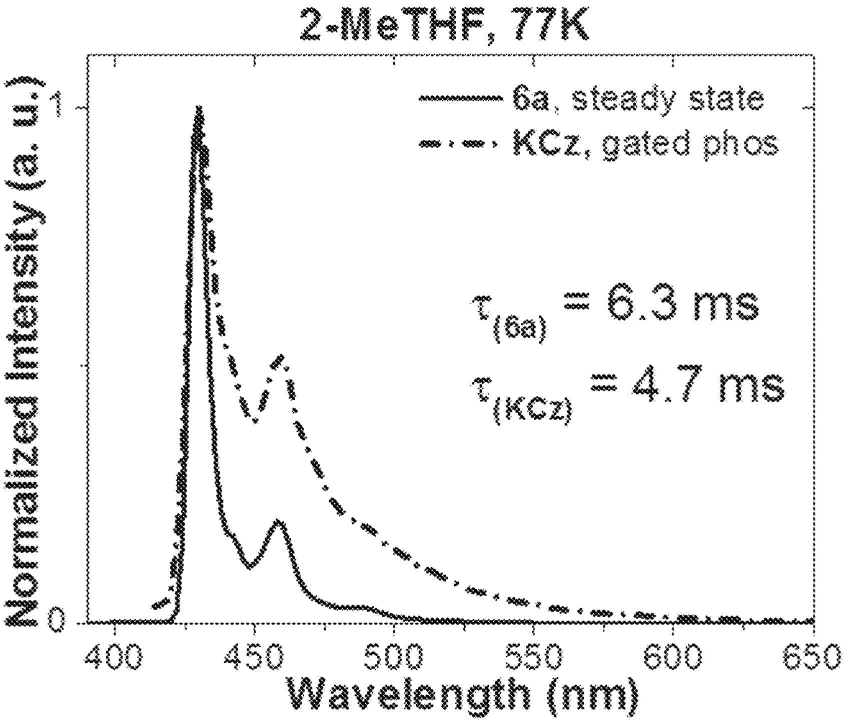
FIG. 12. Emission in MeTHF at 77K of compound 6*a* (steady state) and of potassium carbazolide (KCz; gated phosphorescence). The decay lifetimes of the compounds are listed.

$^3$Cz-based emission in compounds 6*a*, 7, and 8 is indicated by the long-lived decay times and the vibronically-structured spectral lines as observed in frozen 2-MeTHF and MeCy at 77K, FIG. 11. This is likely due to rigidochromic effects destabilizing the low-lying CT bands in 6*a* and 8, such that the lowest lying state at 77K is in fact largely $^3$Cz in nature, FIG. 12. Compound 9, in contrast, shows broad and featureless emission at 77K in frozen MeCy and 2-MeTHF, as well as PS films, with lifetimes −200 μs. This can be attributed to the CT-$^3$LE gap in compound 9 being greater than in the carbazolide compounds owing to its more strongly-donating amide that gives a more stabilized CT state and a $^3$LE with higher energy than $^3$Cz. Similarly, in a PS film, compound 6a appears to retain its CT emission at low temperatures, with a lifetime of 64 μs at 77K.

The increase in the decay times observed in compounds 6*a* and 9 upon cooling is consistent with TADF. Temperature-dependent studies of PS films show the characteristic TADF curve, which can be fitted to equation (2) below.

$$\tau = \frac{3 + e^{-\frac{\Delta E}{kT}}}{3\left(\frac{1}{\tau_1}\right) + \left(\frac{1}{\tau_2}\right)e^{-\frac{\Delta E}{kT}}} \tag{2}$$

Figure 13A:
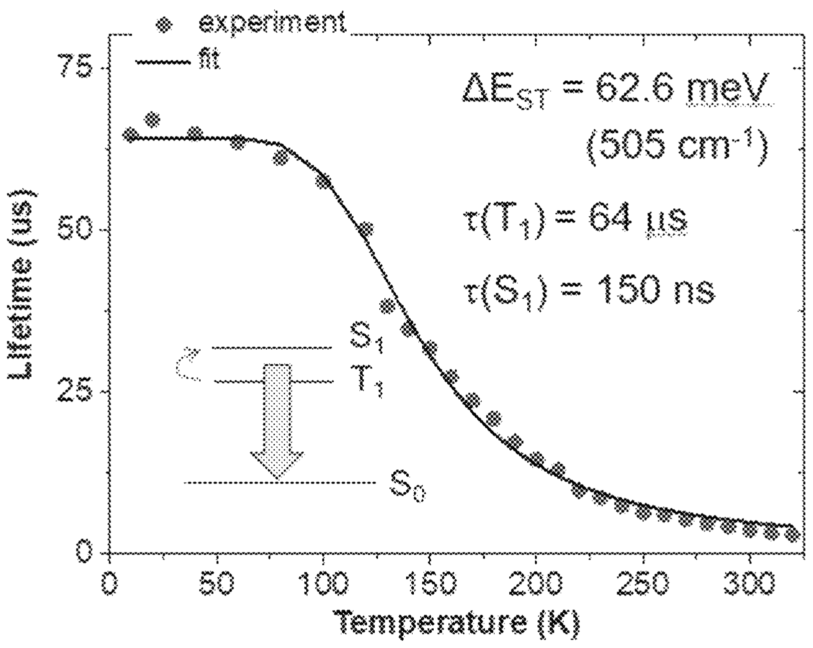
FIG. 13*a*. Temperature-dependent PL decay of compound 6*a* as 1% PS film. The inset show the parameters obtained from fitting the data to equation in FIG. 13*c*.
Figure 13B:
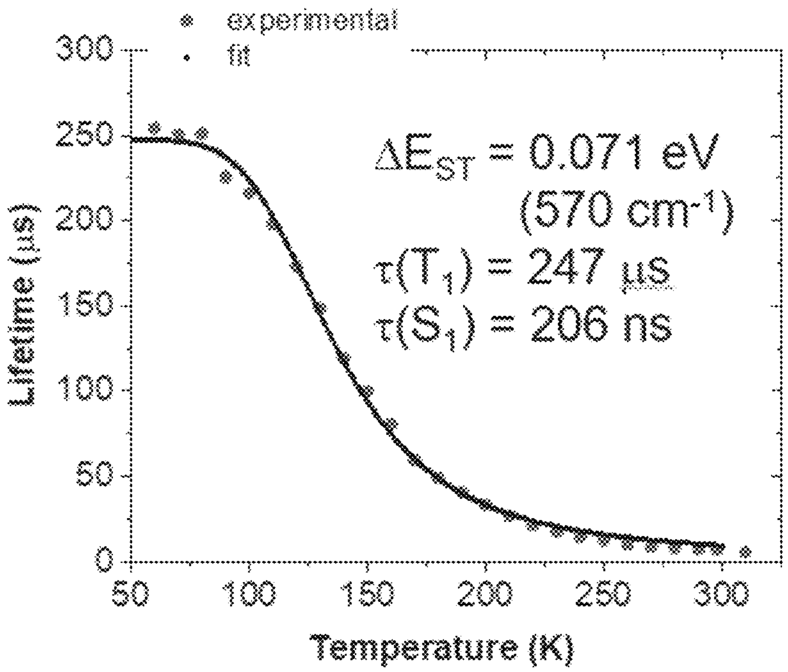
FIG. 13*b*. Temperature-dependent PL decay of compound 9 as 1% PS film.

An Arrhenius analysis allows us to extract the value of $\Delta E_{1CT\text{-}3CT}$, which is found to be exceedingly small in both compounds: 63 meV (410 cm$^{-1}$) in 6a and 71 meV (570 cm$^{-1}$) in 9—among the smallest energy splittings in Cu(I)-based TADF compounds. See, FIGS. 13*a* and 13*b*, respectively.

Electroluminescence

Figure 14:
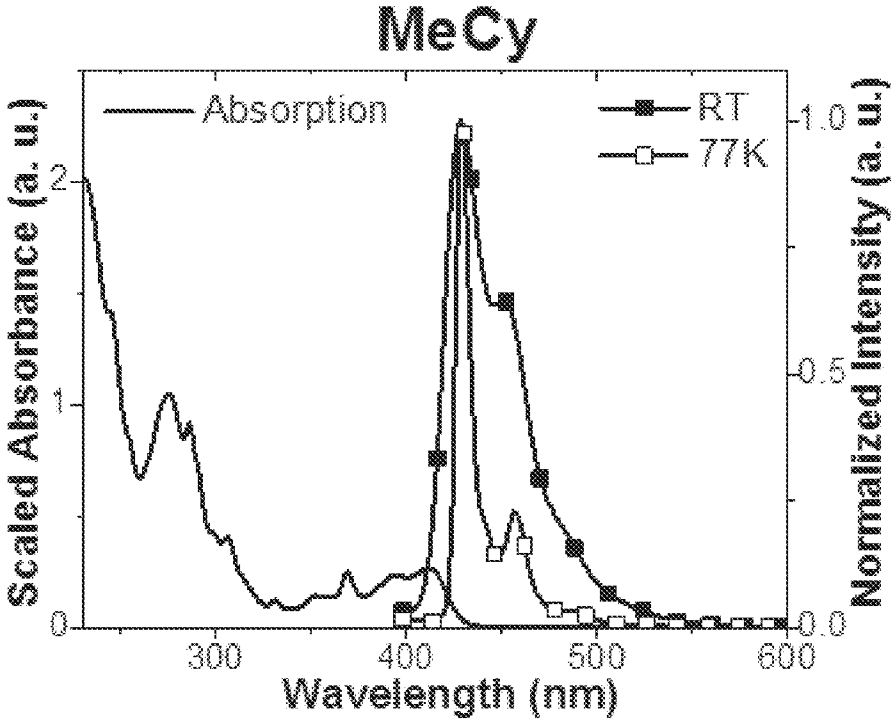
FIG. 14. Emission of compound 11 in MeCy at RT and 77K.

Compared to compounds 6*a*, 8, 9, and 10, compound 11 shows a narrower, more structured emission profile in MeCy at RT, FIG. 14. However, the radiative rate constant of compound 11 ($k_r$=3.3×10$^5$ s$^{-1}$) is too high to be attributed to a purely $^3$Cz-centered transition. In contrast, the narrow emission line shape coupled with the fast radiative rate is believed to be an emission out of an adiabatic state comprised of an admixture of CT and $^3$Cz. At 77K, emission of compound 11 resembles the CAAC-Cu-amide compounds as it exhibits a very narrow and a lifetime in milliseconds.

To date, there are only a few reports of Cu(I) compounds that are used in emitter layers of OLEDs and which are prepared by vapor deposition. One reason has to do with their relatively poor thermal stability, and therefore, the prior Cu(I) compounds degrade appreciably at their respective sublimation temperatures. This is especially true for mononuclear Cu(I) compounds. The only reported OLED devices based on two-coordinate mononuclear Cu compounds are a two-coordinate bis-CAAC Cu OLEDs, which demonstrated inefficient energy transfer from the host to the dopant. CAAC—Cu-Cz OLED (6*b*) exhibited an EQE of 9%, and in each case, the emitting layers were prepared by solution processing, e.g., spin coating.

TABLE 2

Photophysical properties of compounds 6a-11 in 1% polystyrene films, 2-MeTHF and MeCy.

| | Matrix | $\lambda_{max, RT}$ (nm) | $\Phi_{RT}$ | $\tau_{RT}$ (μs) | $k_{r, RT}$ ($10^5$ $s^{-1}$) | $k_{nr, RT}$ ($10^5$ $s^{-1}$) | $\lambda_{max, 77K}$ (nm) | $\tau_{77K}$ (ms) |
|---|---|---|---|---|---|---|---|---|
| 6a | 2-MeTHF | 492 | 0.98 | 2.5 | 3.9 | 0.08 | 430 | 7.3 |
| | MeCy | 468, 486 | 0.92 | 2.3 | 4.0 | 0.35 | 430 | 6.7 |
| | PS | 474 | 1.0 | 2.8 | 3.5 | — | 480 | 0.064 |
| 6b | 2-MeTHF | 510 | 0.68 | 2.3 | 3.0 | 1.4 | 430 | 3.0 (at 430 nm)<br>0.05 (at 550 nm) |
| 6c | 2-MeTHF | 500 | 0.56 | 1.8 | 3.1 | 2.4 | 430 | 8.7 |
| 6d | 2-MeTHF | 510 | 0.11 | 0.54 | 2.0 | 16 | 430 | 5.02 |
| 7 | MeCy | 428 (mono),<br>588 (excim) | 0.19 | 450 nm: 5.9<br>600 nm: 2.3<br>(−7%); 20.5<br>(107%) | — | — | 424 | 4.3 |
| | PS | 426 | 0.82 | 240 (70%)<br>1300 (30%) | 0.015 | 0.0032 | 424 | 6.9 |
| 8 | 2-MeTHF | 558 | 0.25 | 0.28 | 8.9 | 27 | 470 | seconds |
| | MeCy | 542 | 0.62 | 1.1 | 5.5 | 3.4 | 472 | seconds |
| | PS | 578 | 1.0 | 2.3 | 4.3 | — | 490 | 0.55 |
| 9 | 2-MeTHF | 580 | 0.16 | 0.87 | 1.8 | 97 | 498 | 0.22 |
| | MeCy | 556 | 0.55 | 2.4 | 2.3 | 1.9 | 530 | 0.19 |
| | PS | 532 | 0.78 | 2.6 | 3.0 | 0.85 | 536 | 0.26 |
| 11 | MeCy | 428 | 0.42 | 1.3 | 3.3 | 4.6 | 428 | 6.3 |

Photophysical and Electroluminescence Data of Compounds **12*a*, 13, and 14**

Absorption spectra of the CAAC$^{Men}$M(I)(Cz)compounds **12*a*, 13, and 14**, of Cu(I), Ag(I), and Au(I), respectively, show high energy, sharp peaks corresponding to carbazole-centered transitions (λ<370 nm) that are largely unchanged regardless of the metal bonded to the amide. There are, however, more pronounced differences in the low-lying absorption bands assigned to charge transfer (CT) transitions. Compound 13 has the weakest $\in_{CT}$, followed by compound 12a, and compound 14. This can be explained in-part by the obtained X-ray crystal structures of each of the compounds. Compound 13 has the longest carbene to amide distance, which corresponds to the least overlap between the frontier molecular orbitals, and consequently the weakest HOMO to LUMO allowed transition. The gold complex (3), having the heaviest metal, exhibits charge transfer with the strongest allowed transition.

Emission spectra at room temperature (RT) of the compounds **12*a*, 13, and 14** are all broad and featureless, which can be indicative of the CT nature of the transitions. The trend in the energies of the emission maxima follows the magnitude of the Stokes shift between absorption and emission, and can be related to the extent of reorganization the complex undergoes when transitioning between the ground and excited states: with the silver compound 13, having the longest carbene-amide distance and the smallest HOMO-LUMO overlap, exhibits the largest Stokes shift between absorption and emission, and the most red-shifted emission $\lambda_{max}$. The gold compound 14, with its intermediate carbene-amide distance follows the trend as well, and lastly is the copper compound 12 with the shortest carbene-amide separation, the smallest Stokes shift, and the highest energy of emission $\lambda_{max}$.

At room temperature, all compounds show remarkably-high photoluminescence quantum yields ($\Phi_{PL}$) in MeCy, with 1.0, 0.71, and 0.95 for compounds **12*a*, 13, and 14**, respectively. The excited state lifetime of compound 14 is greater than that of compound 12a owing to the heavier gold atom, which results in stronger spin-orbit coupling and more efficient inter-system crossing (ISC). Interestingly, the silver compound 13 shows the fastest radiative rate of all three compounds, with $k_r$=2×10$^6$ s-Iwhich to our knowledge makes the Ag(I) compound the most efficient Ag(I)-based emitter in fluid medium to date. Non-radiative mechanisms are suppressed in a non-coordinating solvent such as MeCy allowing compound 13 to demonstrate 100% efficient luminescence while maintaining sub-microsecond radiative lifetime. To the best of our knowledge, compound 13 is the first reported organometallic complex with <$\Phi_{PL}$=100% and a sub-microsecond radiative lifetime. Compound 14 exhibits a (DP$_L$=95%, to the best of our knowledge the most efficient Au(I)-based phosphor to date. At 77K, emission spectra of all three compounds exhibit narrow and structured bands, and with respective lifetimes orders of magnitude longer than what is observed at room temperature. These two observations indicate that emission at room temperature likely stems from the closely-lying carbazolide-centered triplet ($^3$LE), accessible in frozen media due to the rigidochromic destabilization of the CT state. The gold compound 14 bearing the heaviest metal, exhibits the strongest heavy atom effect, and hence displays the fastest$^3$LE phosphorescence among all three compouinds. Compound 13 on the other hand, with the largest ligand separation, shows the least metal contribution to the $^3$LE, and exhibits weakly-allowed phosphorescence (22 ms).

Relative to the parent compound 12a, the more electron-rich compound 12d shows a red-shift.in emission, and the more electron-deficient compound 12c shows a blue-shift. Accordingly, substitution of the carbazole with donating methoxy groups stabilizes the CT state, whereas electron-withdrawing cyano-groups have a destabilizing effect. Nevertheless, all three complexes still exhibit ligand-centered emission in frozen media, which suggests that this localized state is not perturbed largely by electronic modification of the carbazole amide ligand. To perturb the ligand-centered state away from the CT manifold, non-carbazole amides with triplet energies drastically higher than that of carbazole can be used.

Photophysical and Electroluminescence Data of Compounds 9, 15, and 16

Absorption spectra of the corresponding CAAC$^{Men}$M(I)(NPh$_2$) compounds 9, 15, and 16, M is (Cu(I), Ag(I), and Au(I), respectively, follow the same trends in the intensity of each respective low-lying CT state. Gold compound 16 containing the heaviest metal exhibits CT with the highest ∈($5.7\times10^{3}$ $M^{-1}$. $cm^{-1}$), and the silver compound 15 has the most weakly-absorbing CT state. The gold compound 16 appears to be the more stable compound to ambient conditions (moisture or oxygen) in solution.

Room temperature emission spectra of compounds 9, 15, and 16 are all broad and featureless, and display considerable red-shifts compared to their carbazole-analogues compounds 12, 13, and 14. Moreover, the destabilized$^3$LE state in the compounds appears to impact the radiative rates following Fermi's Golden Rule, and the presence of a high density of resonant states increases the likelihood of an electronic transition between them. At 77K, the emission remains broad and featureless, and displays a marked blue-shift in energy. This observation is indicative of strong rigidochromic effects with remarkably strong ground and excited state dipoles. The longer lifetimes upon freezing are likely due to thermally-activated delayed fluorescence (TADF) operating within the CT manifold.

Photophysical and Electroluminescence Data of Compounds 11, 17, and 18

Absorption spectra of the benzoimidazole M(I)(Cz)compounds 11, 17, and 18, M is Cu(I), Ag(I), and Au(I), respectively, in MeCy exhibit both the sharp, high-energy peaks corresponding to ligand-centered transitions as well as low-lying broad bands assigned to CT transitions. As with the Cu/Ag/Au series above, the most intensely-absorbing CT band is that of the gold compound 19, and the most weakly-absorbing CT is that of the silver compound 17.

Room temperature emission spectra of compounds 11, 17, and 18 in MeCy are narrow and structured, appearing to have more $^3$LE character, unlike what we report for compounds 12-14, 9, 15 and 16 above. The gold compound 18 is the most efficient phosphor of the series, followed by the silver compound 17. The lower radiative rate recorded for compound 17 compared to its CAAC-analogue, compound 13, could be attributed to the former's less demanding steric environemnt relative to the latter. This difference in steric environment is seen in the X-ray crystal structure of compound 17, which shows two conformers: one with a coplanar ligand conformation, and another with an orthogonal one. This latter conformation is expected to have reduced $sc_T$ and consequently lower $k_r$. Each of compounds 11, 17, and 18 in frozen glassy media at 77K exhibit an emission spectra that is narrow and long-lived, and carbazolide-centered in nature. This is similar to what we observe with compounds 12, 13, and 14. The mixing between the CT and $^3$LE manifolds in this series of compounds appears to be strongly-dependent on the medium, a property that has been observed in other TADF systems. Furthermore, it is notable that the carbene-centered triplet in the compounds is also within 1 eV from the CT/$^3$LE manifold, and could very well play a role in determining the excited state properties.

TABLE 3

Photophysical properties of compounds in 2-MeTHF and in MeCy[a].

| Comp. | $\lambda_{max}$, nm RT | $\Phi_{RT}$ | $\tau_{RT}$ (μs) | $k_{r,\,RT}$ $s^{-1}$ | $k_{nr,\,RT}$ $s^{-1}$ | $\lambda_{max}$, nm 77K | $\tau_{77K}$ (μs) |
|---|---|---|---|---|---|---|---|
| 12a | 492 | 1.0 | 2.3 | $4.4\times10^{5}$ | — | 430 | 7300 |
| 13 | 518 | 0.71 | 0.37 | $1.9\times10^{6}$ | $7.8\times10^{5}$ | 432 | 23,000 |
| 13[a] | 492 | 1.0 | 0.5 | $2\times10^{6}$ | — | — | — |
| 14 | 502 | 0.95 | 1.2 | $7.9\times10^{5}$ | $4.2\times10^{4}$ | 426 | 508 |
| 9 | 580 | 0.27 | 0.7 | $3.9\times10^{5}$ | $1.0\times10^{5}$ | 498 | 270 |
| 15 | 618 | 0.01 | 0.38 | $2.6\times10^{4}$ | $2.6\times10^{6}$ | 504 | 14 |
| 16 | 608 | 0.04 | 0.10 | $4.0\times10^{5}$ | $1.0\times10^{7}$ | 500 | 41 |
| 11[a] | 428 | 0.42 | 1.26 | $3.3\times10^{5}$ | $4.6\times10^{5}$ | 428 | 6300 |
| 17[a] | 430 | 0.58 | 1.04 | $5.6\times10^{5}$ | $4.4\times10^{5}$ | 432 | 6900 |
| 18[a] | 424 | 0.88 | 1.02 | $8.6\times10^{5}$ | $1.2\times10^{5}$ | 424 | 457 |

TABLE 4

| Redox properties | | | | |
|---|---|---|---|---|
| Comp. | $E_{ox}$ (V) | $E_{red}$ (V) | $E_{HOMO}$ (eV) | $E_{LUMO}$ (eV) |
| 12a | 0.239 | −2.84 | −5.06 | −1.48 |
| 13 | 0.19 | −2.8 | −5.01 | −1.53 |
| 14 | 0.33 | −2.72 | −5.17 | −1.62 |

Electrochemical studies performed in acetonitrile versus $Fc^+/Fc$. The redox peaks were taken from differential pulse voltammograms (DPV), and converted to HOMO/LUMO energies using the equations in ref.x

TABLE 5

Calculated structures of the carbozilide compounds 12, 13, and 14, and 11, 17, and 18 are shown in FIGS. 29A, 29B, 29C, 29D, 29E, and 29F, respectively. These calculated structures are optimized at the LACVP**/B3LYP level, showing the MO surfaces (HOMO solid; LUMO mesh). Table 5 also lists associated energies. $\Delta E_{S1-T1}$ and $f_{H\rightarrow L}$ obtained from TDDFT run at the same level of theory.

| Compound 12 | Compound 13 | Compound 14 |
|---|---|---|
| $E_{HOMO}$ = −4.14 eV<br>$E_{LUMO}$ = −1.48 eV<br>$\Delta E_{S1-T1}$ = 0.191 eV<br>$f_{H\rightarrow L}$ = 0.078 | $E_{HOMO}$ = −4.05 eV<br>$E_{LUMO}$ = −1.54 eV<br>$\Delta E_{S1-T1}$ = 0.119 eV<br>$f_{H\rightarrow L}$ = 0.059 | $E_{HOMO}$ = −4.28 eV<br>$E_{LUMO}$ = −1.55 eV<br>$\Delta E_{S1-T1}$ = 0.119 eV<br>$f_{H\rightarrow L}$ = 0.059 |
| Compound 11 | Compound 17 | Compound 18 |
| $E_{HOMO}$ = −4.08 eV<br>$E_{LUMO}$ = −1.45 eV<br>$\Delta E_{S1-T1}$ = 0.126 eV<br>$f_{H\rightarrow L}$ = 0.087 | $E_{HOMO}$ = −3.99 eV<br>$E_{LUMO}$ = −1.52 eV<br>$\Delta E_{S1-T1}$ = 0.083 eV<br>$f_{H\rightarrow L}$ = 0.066 | $E_{HOMO}$ = −4.08 eV<br>$E_{LUMO}$ = −1.36 eV<br>$\Delta E_{S1-T1}$ = 0.170 eV<br>$f_{H\rightarrow L}$ = 0.141 |

The data reported in Table 5 is intended to demonstrate trends in the series of compounds. The table data do not represent their respective absolute value as calculations at this level are known to diverge strongly from experiment for compounds with strong charge transfer character over long range. Notably, the trends in the frontier molecular orbital energy levels match those obtained experimentally from electrochemical measurements: In the first CAAC series, gold compound 14 has the lowest-lying HOMO and LUMO levels, which is consistent with the electrochemical observation that it is the hardest to oxidize and the easiest to reduce. Compound 13 is the easiest to oxidize having the shallowest HOMO, whereas compound 12 has the shallowest LUMO. This is in agreement with what is observed electrochemically, with the silver compound 13 being the easiest to oxidize and the copper compound 12 being the most difficult to reduce.

Time-dependent DFT (TDDFT) calculations also reveal trends that largely match experiment, with the oscillator strengths ( ) of the lowest-energy CT transitions (predominantly HOMO to LUMO in character) trending in the following order of increasing strength:$fA_g$<fcu <fAu. Furthermore, the calculated $S_i$-$T_I$ splitting, $\Delta EsI$-$_TI$ is reproduced in the trends observed in the increasing HOMO-LUMO separation from Cu<Au<Ag. The calculated bond lengths match the experimental ones observed in the crystal structures. The DFT data above highlight the importance of maintaining minimal HOMO/LUMO overlap as well as strong spin-orbit coupling by virtue of a heavy metal in order to obtain efficient TADF with sub-microsecond radiative lifetimes.

Compared with MAAC*—Cu(Cz) compound 3, corresponding gold compound 20 shows a strong CT absorption at 420 nm and the molar absorptivity is about 1.5 times higher, see FIG. 30. The emission spectra of compound 20 in polystyrene films, methylcyclohexane and −2-methylTHF (2-MeTHF) are shown in FIG. 33 and the spectra of compound 3 are shown in FIG. 31 for comparison. The photophysical results are summarized in Table 6. The emission profile of the Au(I) compound at room temperature is almost unchanged from that of the Cu(I) compound. The photoluminescent quantum yield is comparable to the Cu(I) compound, whereas the decay lifetime is slightly smaller. Therefore, the radiative rate constant ($k_r$) of the gold compound is higher than that of the copper compound.

The emission spectra are red-shifted from polystyrene films to methylcyclohexane and to 2-methylTHF at room temperature due to the solvatochromic effect. The CT excited states are stabilized upon increasing the solvent polarity. Upon cooling to 77 K, the emission shows a strong mixture of CT and LE character in methylcyclohexane and methylTHF. The LE character is stronger in 2-methylTHF due to the stronger rigidochromic effect in the more polar solvent. It is worth noting that the LE character of the emission at 77 K in both methylcyclohexane and 2-methylTHF is more dominant in the gold compound than that of the copper compound, which is due to the heavy metal effect of Au on intersystem crossing between the singlet and triplet states. At 77 K, the decay lifetime of the $^3$LE state in 2-methylTHF decreases by almost a factor of 10 from compound 3 (2.1 ms) to compound 20 (0.26 ms), whereas that of the $^3$CT state decreases only by a factor of 2 (from 181 μs to 82 μs, respectively). The more dominant LE character of the emission of the gold compound at 77 K is therefore attributed to enhanced ISC due to the heavier Au nucleus.

Similar to what is observed in the CAAC- and BzI- series, the MAAC*—Ag(Cz) compound 19 shows an absorption spectrum with the weakest CT absorption band. At room temperature, emission line shapes of the silver compound in various media are comparable to the corresponding copper and gold compounds, with a small red-shift in fluid media relative to compounds 3 and 20. Upon doping into a more rigid PS matrix, non-radiative decay rate are suppressed, leading to an enhanced $\Phi_{PL}$=0.79 and a remarkable $k_r$=2.4×$10^6$ $s^{-1}$. This sub-microsecond excited state lifetime is in follows the same observation with our CAAC-Ag(Cz) compound 13, demonstrating that Ag(I) compounds are indeed a viable means to obtaining ultra-fast, tunable luminescence that utilizes triplet excitons. In addition, at 77K in PS films, where rigidochromic effects due to matrix reorganization are largely suppressed, the compound 19 emission is still broad and featureless, with decay lifetimes that are longer, at 7.7 μs compared to 0.33 μs at RT. This is likely due to TADF occurring within the CT manifold. The 77K decay time of silver compound 19 is the shortest among the corresponding copper and gold compounds. These observation and data provides insight into the magnitude of $\Delta E_{ICT-3CT}$ being smallest for compound 19, and therefore, provide a highly-efficient TADF.

TABLE 6

Photophysical properties of compounds 3, 19, and 20 in different media.

| Compound | $\lambda_{max, RT}$ (nm) | $\Phi_{RT}$ | $\tau_{RT}$ (μs) | $k_{r, RT}$ $10^5$ ($s^{-1}$) | $k_{nr, RT}$ $10^5$ ($s^{-1}$) | $\lambda_{max, 77K}$ (nm) | $\tau_{77K}$ (μs) |
|---|---|---|---|---|---|---|---|
| 20 PS film | 512 | 0.85 | 0.83 | 10 | 1.8 | 506 | 72 |
| MeCy | 522 | 0.88 | 1.1 | 8.0 | 1.1 | 456 | 68 |
| MeTHF | 544 | 0.50 | 0.79 | 6.3 | 6.3 | 428 | 430 nm: 260 μs<br>520 nm: 82 μs |
| 19 PS film | 512 | 0.79 | 0.33 | 24 | 63 | 500 | 7.7 |
| MeCy | 548 | 0.22 | 0.12 | 18 | 65 | 438 | 430 nm:<br>5.0 ms (38%),<br>321 μs (62%)<br>520 nm:<br>158 μs (84%)<br>2.3 ms (16%) |
| MeTHF | 568 | 0.056 | 0.036 | 15 | 260 | 434 | 430 nm:<br>9.9 ms<br>520 nm:<br>113 μs (89%)<br>2.3 ms (11%) |
| 3 PS film | 506 | 0.90 | 1.4 | 6.4 | 0.71 | 502 | 227 |
| MeCy | 520 | 0.90 | 1.6 | 5.6 | 0.62 | 480 | 298 |
| MeTHF | 542 | 0.55 | 1.1 | 5.0 | 4.1 | 432 | 430 nm:<br>2.1 ms (62%),<br>342 μs (38%)<br>520 nm: 181 μs |

We describe the making of bottom-emitting OLED devices with the two-coordinate Cu(I) compounds 2, 3 and 6*a* ((CAAC)CuCz) as dopants in various host materials by vapor deposition. A device with Cu(I) compound 6a as a dopant is to our knowledge the first device with an EML that includes both a Cu(I) compound host and a Cu(I) compound emitter.

A series of temperature-dependent emission spectra of a 5 wt % PMMA film of compound 12a exhibits a change with increasing temperature. A sharp emission line at 77K is indicative of carbazole based phosphorescence. Moreover, the relatively long lifetime at 77K is indicative of an organic triplet, as expected for a carbaozole based triplet. As the temperature is increased from 77K a broad emission line grows in, indicative of an MLCT transition, which includes an edge at higher energy than that of the carbazole based emission. At low temperature the excited state is trapped in the lower energy carbazole state because the thermal energy is too low to promote the molecule into the highly luminescent MLCT state. The marked decrease in lifetime on warming to room temperature is consistent with efficiency emission from an MLCT due to enhanced spin orbit coupling available to the metal compound. The mechanism of emission at room temperature is termed Thermally Assisted Phosphorescence (TAP).

The two coordinate metal(I) carbene compounds of the invention, particularly those with high excited state energies, can also be used as a host or a co-host material. For example, one can use the 2-coordinate Cu(I) carbene compounds as dopants in the emissive layer of efficient OLEDs (most efficient Cu-based OLEDs employ a co-deposited EML with polynuclear (CuX)~core (n >2) and an organic ligand).

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

According to another aspect, an emissive region in an OLED (e.g., the organic layer described herein) is disclosed. The emissive region comprises a first compound as described herein. In some embodiments, the first compound in the emissive region is an emissive dopant or a non-emissive dopant. In some embodiments, the emissive dopant further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene. In some embodiments, the emissive region further comprises a host, wherein the host is selected from the group consisting of:

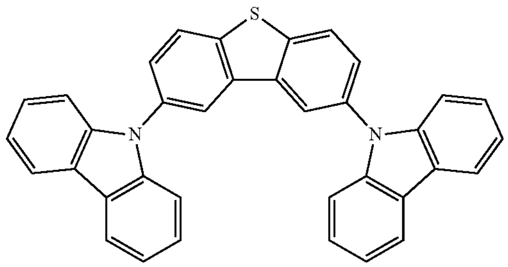
,

-continued
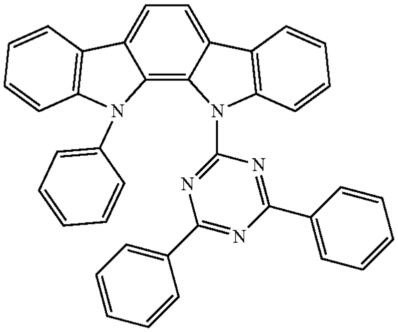
,
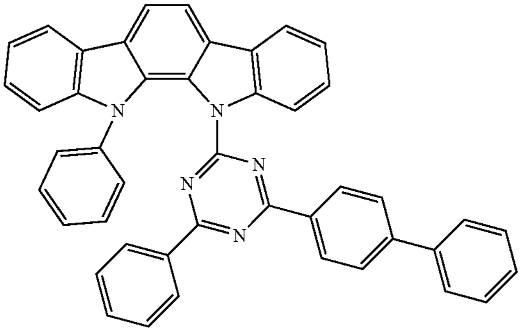
,
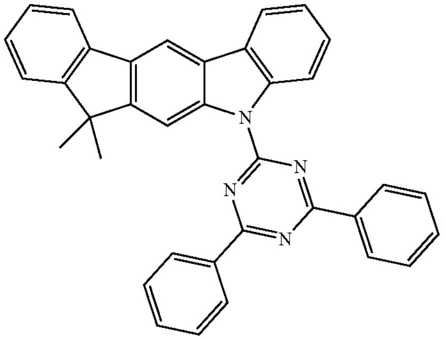
,
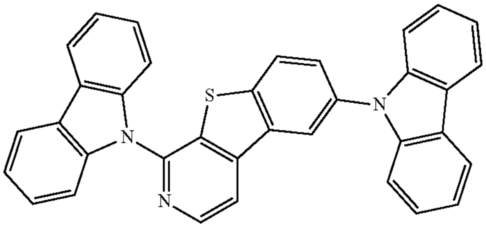
,
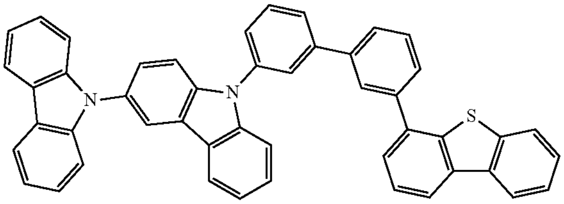
,
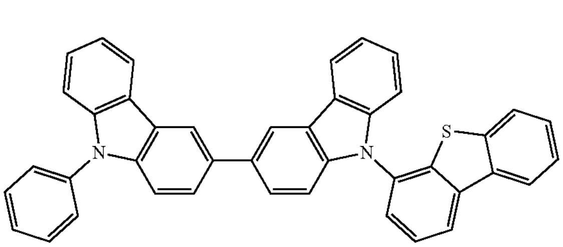
,
-continued
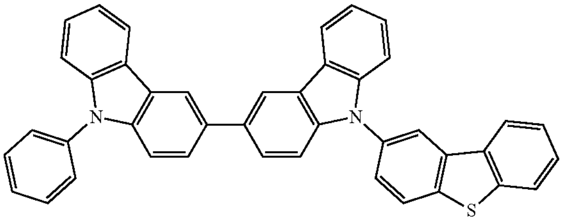
,
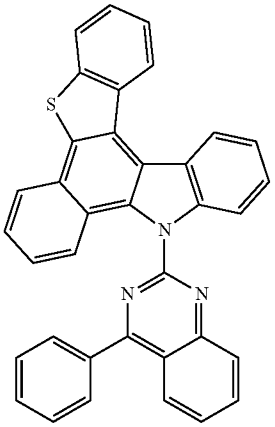
,
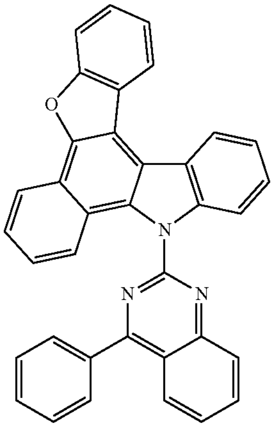
,
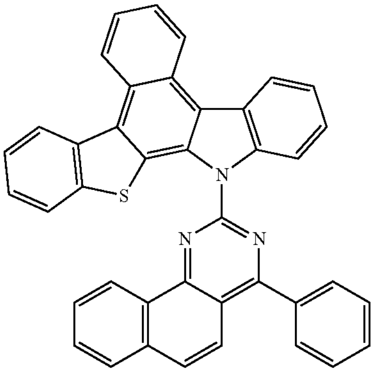
,
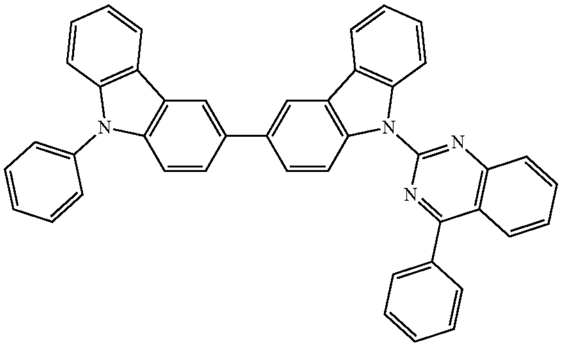
, -continued
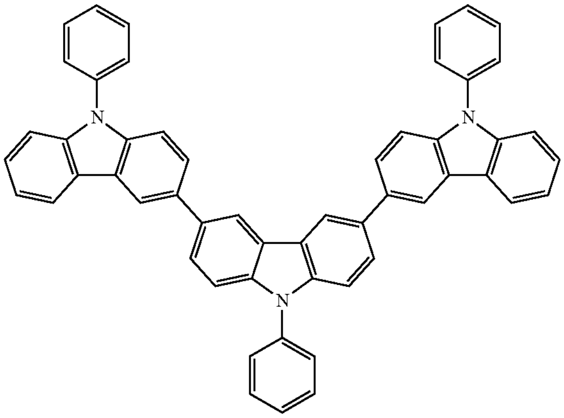
,
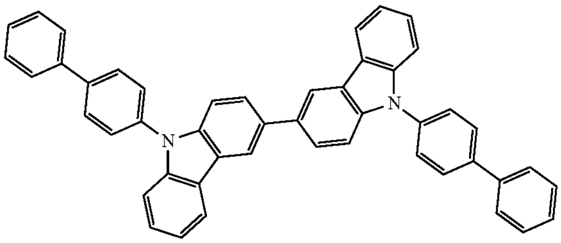
,
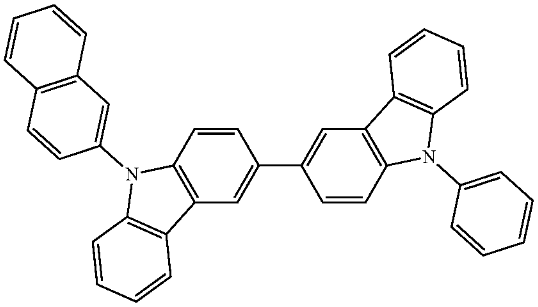
,
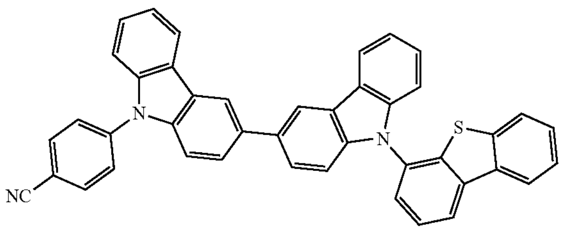
,
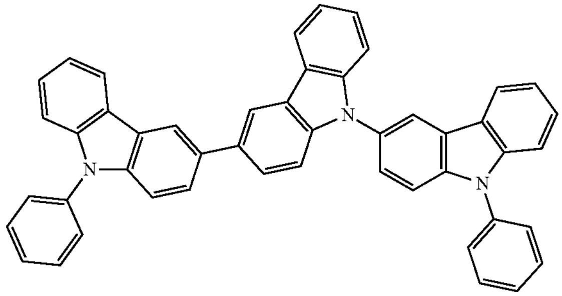
,
-continued
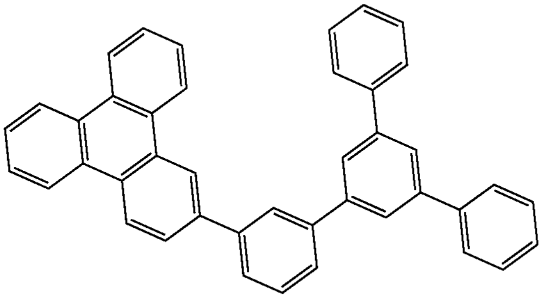
,
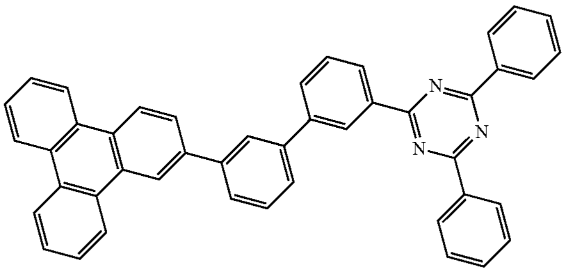
,
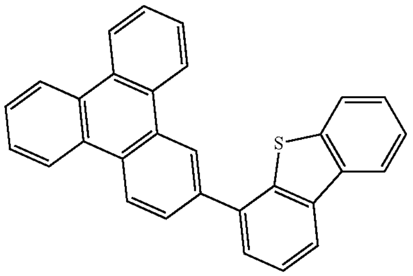
,
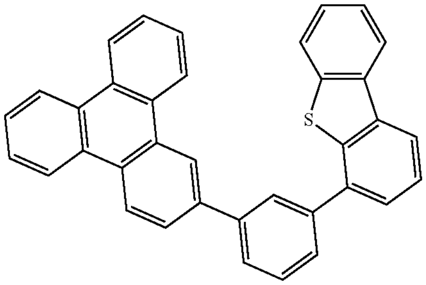
,
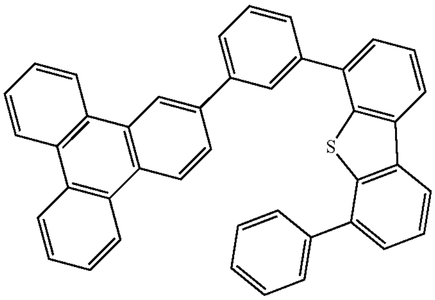
,
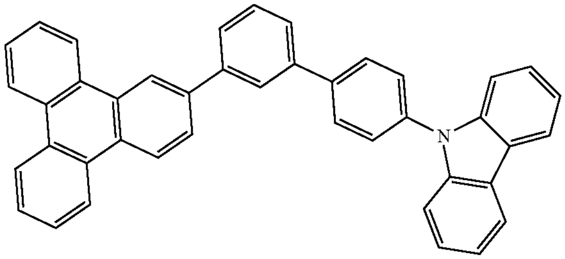
, -continued

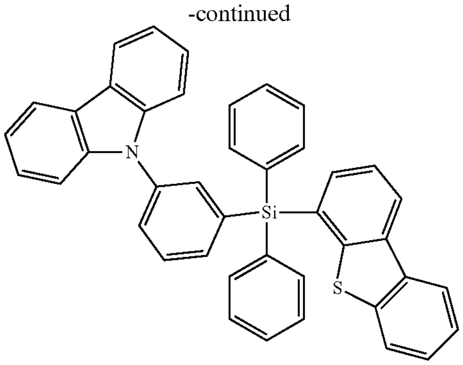

,

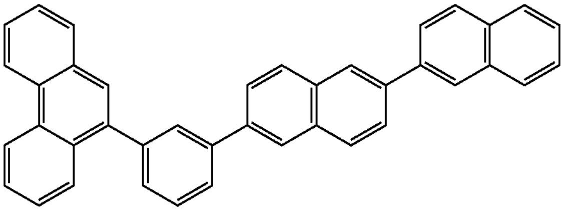

,

, and combinations thereof.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}CH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

COMBINATION WITH OTHER MATERIALS

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination. Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EPO1617493, EPO1968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

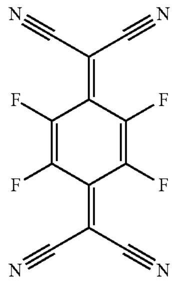

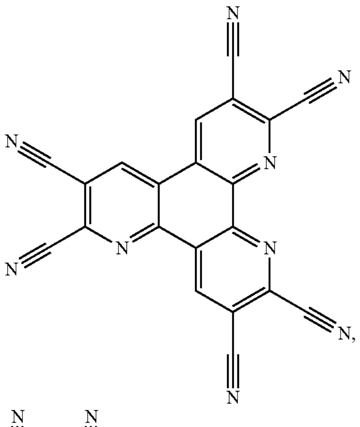

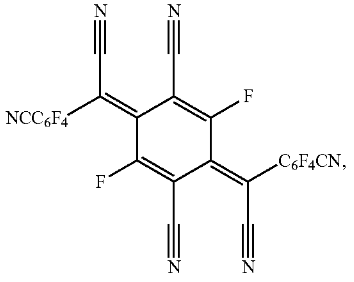

-continued

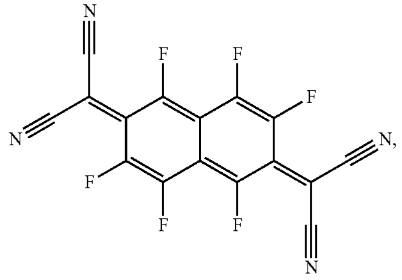

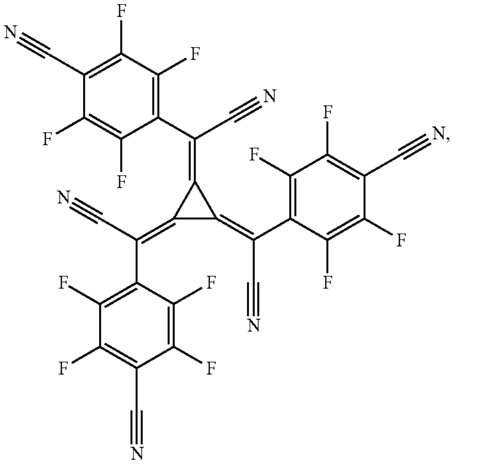

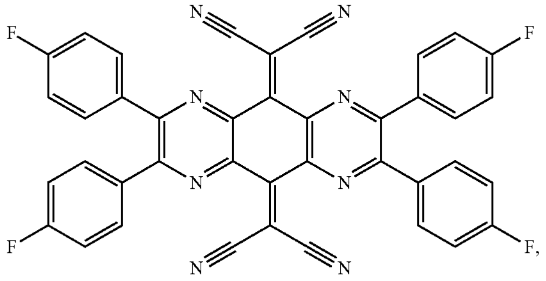

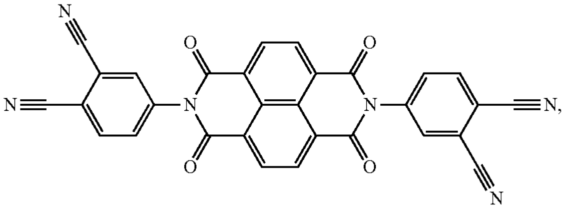

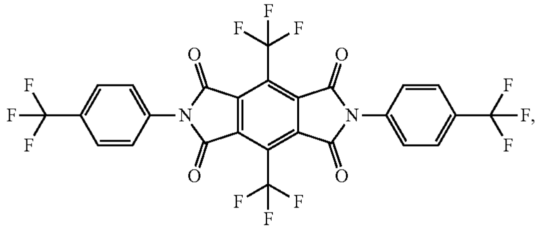

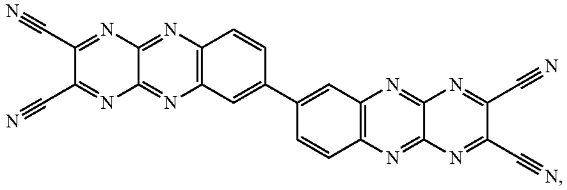

-continued

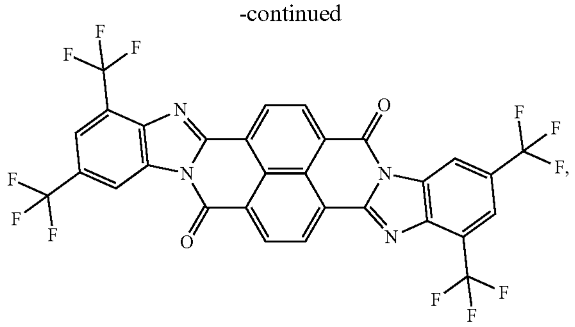

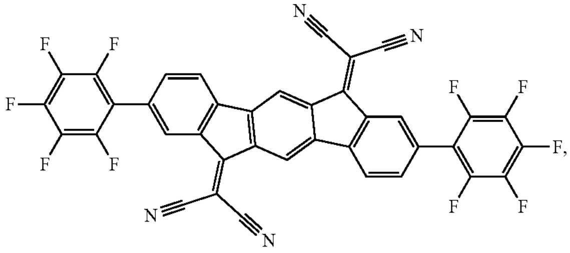

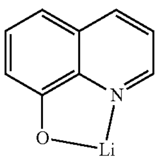

, and

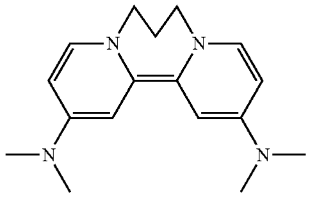

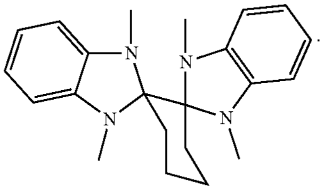

HIL/HTL

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

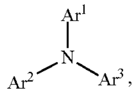

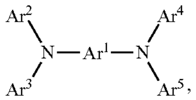

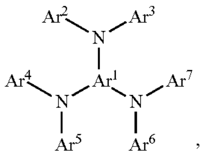

-continued

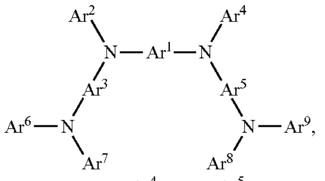

and

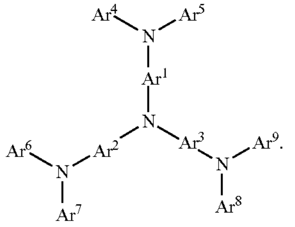

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

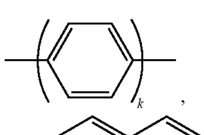

,

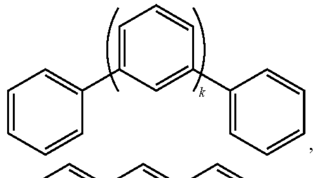

,

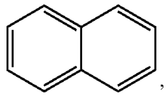

,

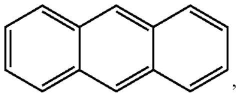

,

-continued

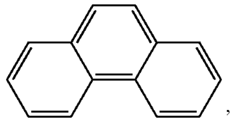

,

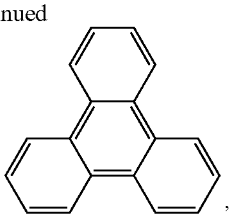

,

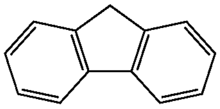

, and

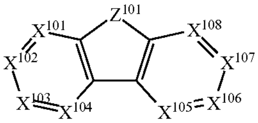

, wherein k is an integer from 1 to 20; $X^{101}$ to $X^{108}$ is C (including CH) or N; $Z^{101}$ is $NAr^1$, O, or S; $Ar^1$has the same group defined above.

Examples of metal complexes used in HIL or HTL include, but are not limited to the following general formula:

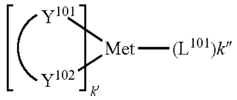

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. Fe/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

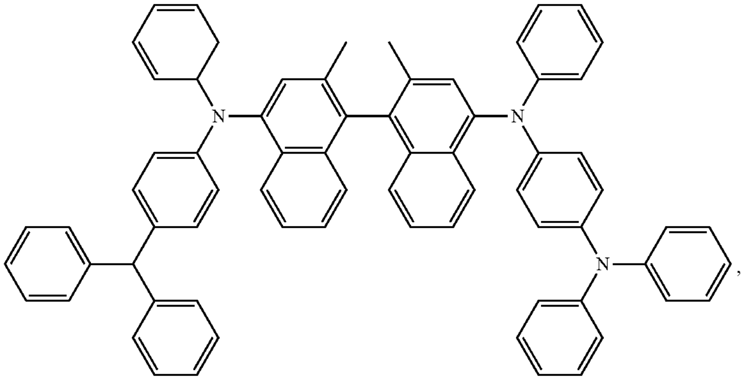
,
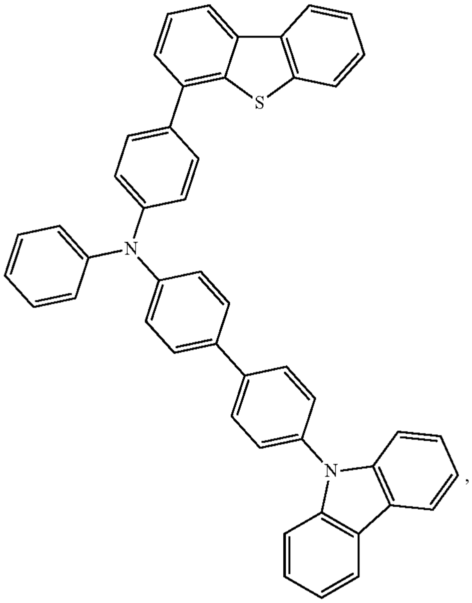
,
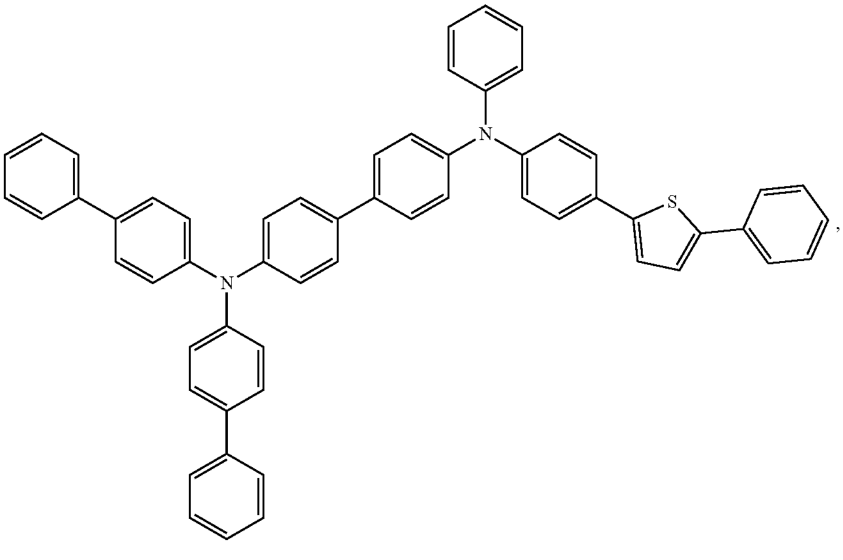
,

-continued
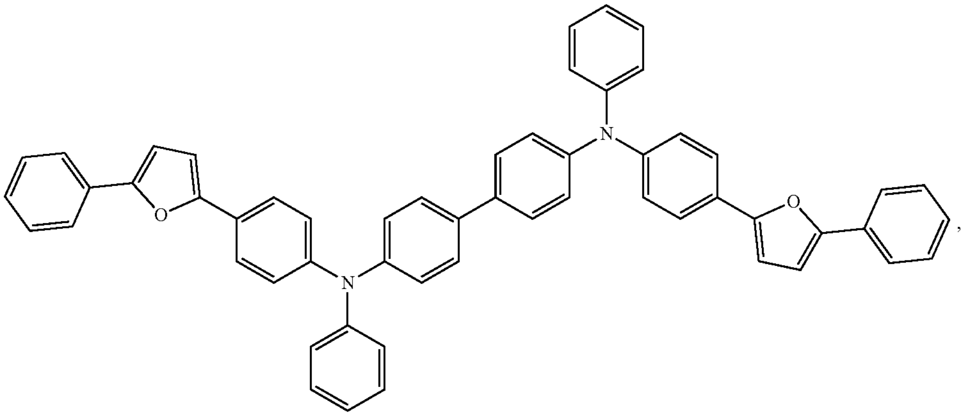
,
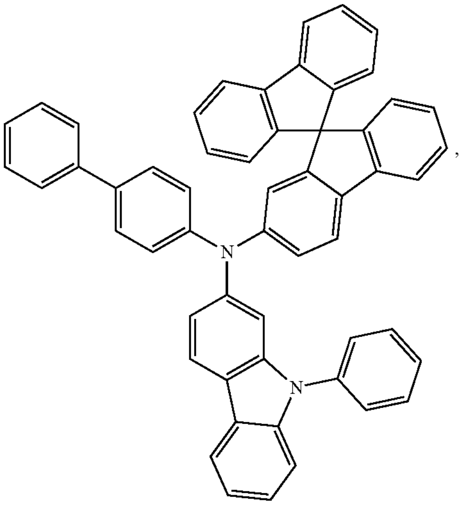
,
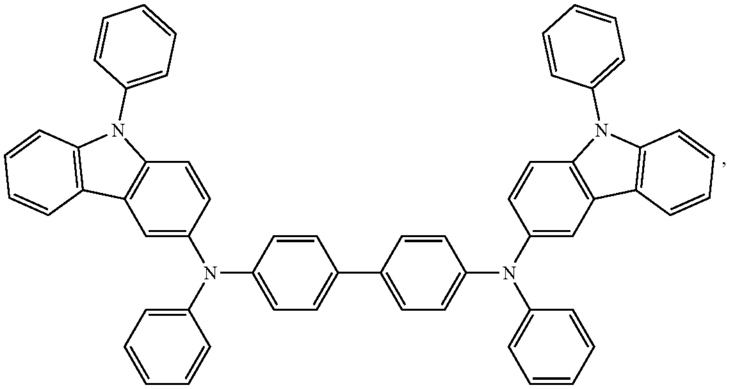
,

-continued
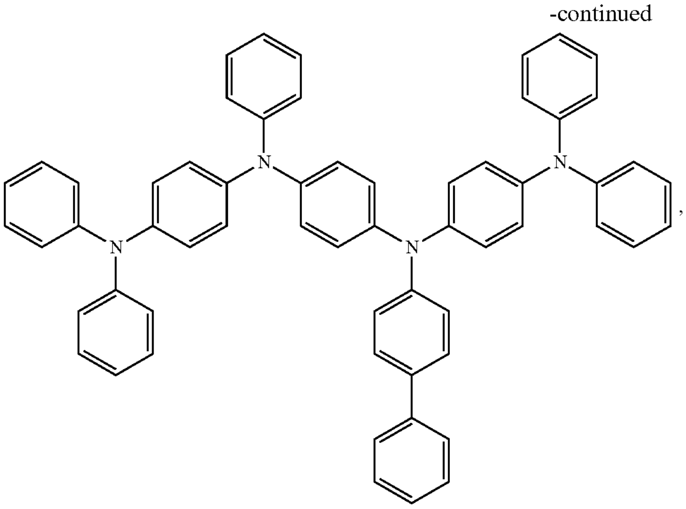
,
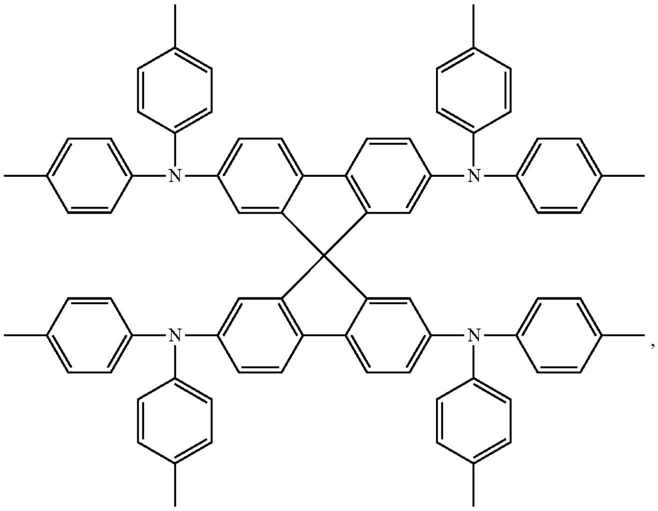
,
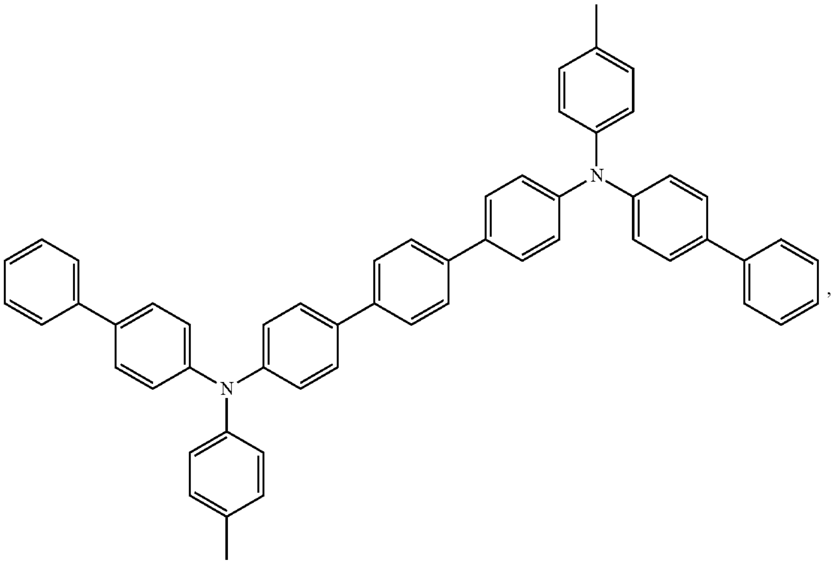
,

-continued
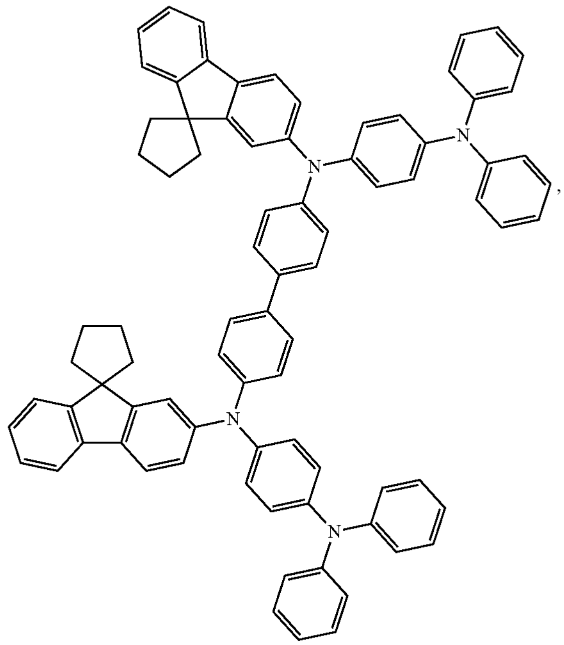
,
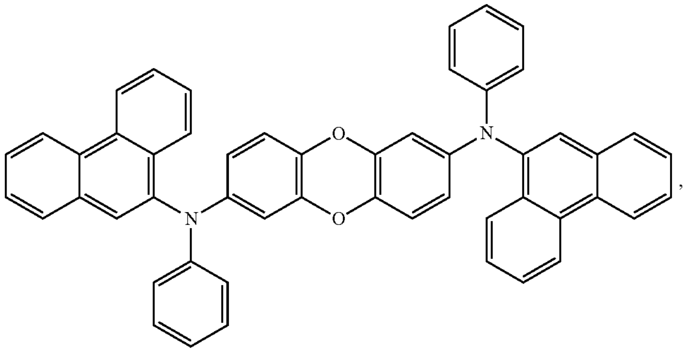
,
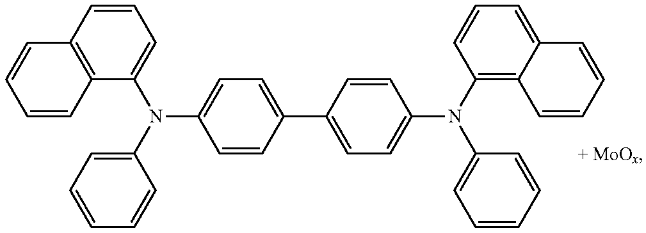
+ $MoO_x$,
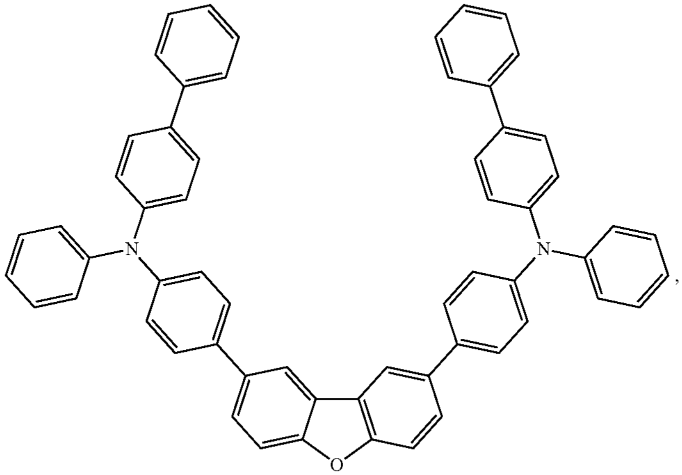
,
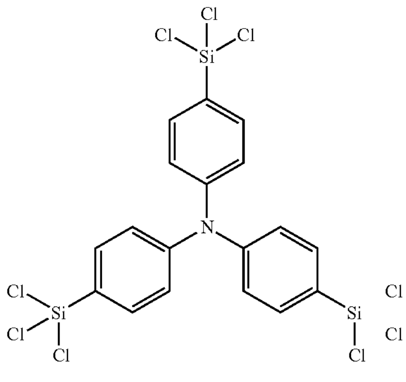
, -continued
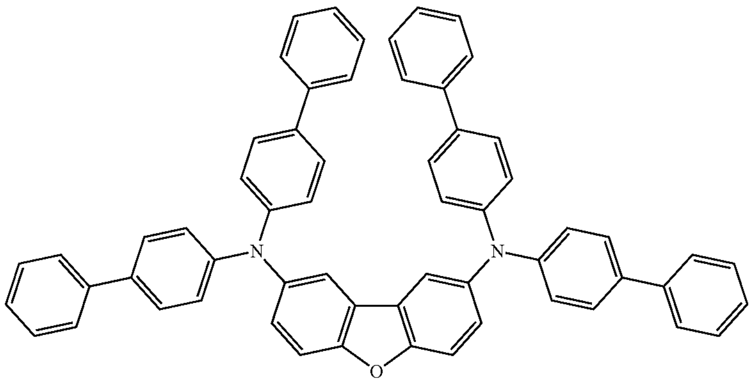
,
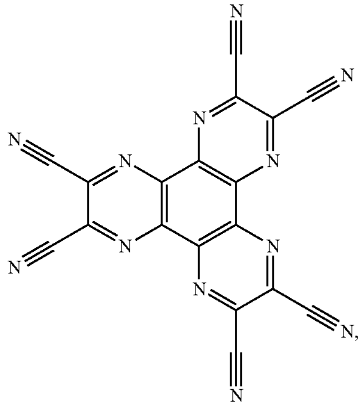
,
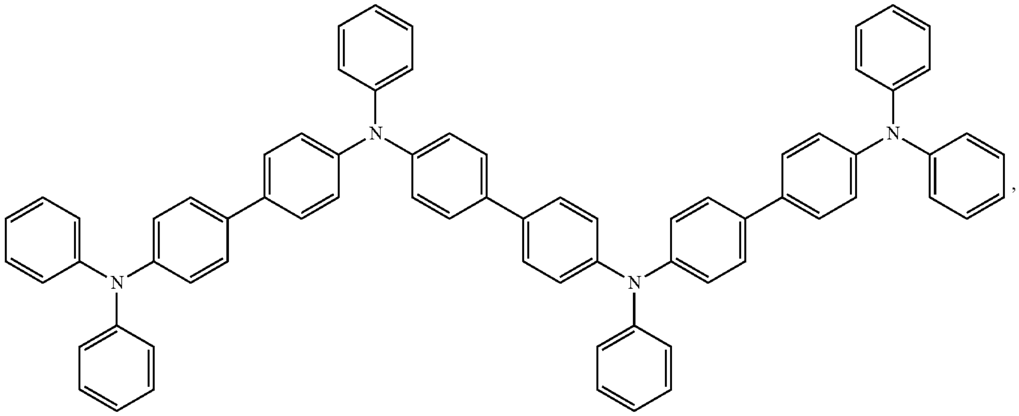
,
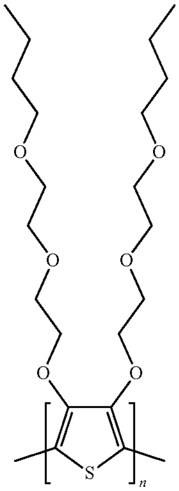
,
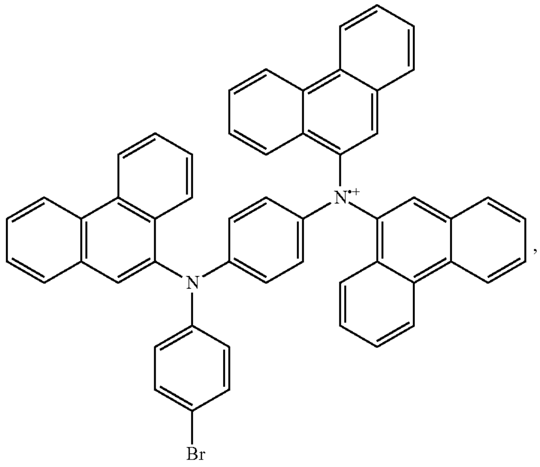
, -continued
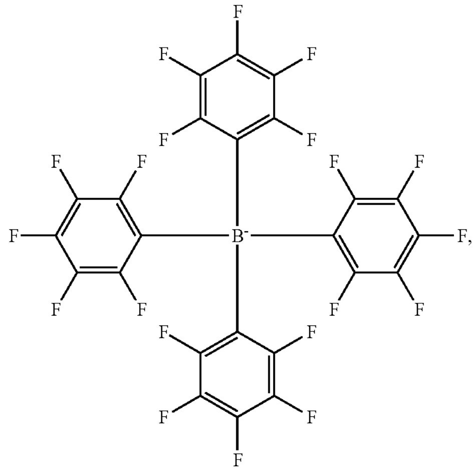
,
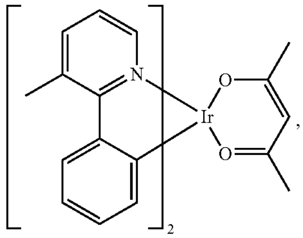
,
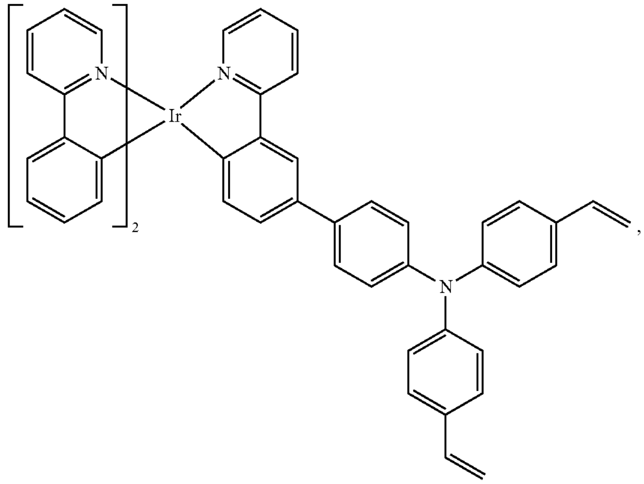
,
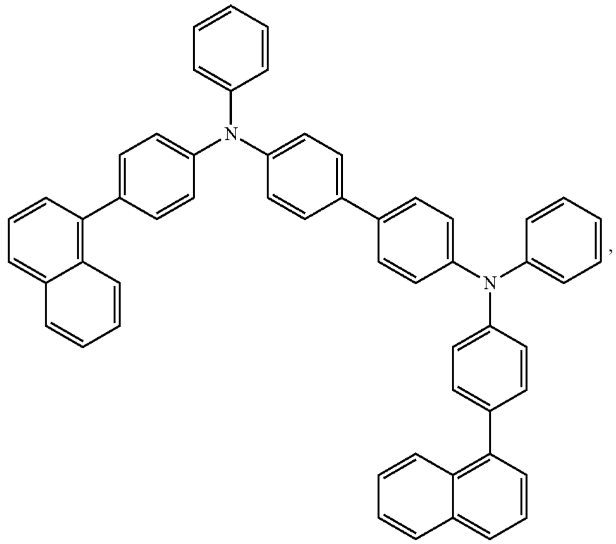
, -continued
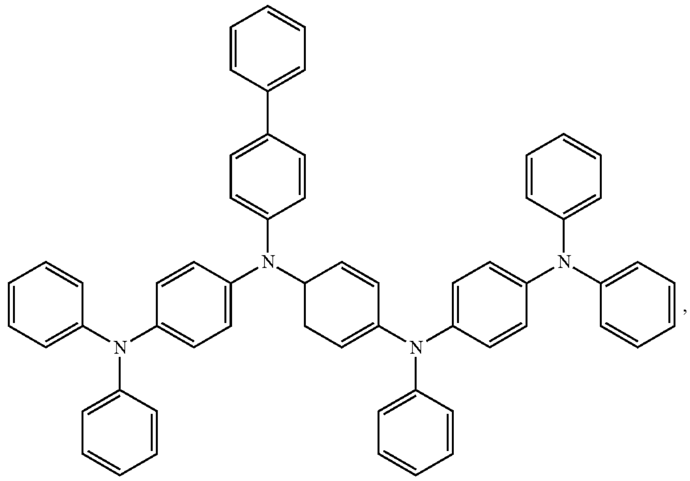
,
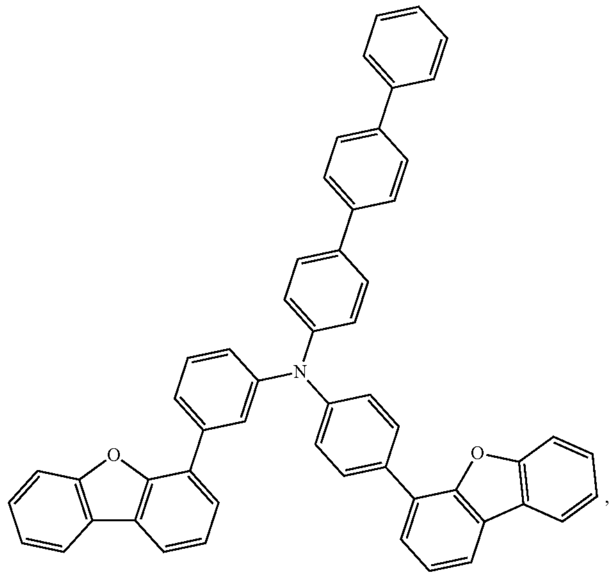
,
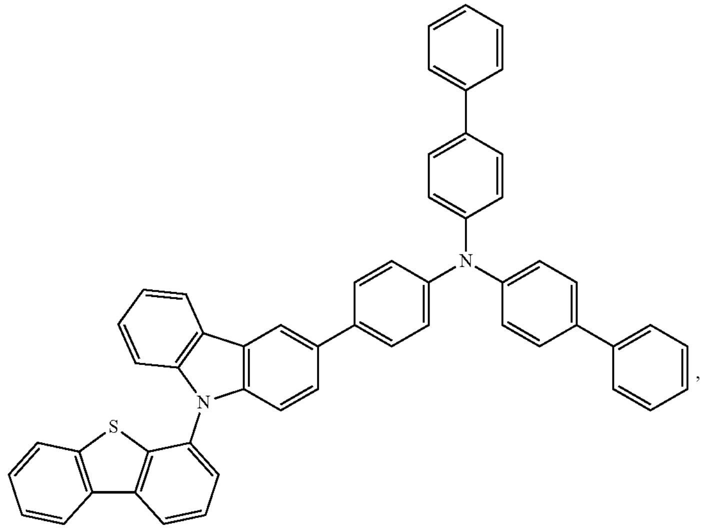
, -continued
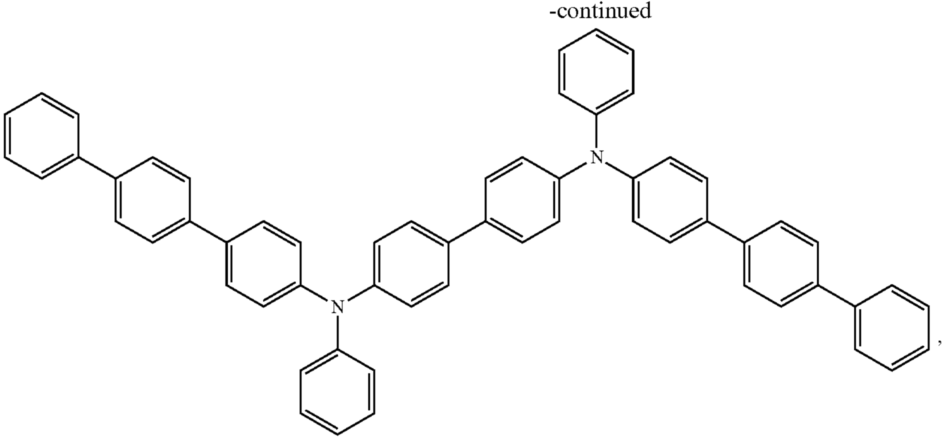
,
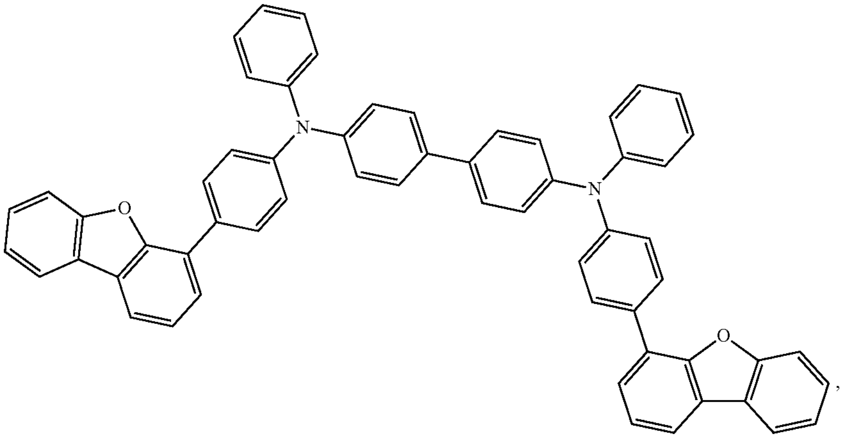
,
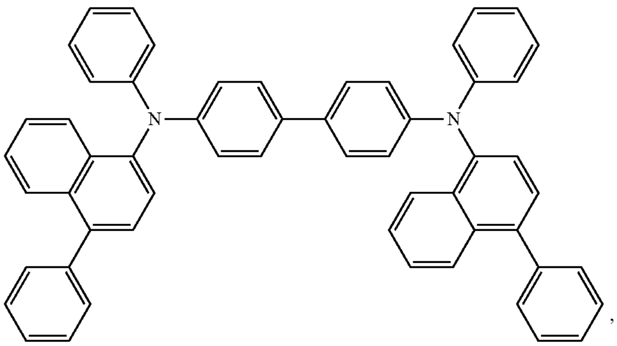
,
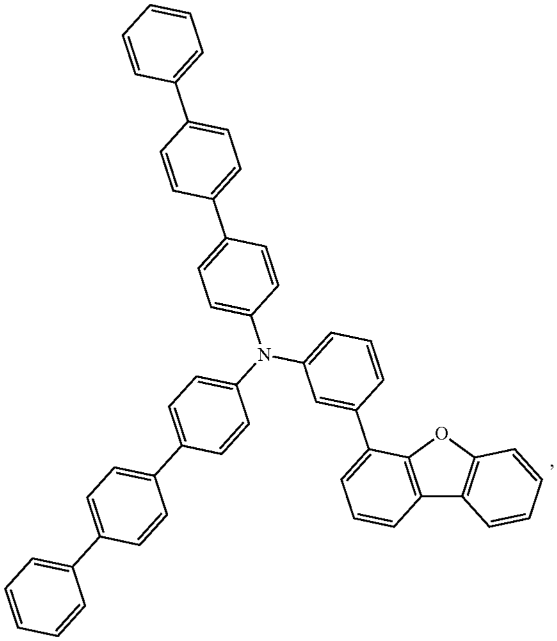
, -continued
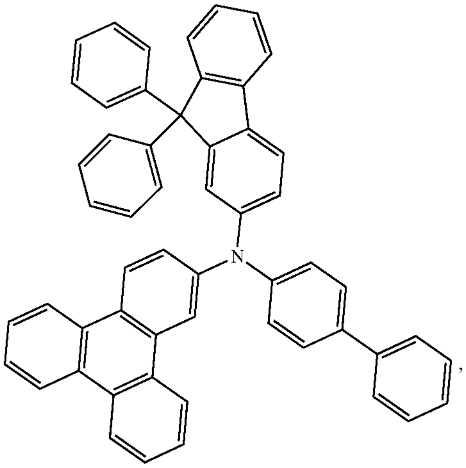
,
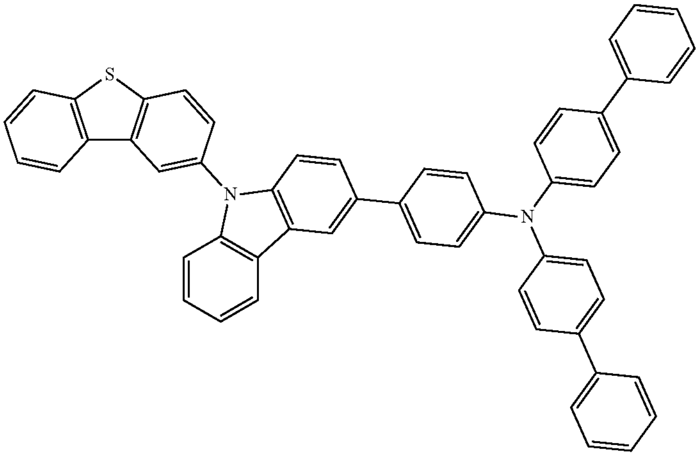
,
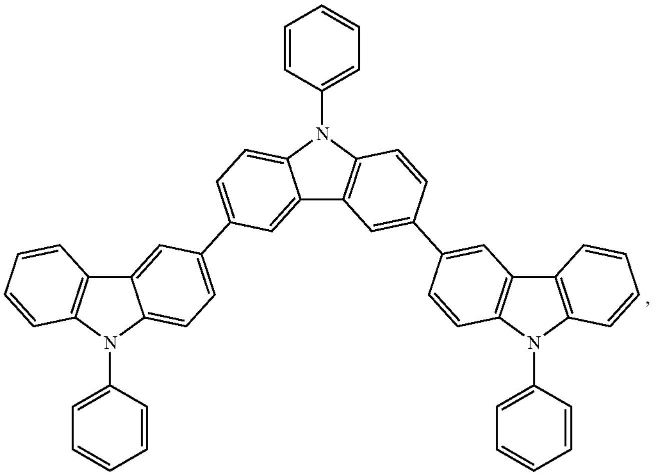
,
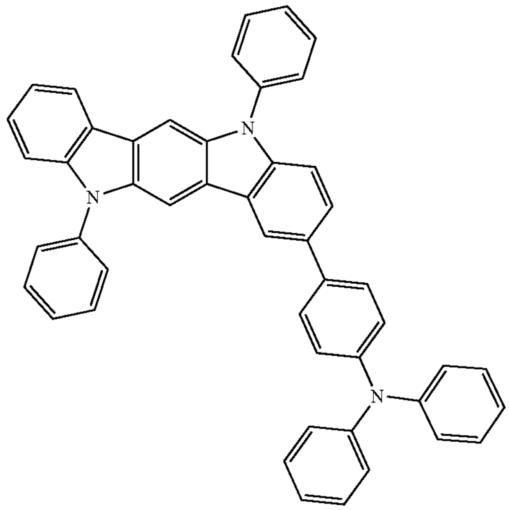
,
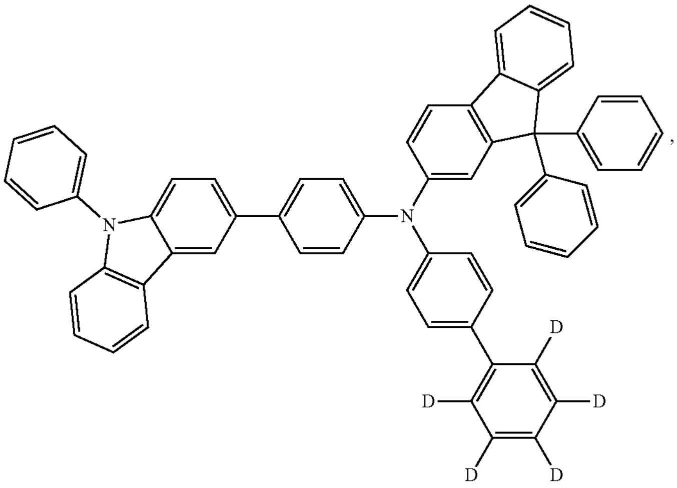
, -continued
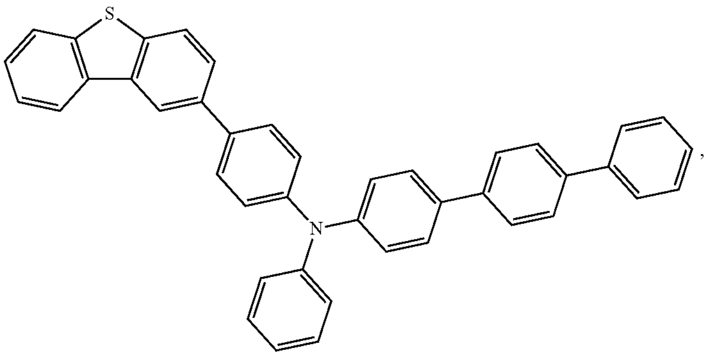
,
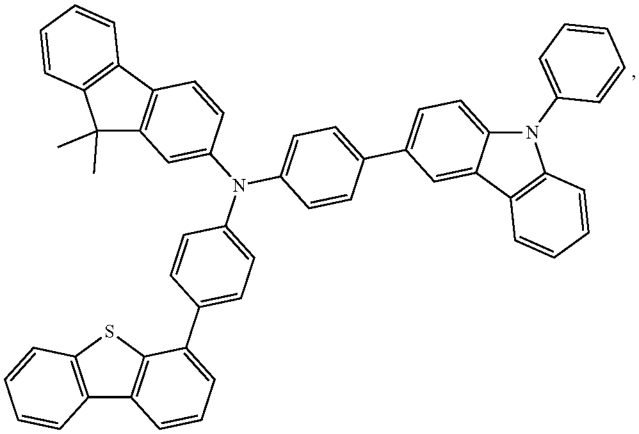
,
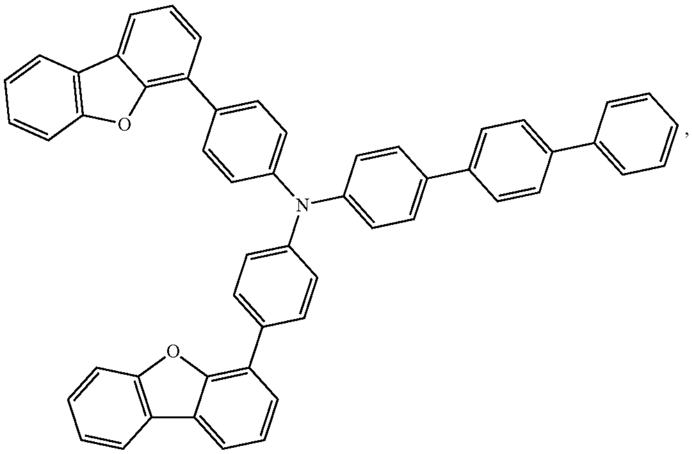
,
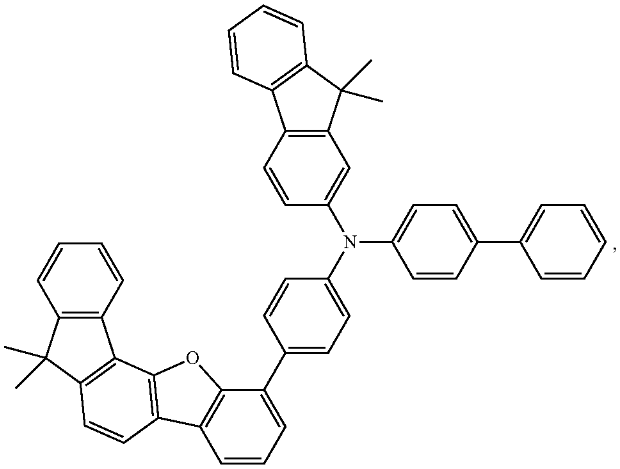
, -continued
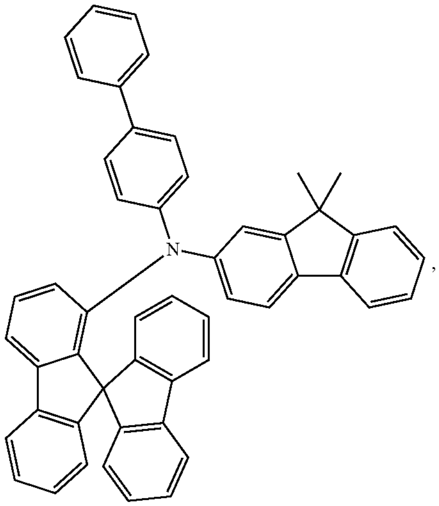
,
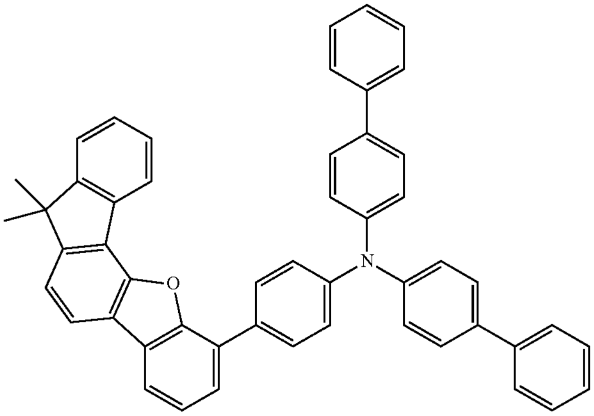
,
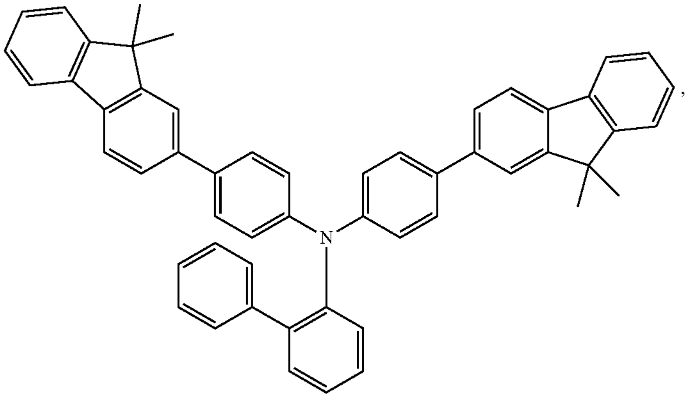
,
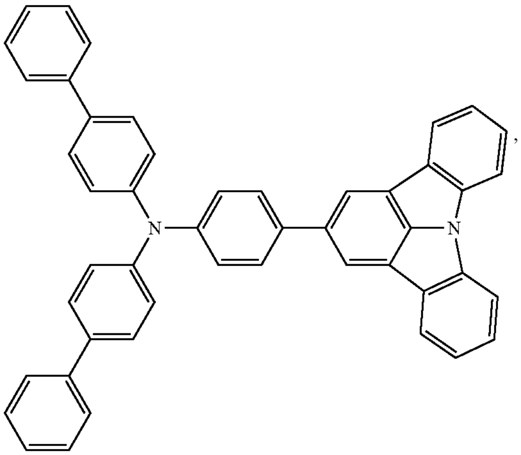
,
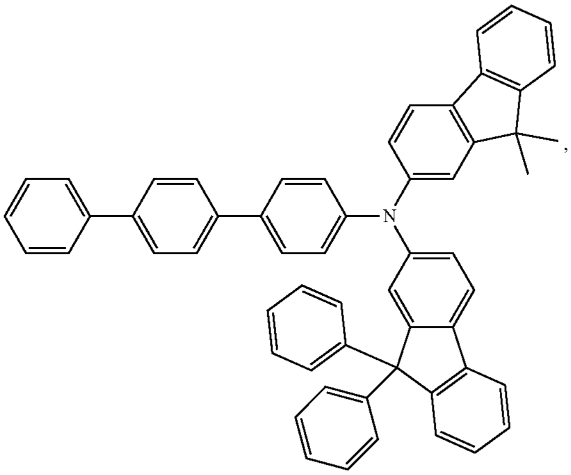
, -continued
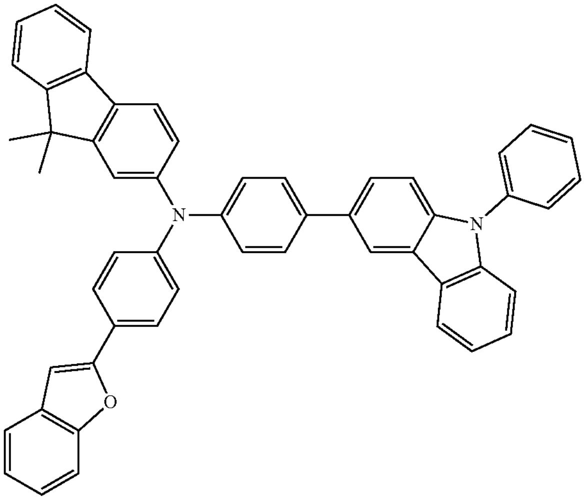
,
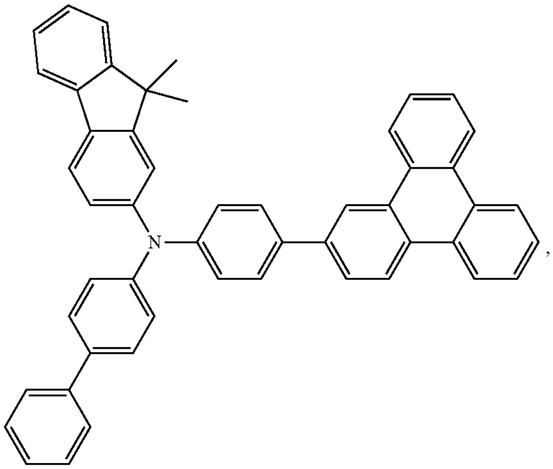
,
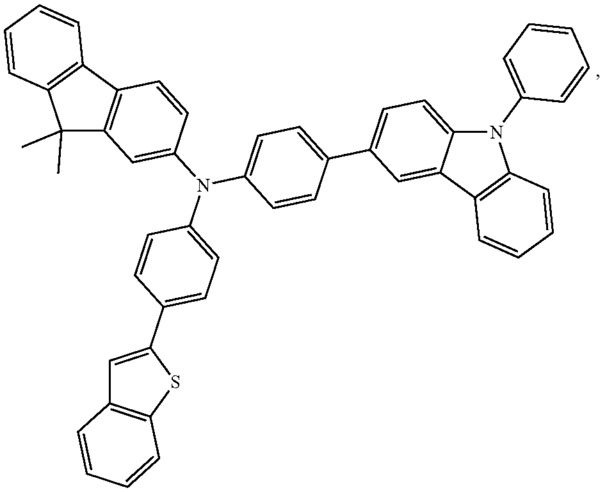
,
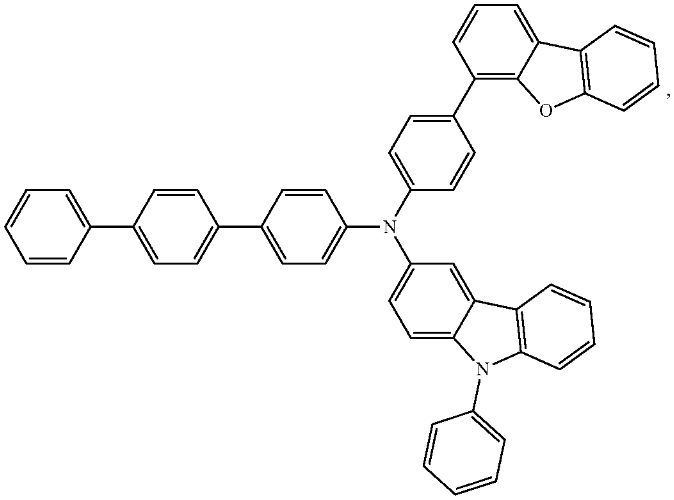
, -continued
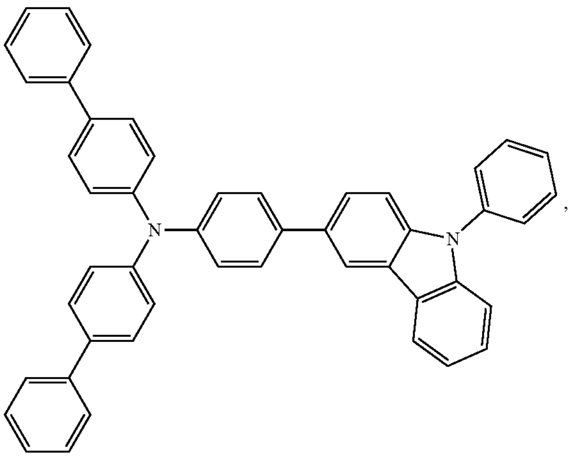
,
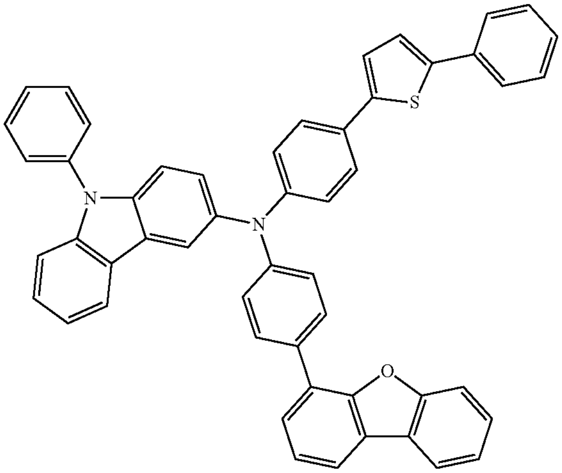
,
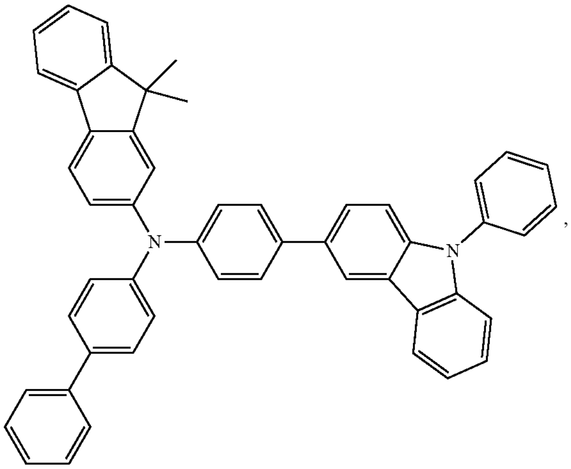
,
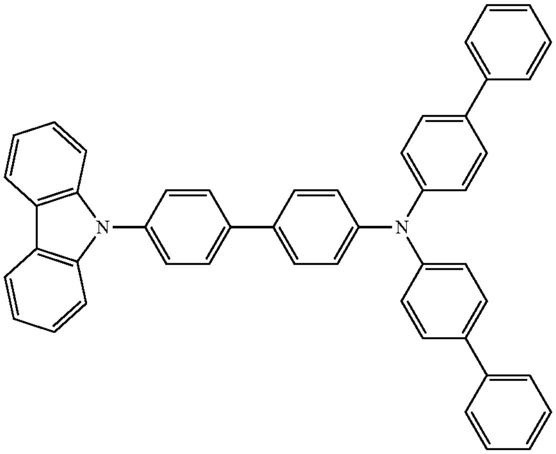
,
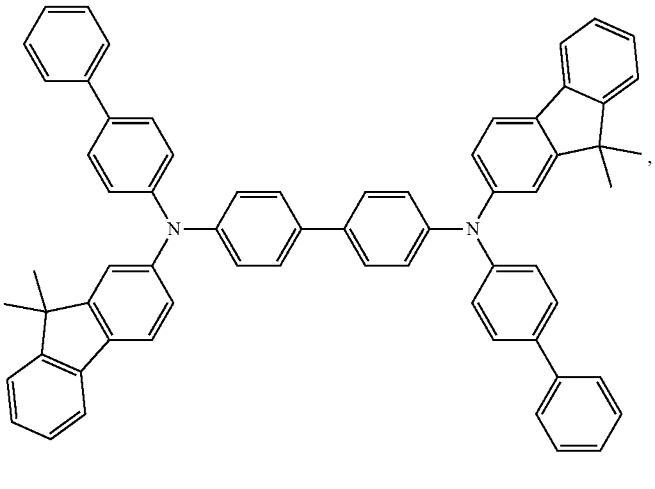
, -continued
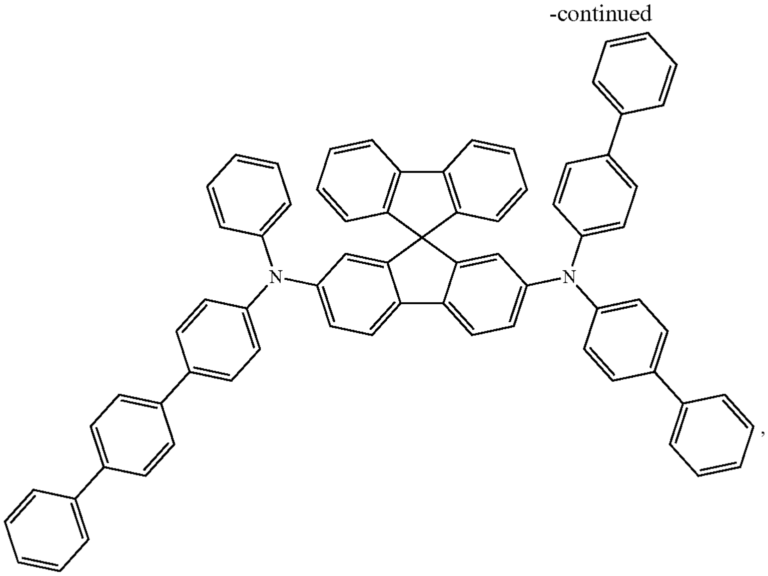
,
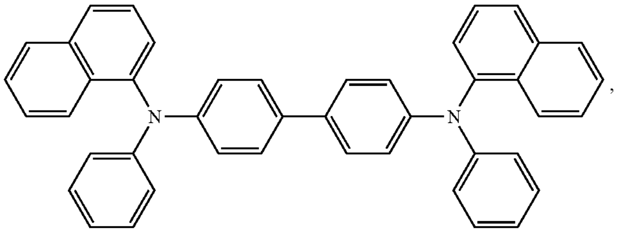
,
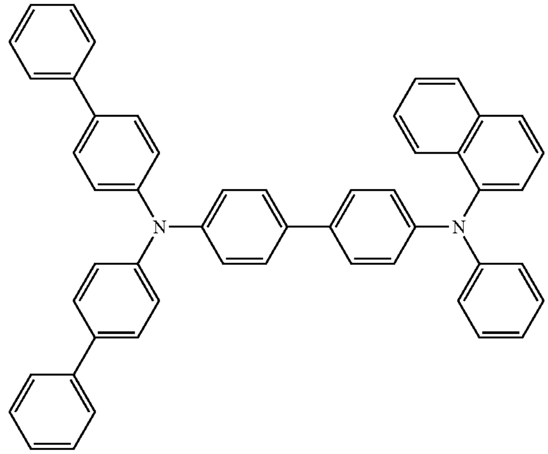
,
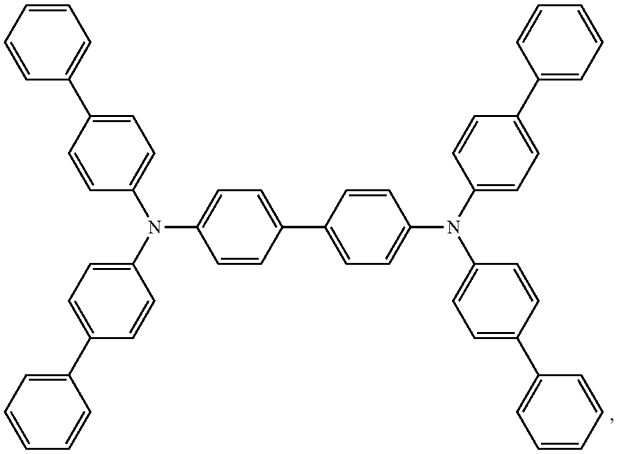
, -continued
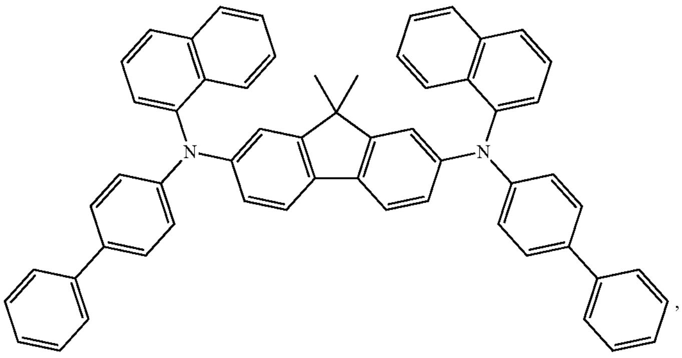
,
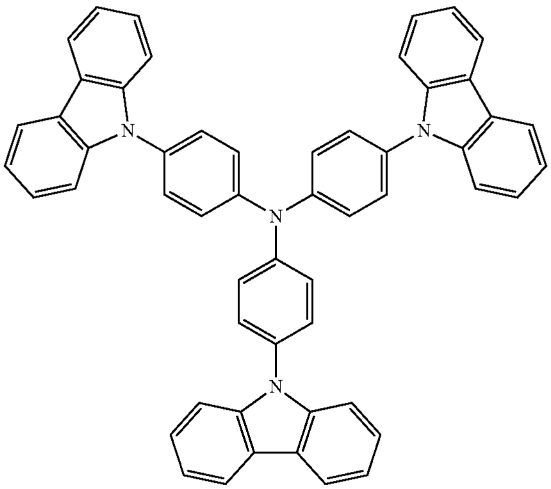
,
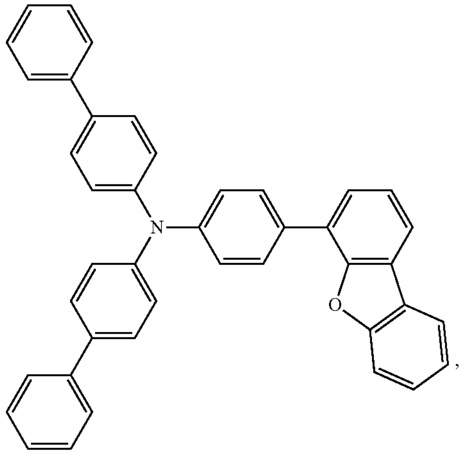
,
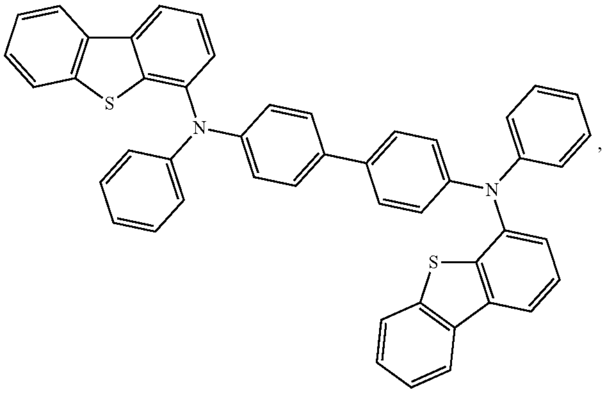
,
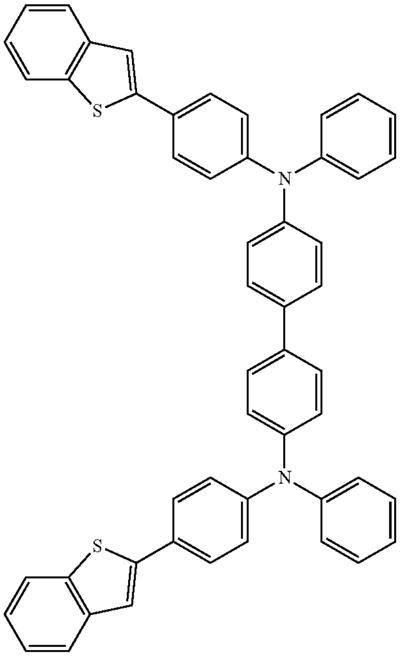
, and -continued

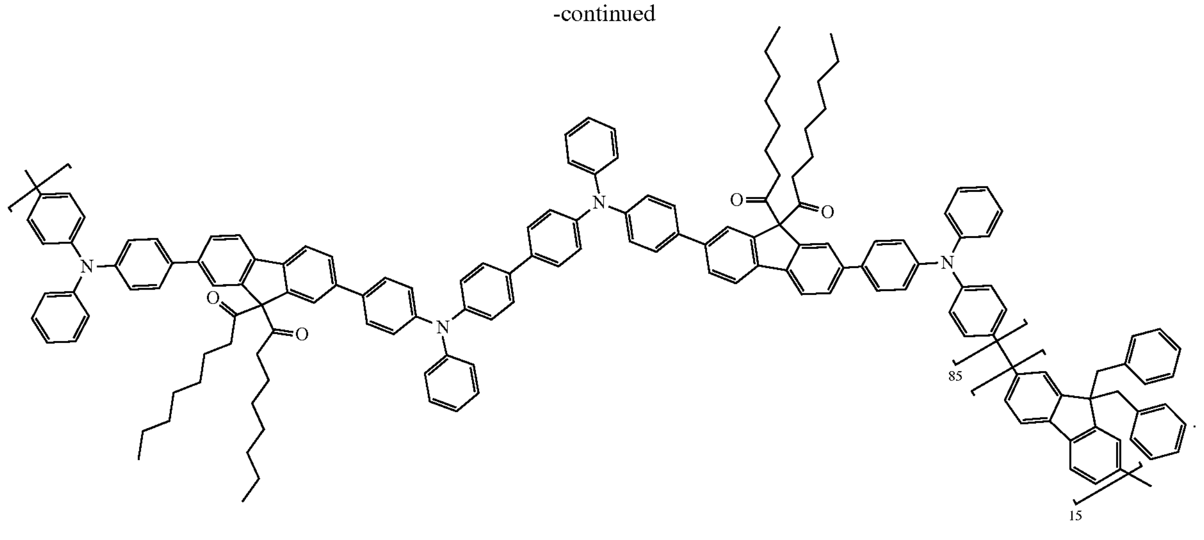

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

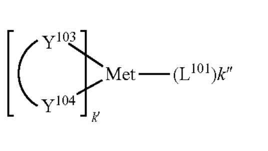

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

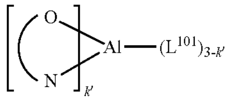

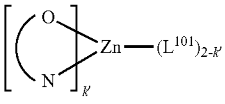

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

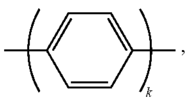, 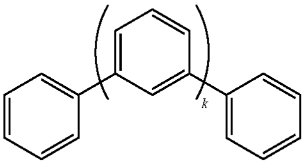,

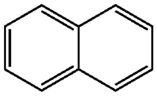, 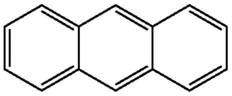,

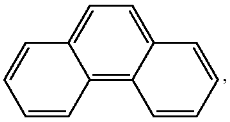, 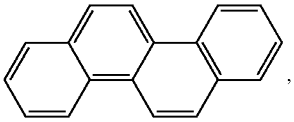,

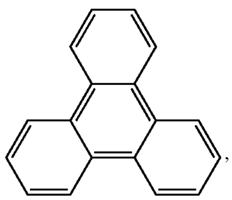, 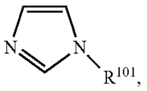 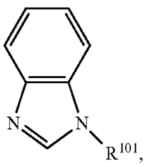

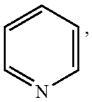, 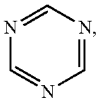 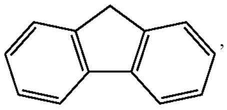,

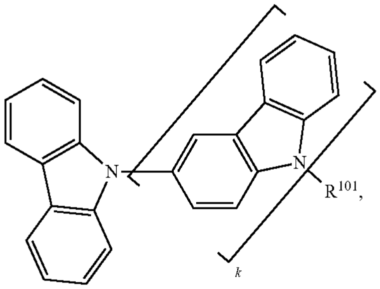

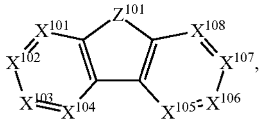

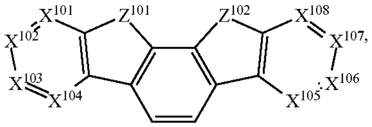

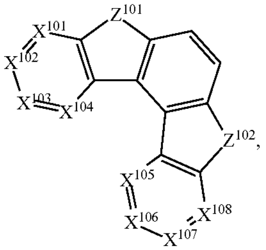

-continued

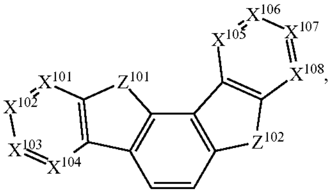

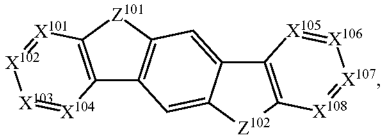 and

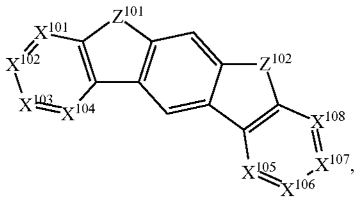

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in *combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803, -continued
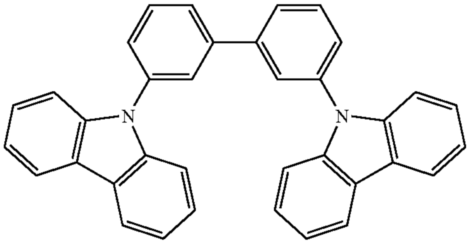,
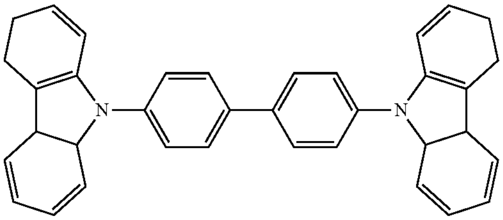,
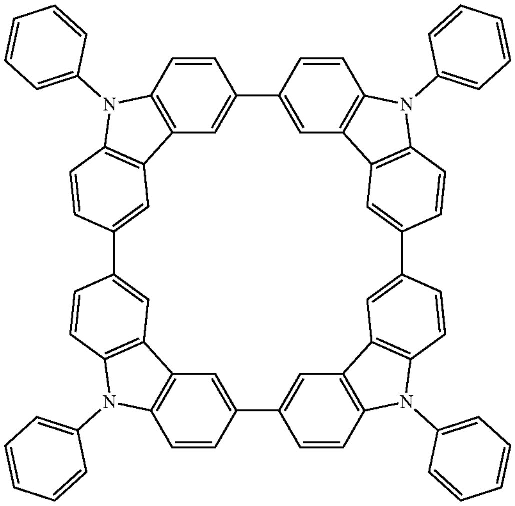,
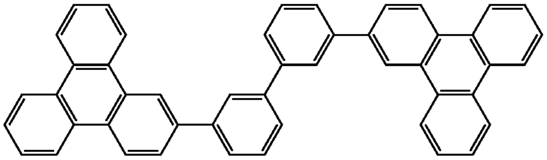,
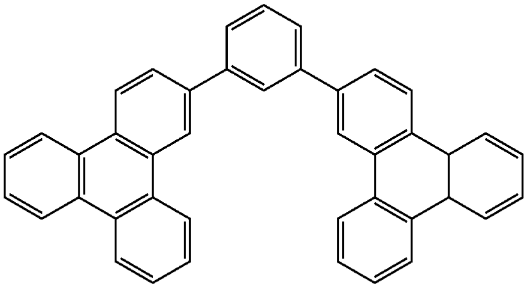,
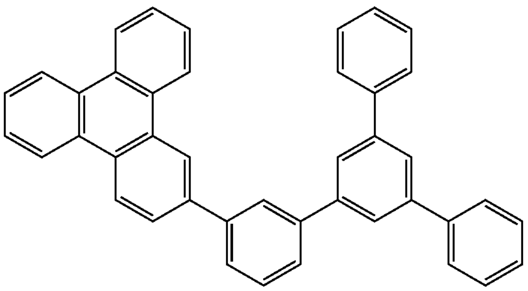,
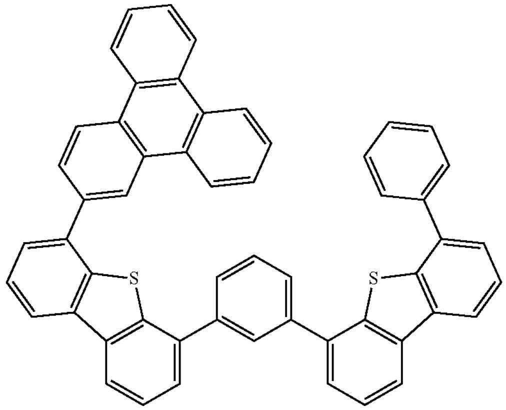,
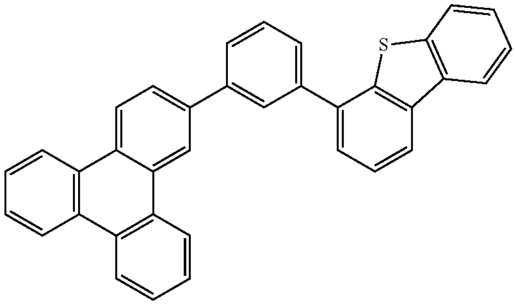,
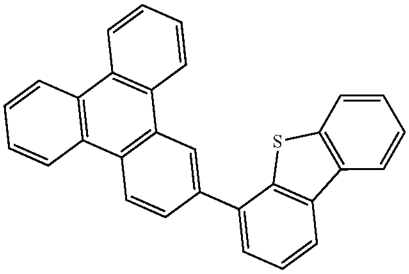,
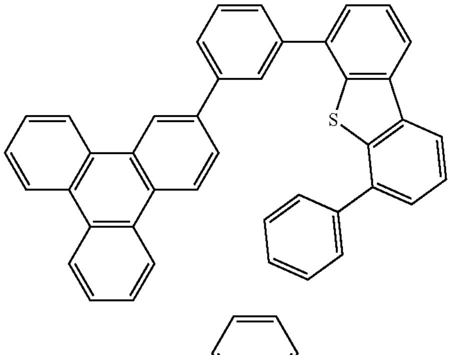,
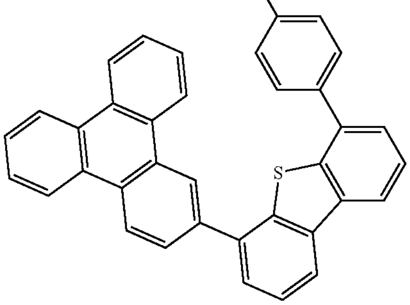, -continued
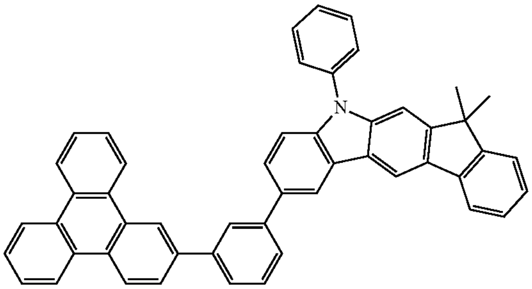
,
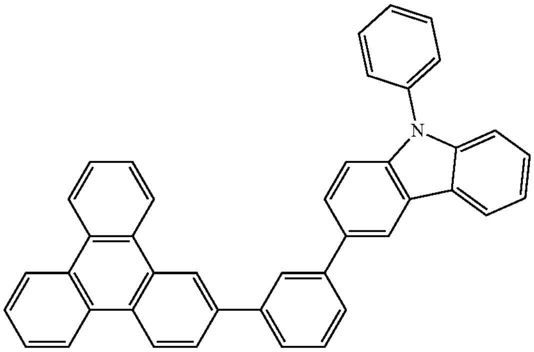
,
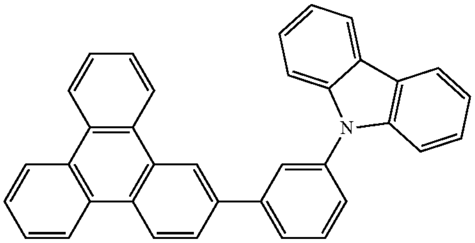
,
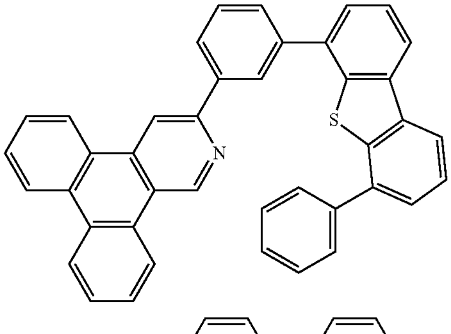
,
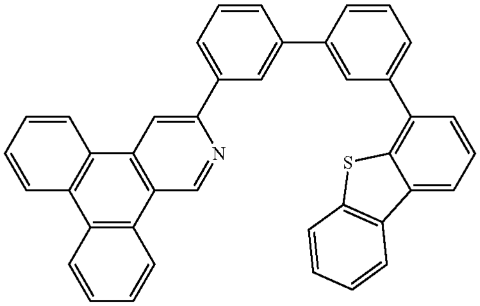
,
-continued
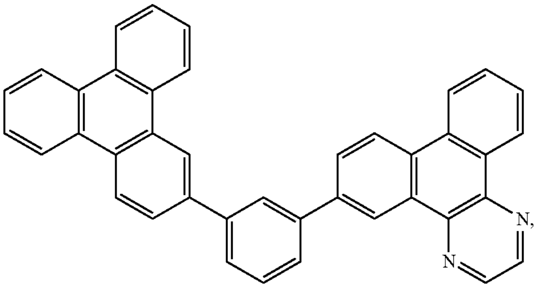
,
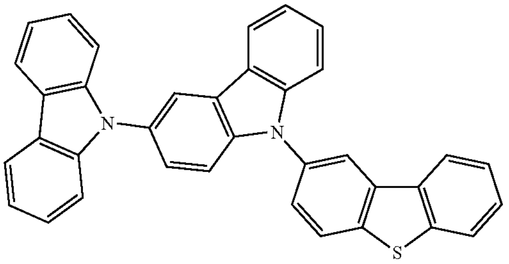
,
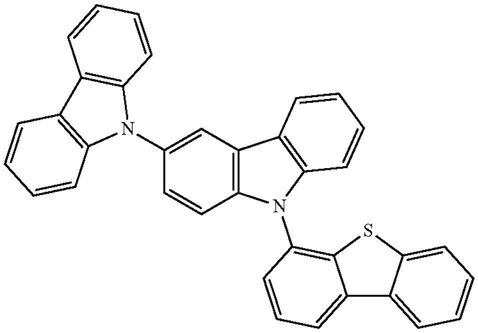
,
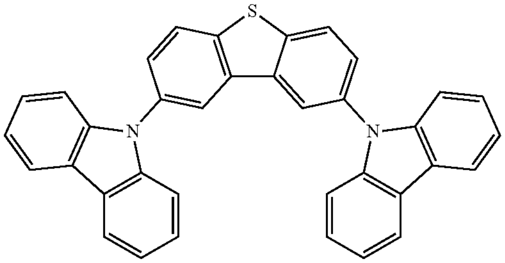
,
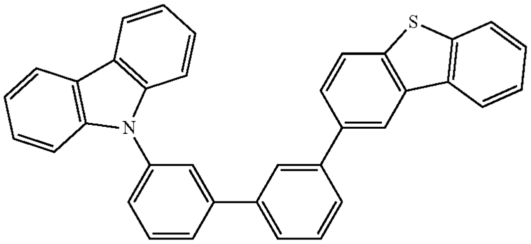
,
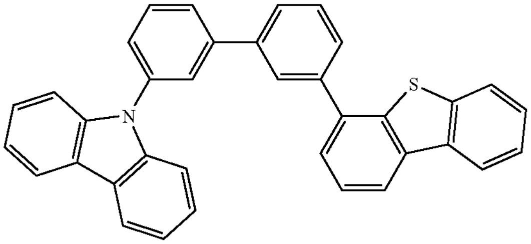
, -continued
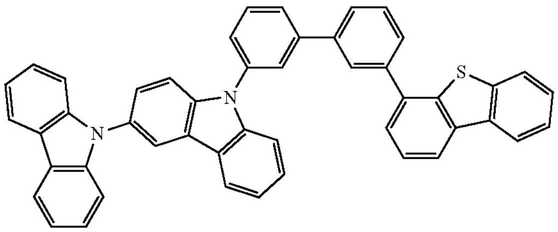
,
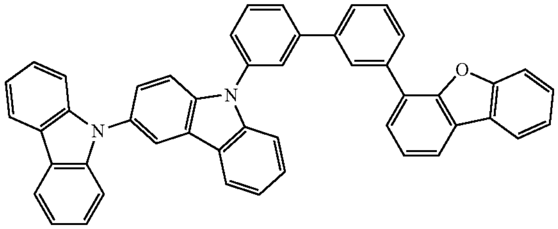
,
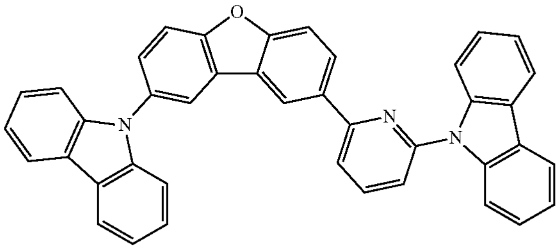
,
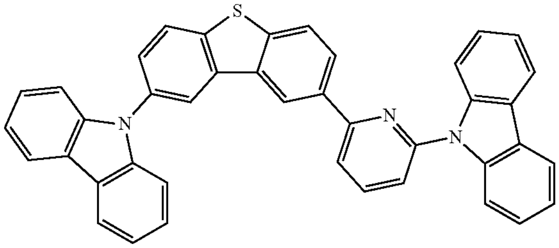
,
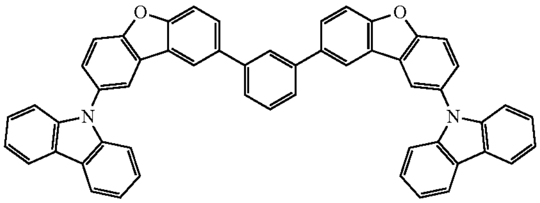
,
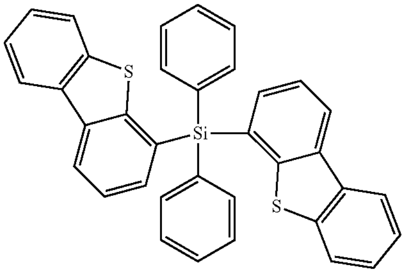
,
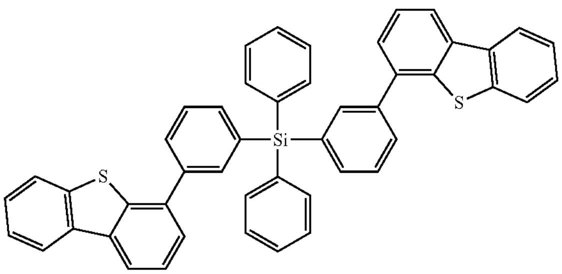
,
-continued
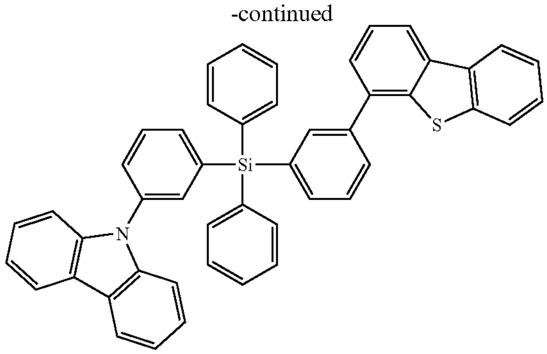
,
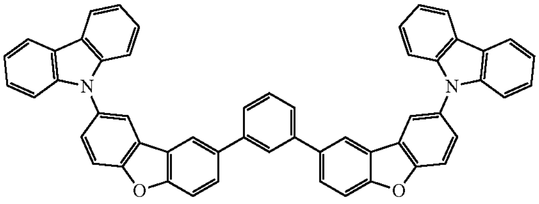
,
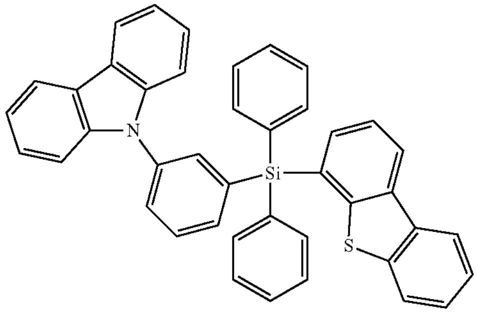
,
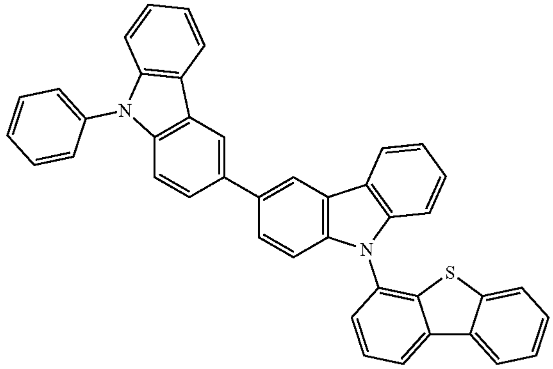
,
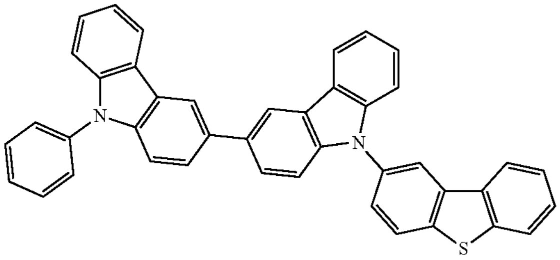
, -continued
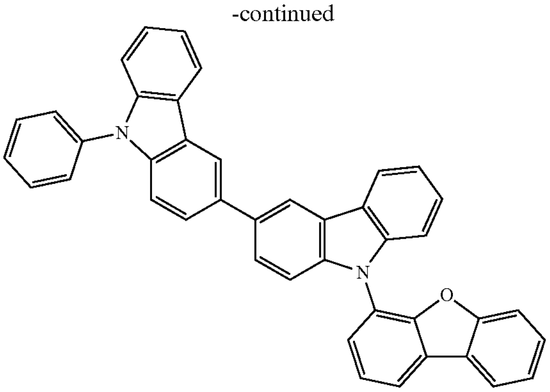
,
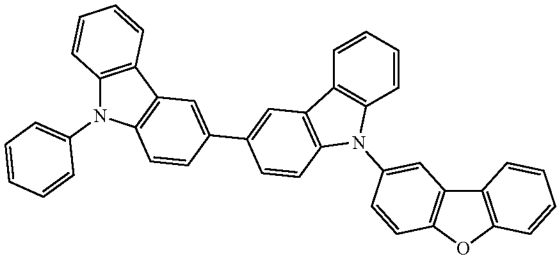
,
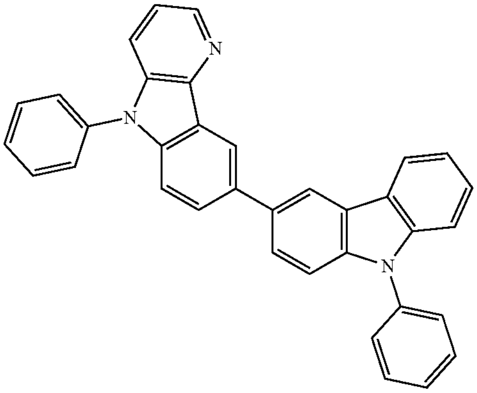
,
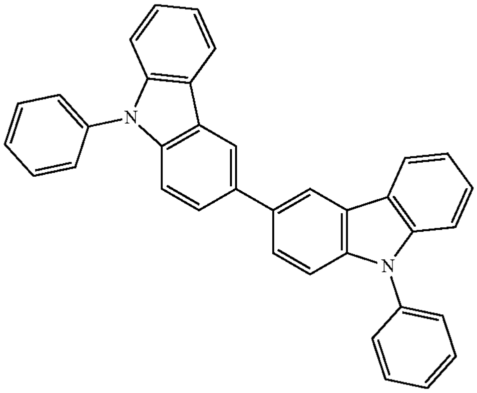
,
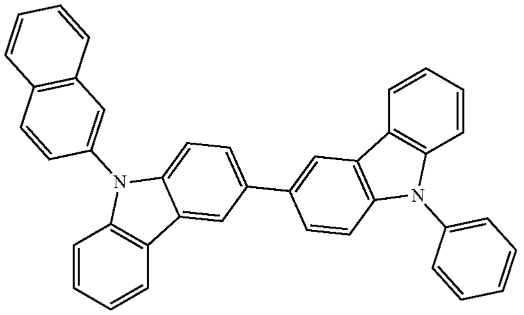
,
-continued
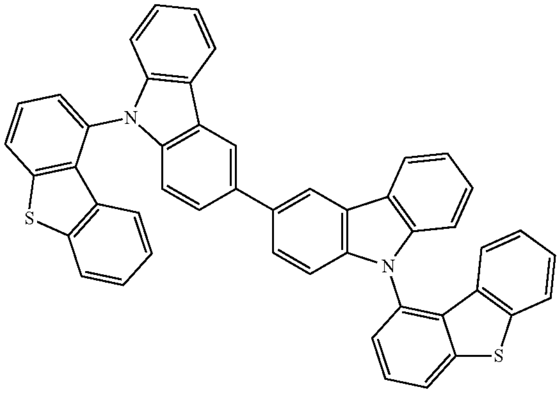
,
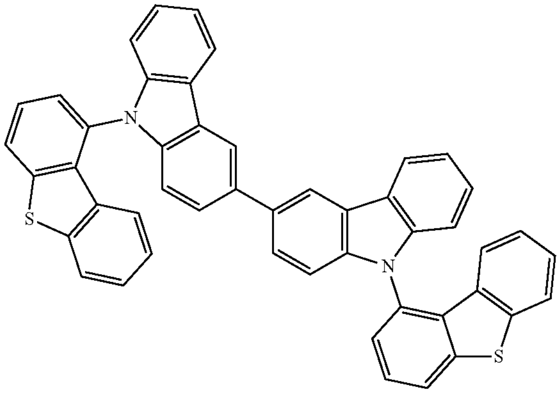
,
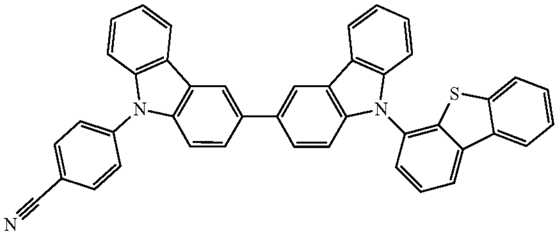
,
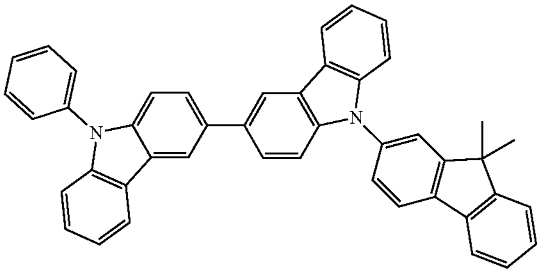
,
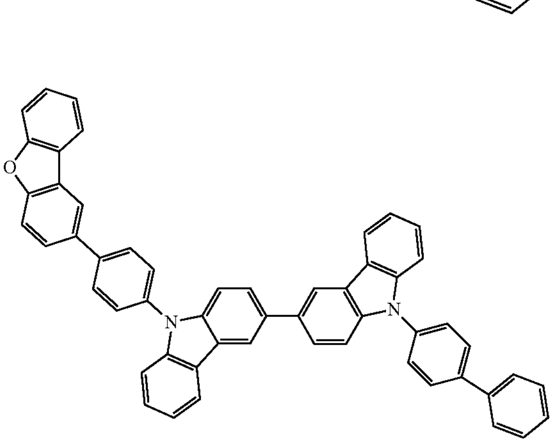
, -continued
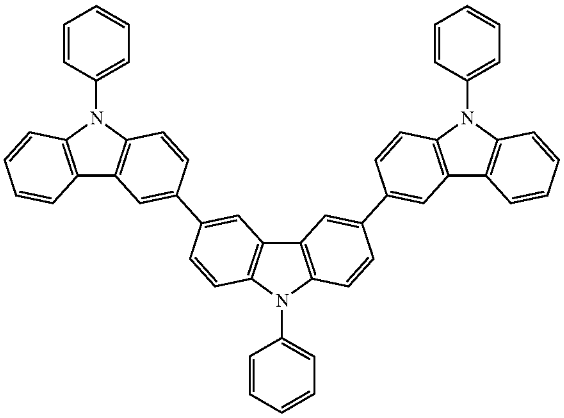
,
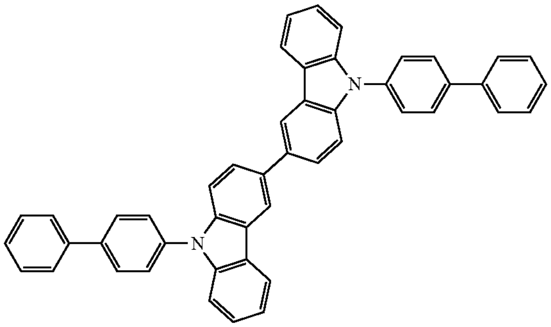
,
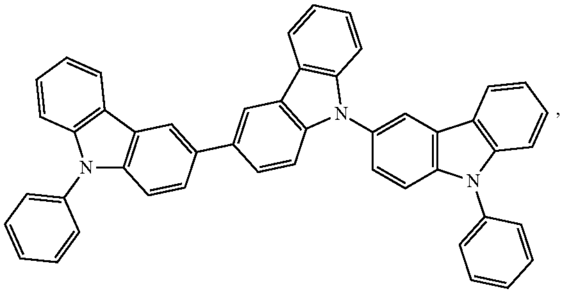
,
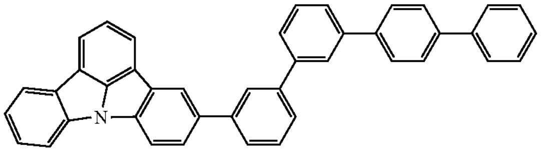
,
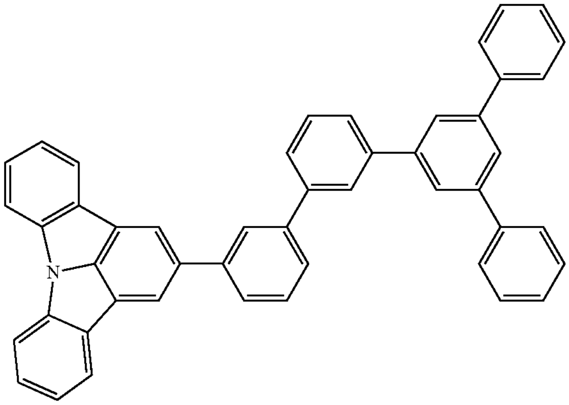
,
-continued
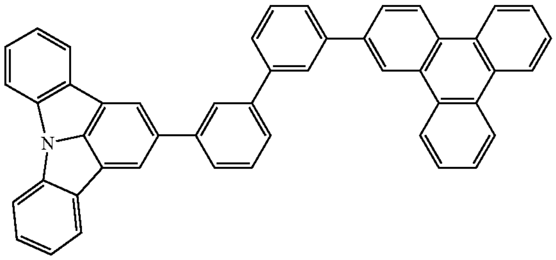
,
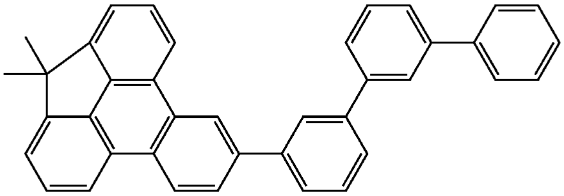
,
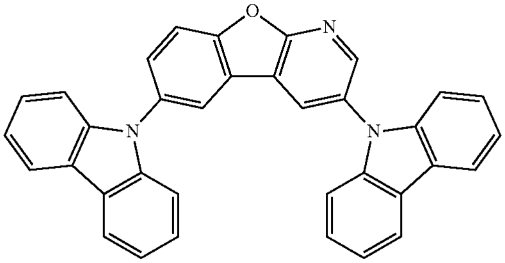
,
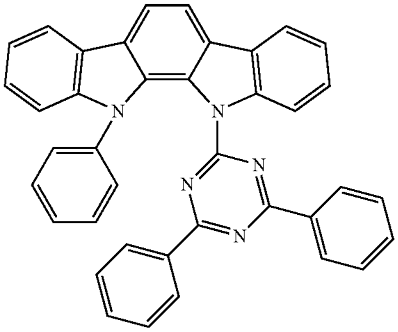
,
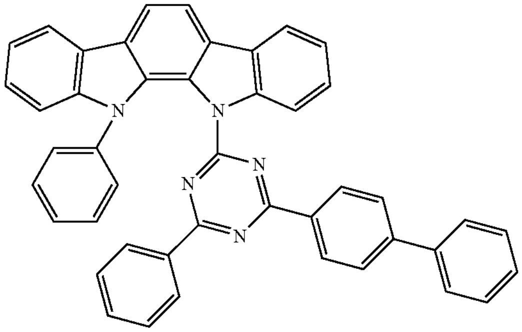
,
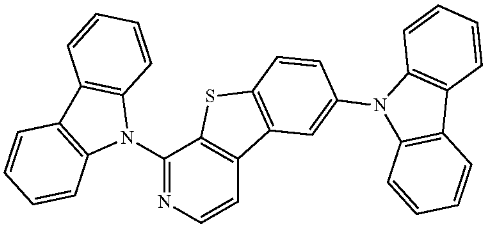
, -continued
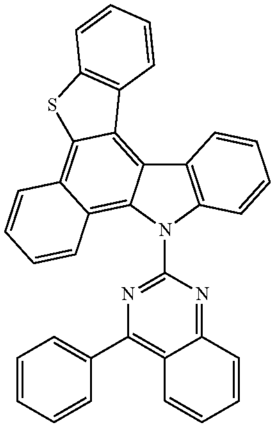
,
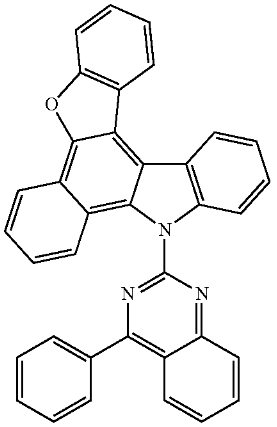
,
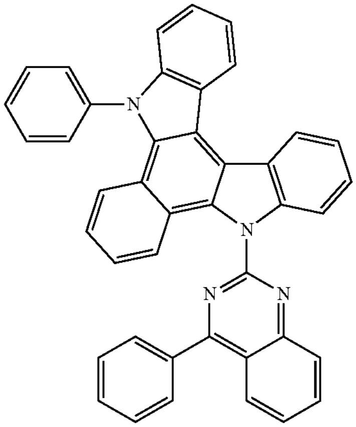
,
-continued
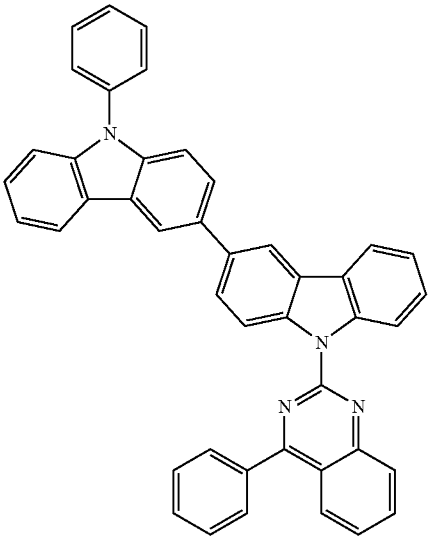
,
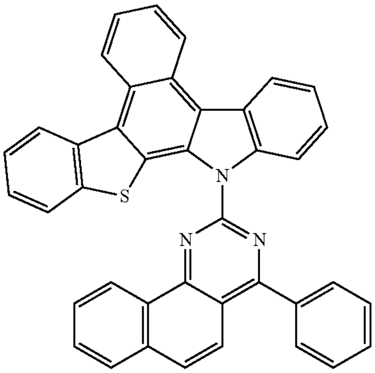
,
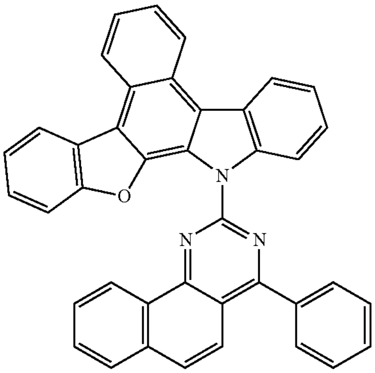
,
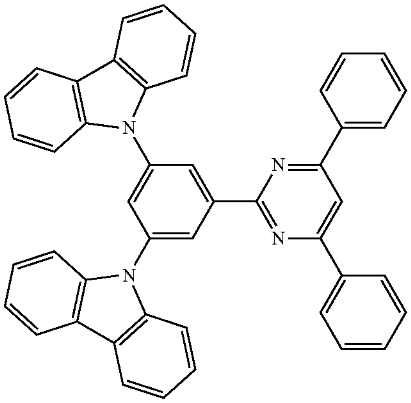
, -continued
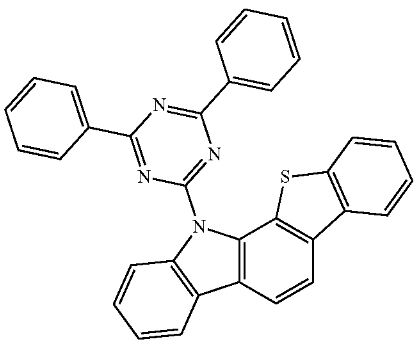
,
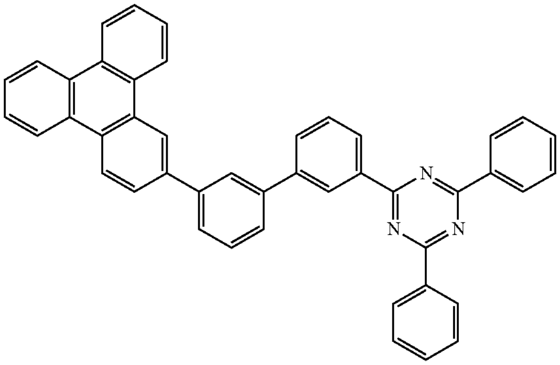
,
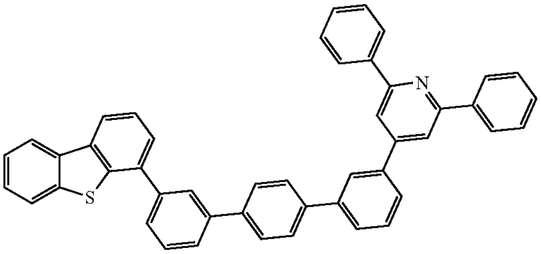
,
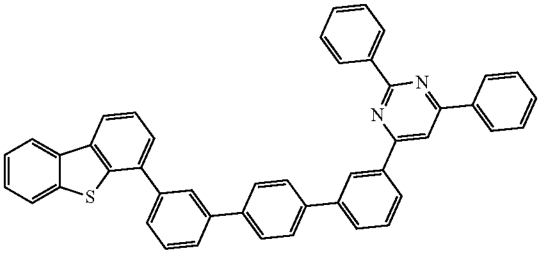
,
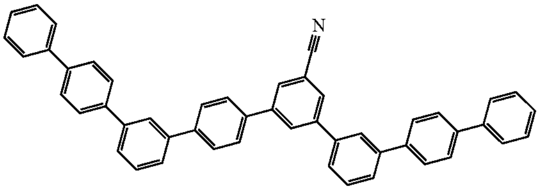
,
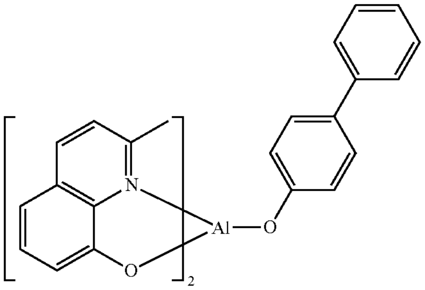
-continued
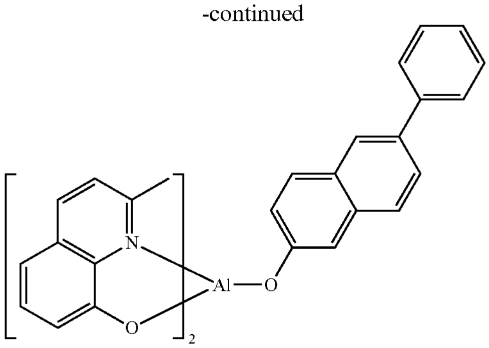
,
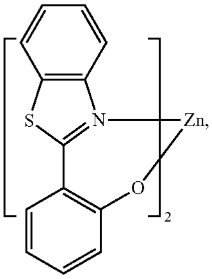
,
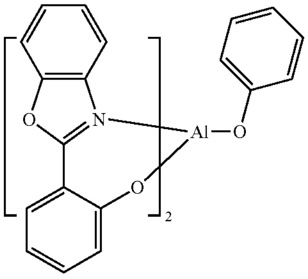
,
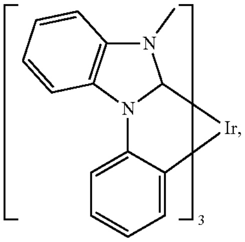
,
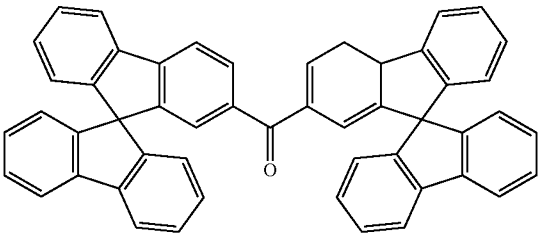
,
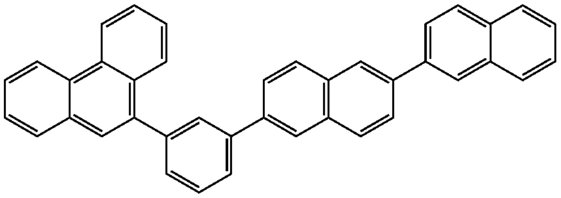
,
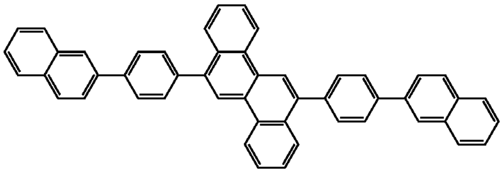
, and -continued

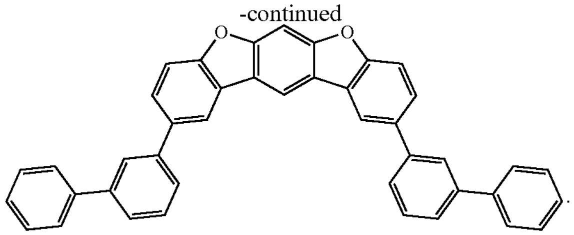

Additional Emitters

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

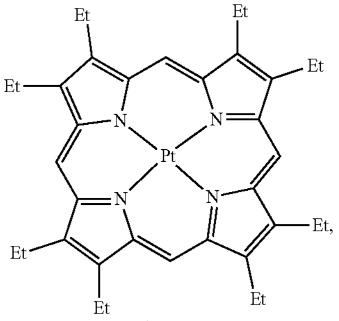

,

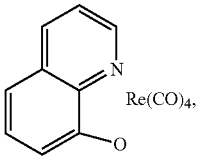

,

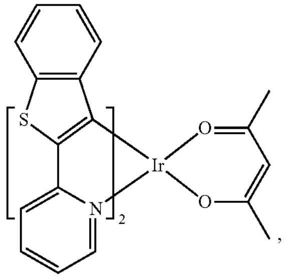

,

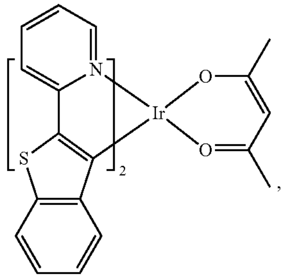

,

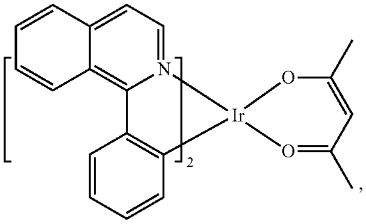

,

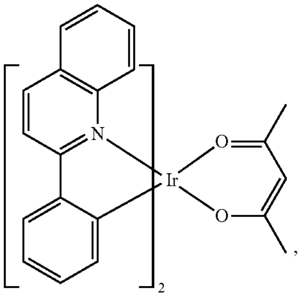

,

-continued
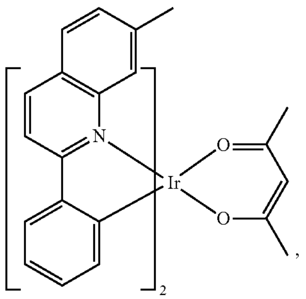
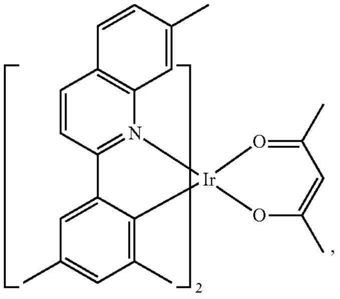
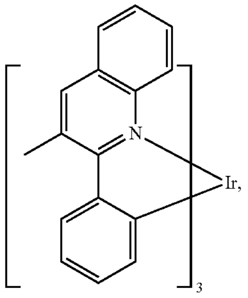
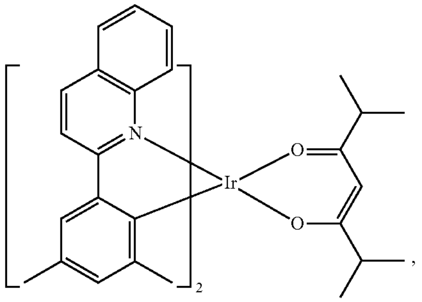
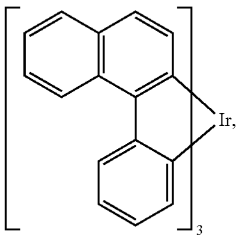
-continued
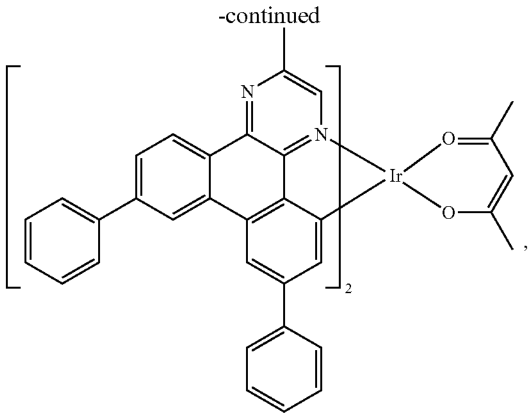
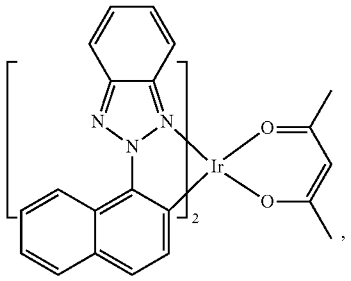
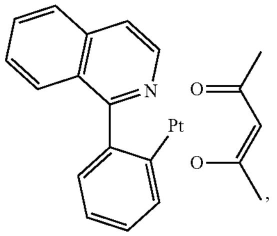
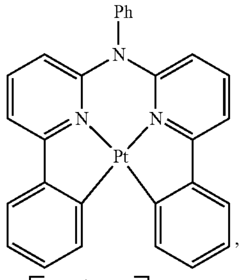
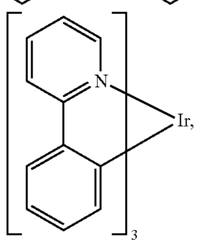

-continued
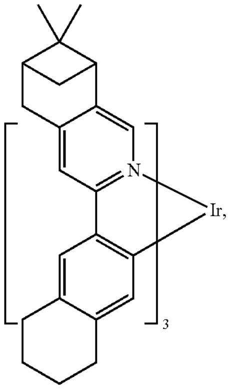
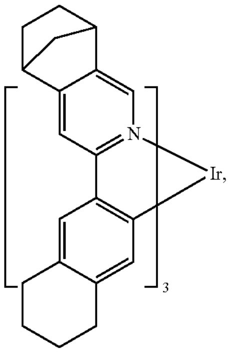
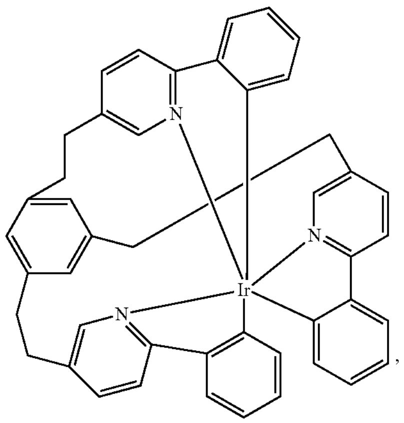
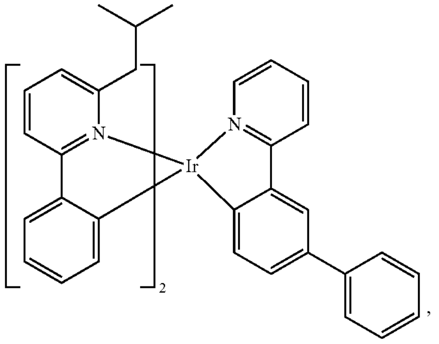
-continued
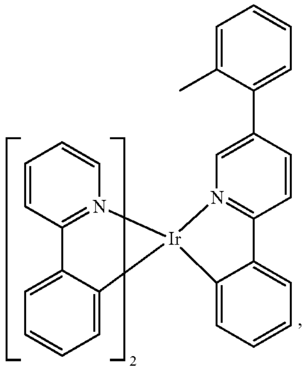
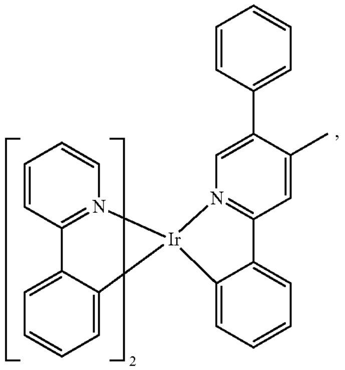
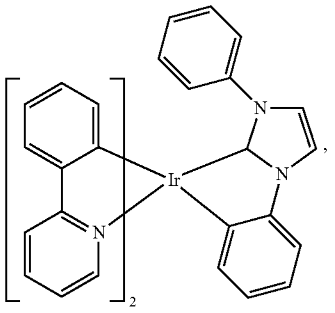
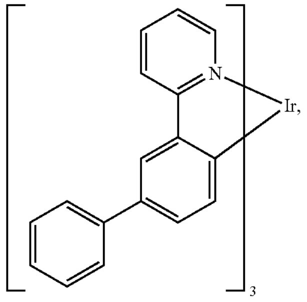
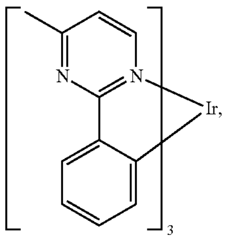

-continued
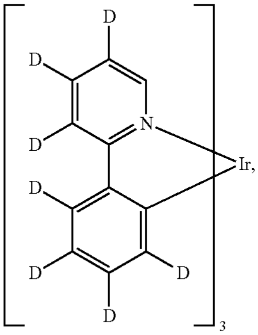
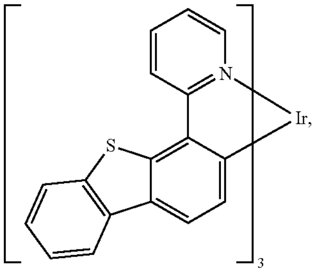
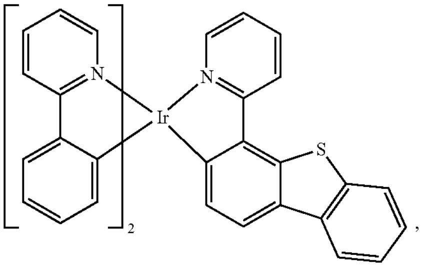
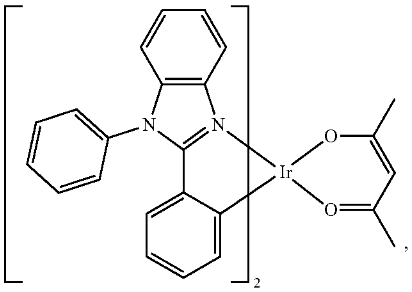
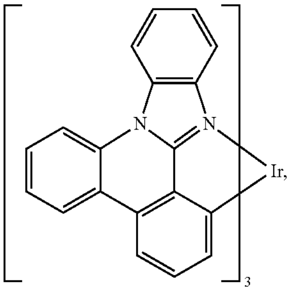
-continued
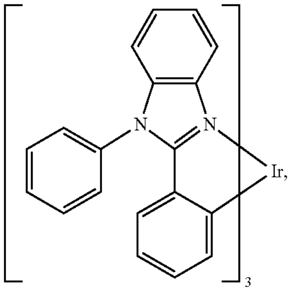
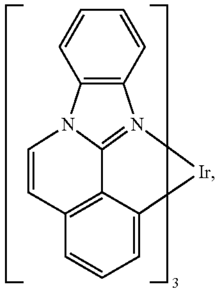
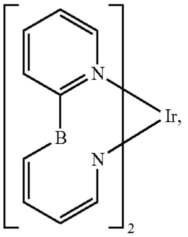
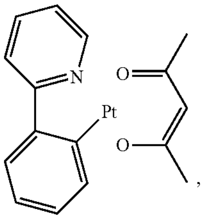
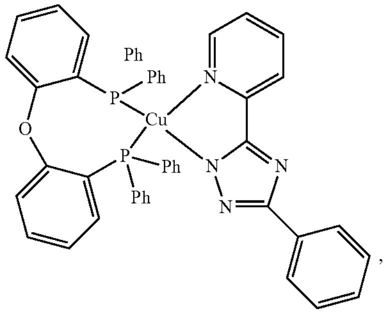
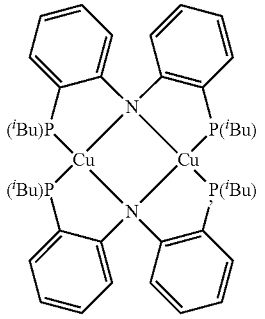

-continued
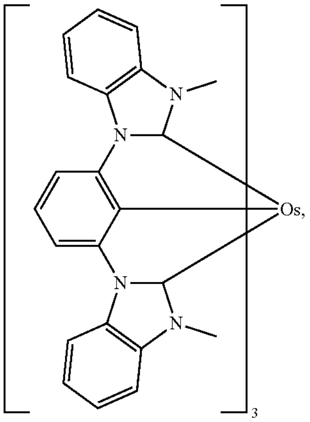
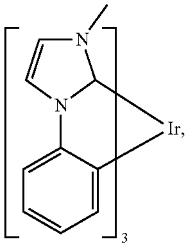
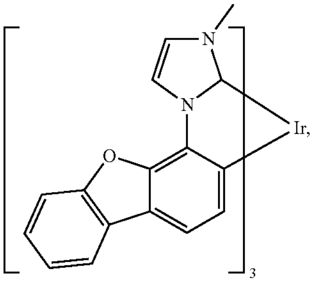
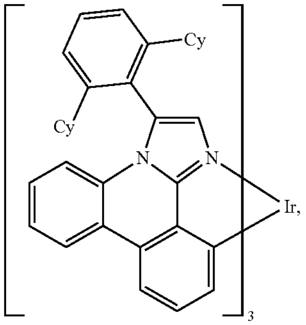
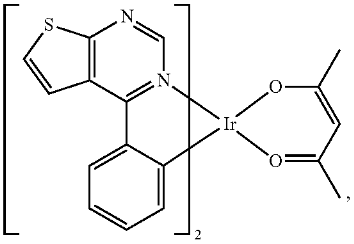
-continued
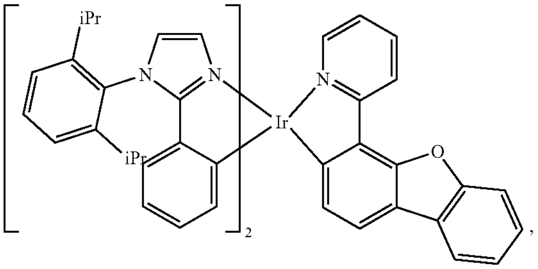
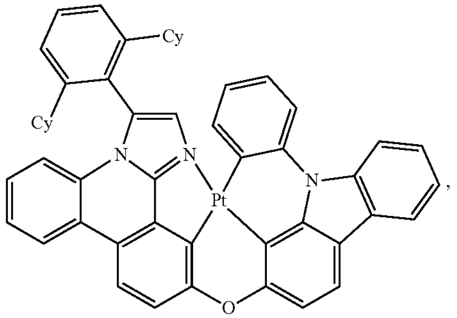
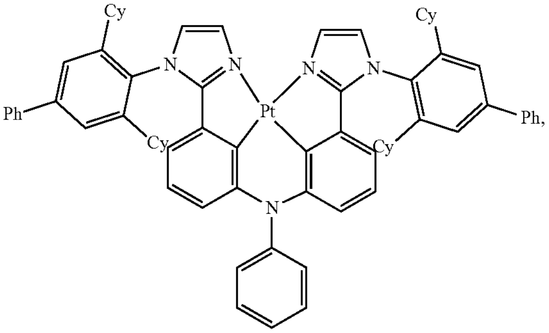
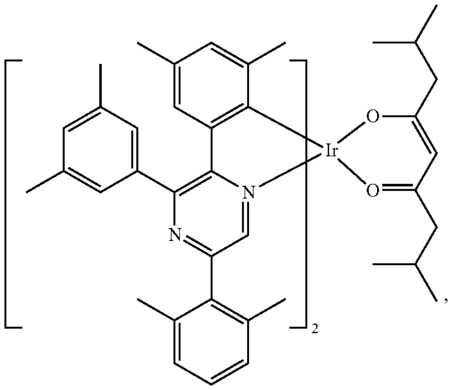
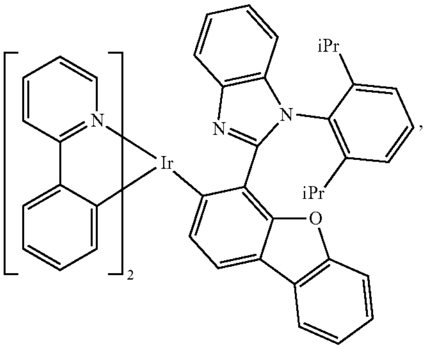

-continued
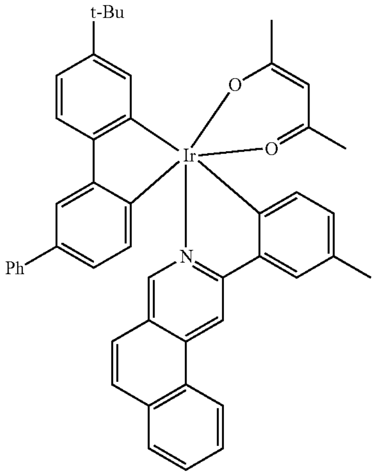
,
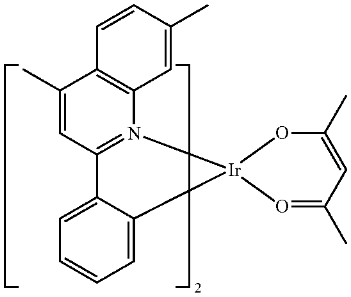
,
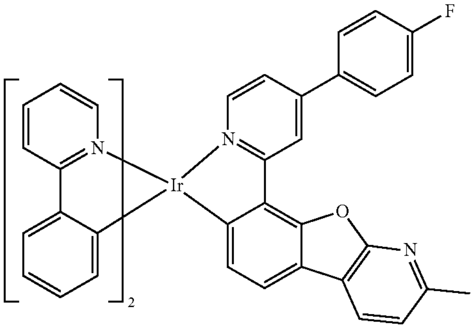
,
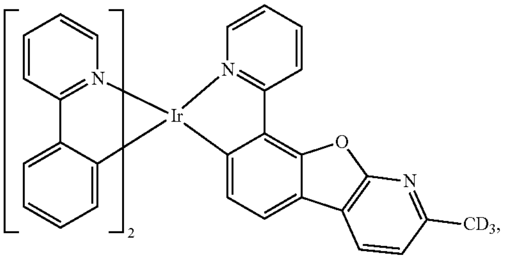
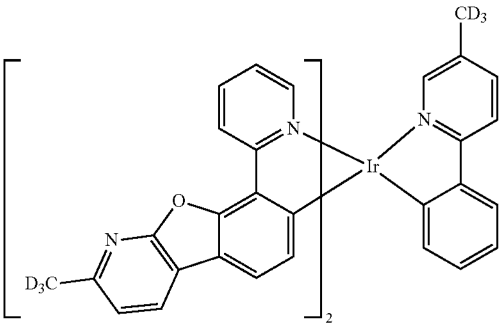
,
-continued
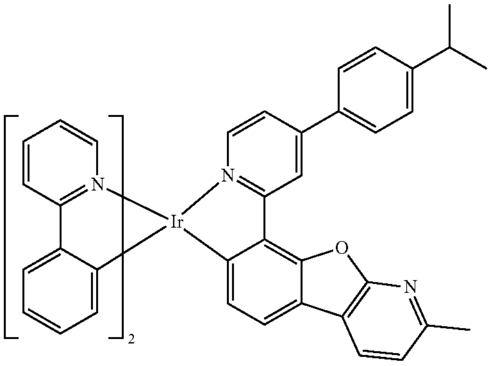
,
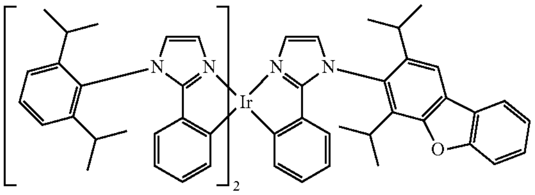
,
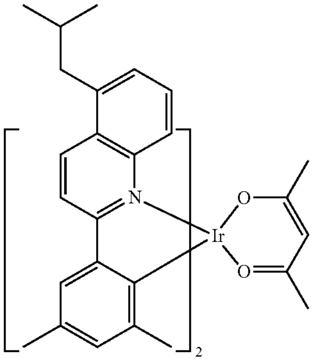
,
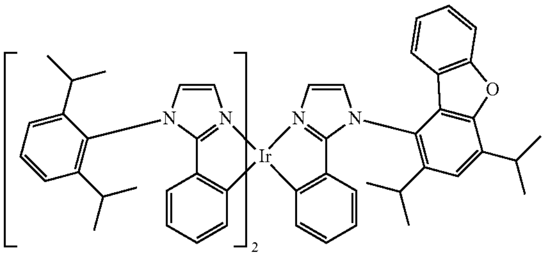
,
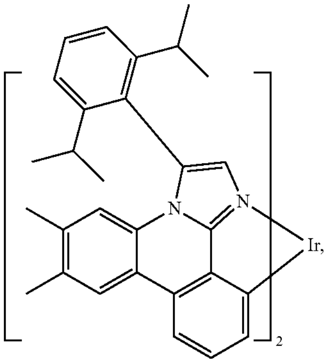

-continued
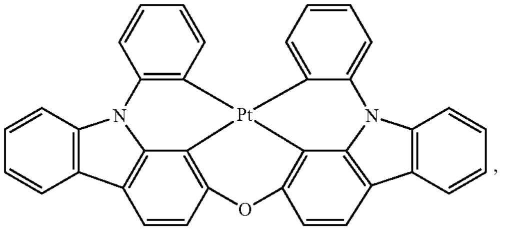
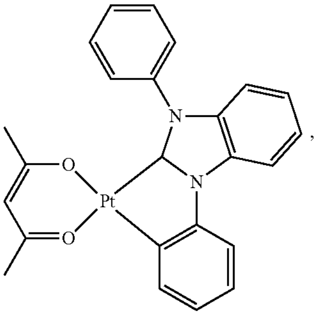
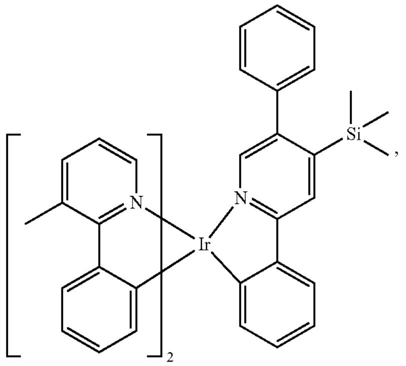
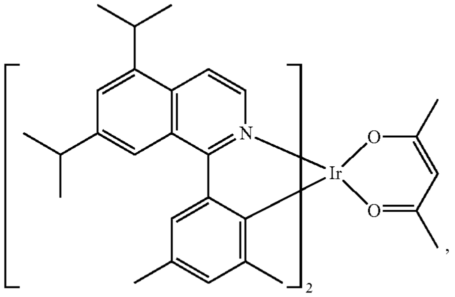
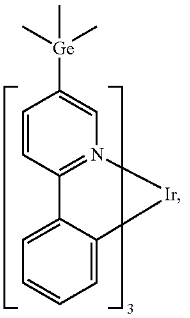
-continued
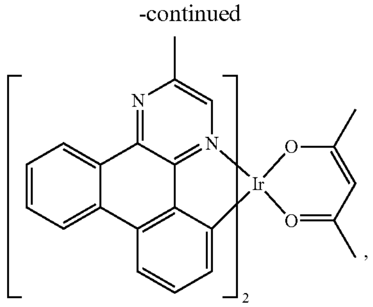
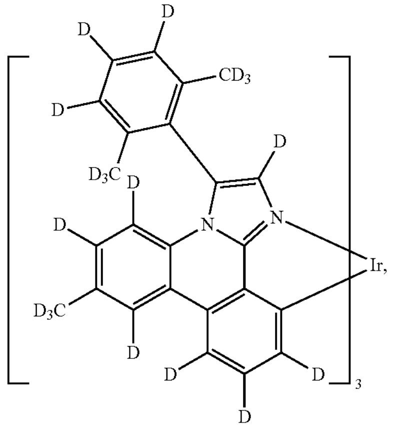
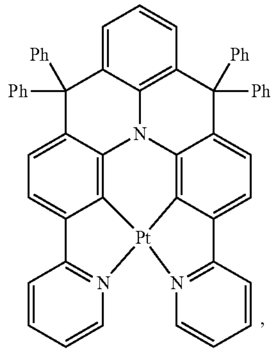
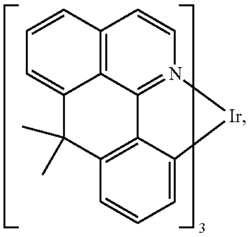
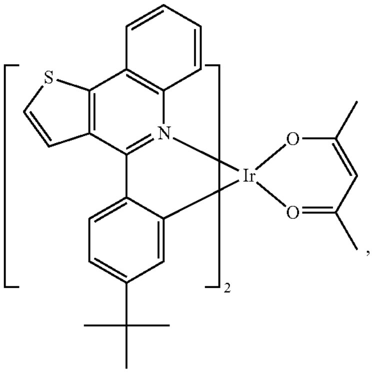

-continued
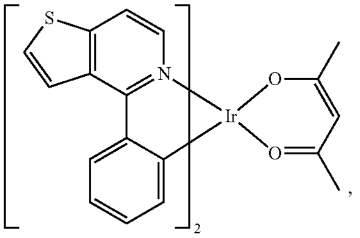
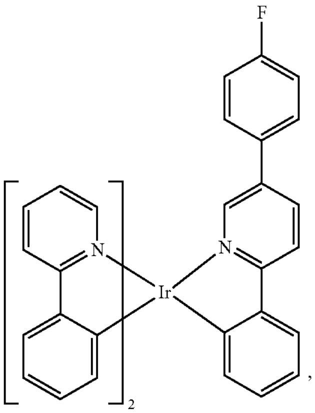
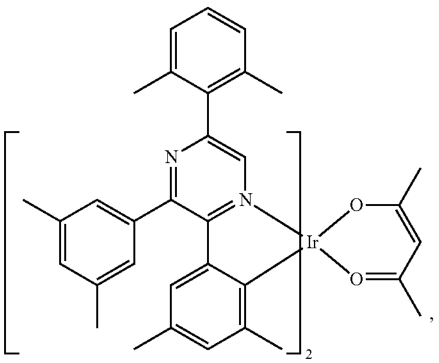
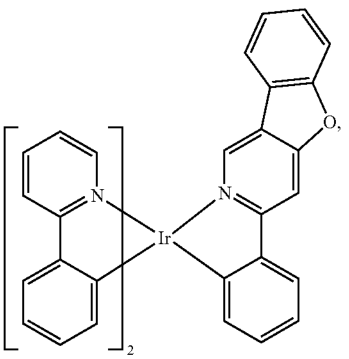
-continued
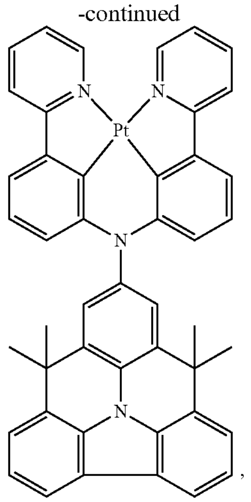
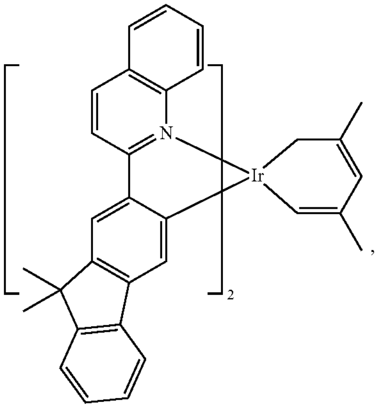
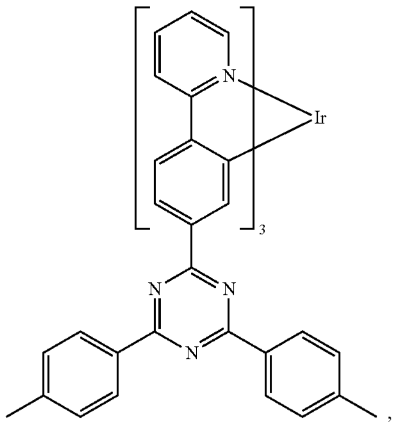
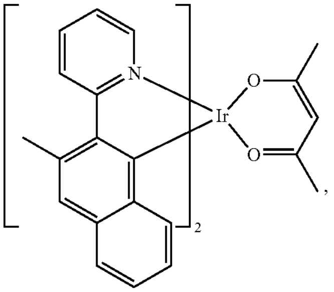

-continued
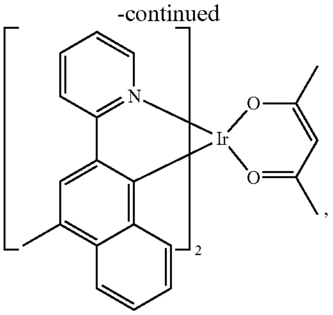
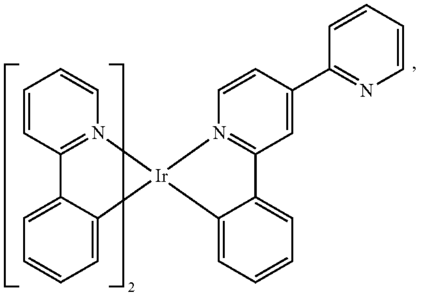
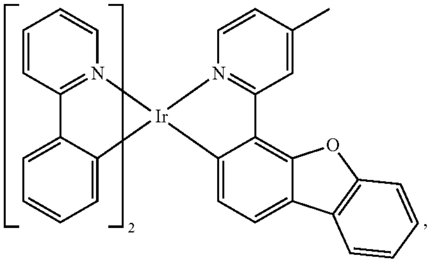
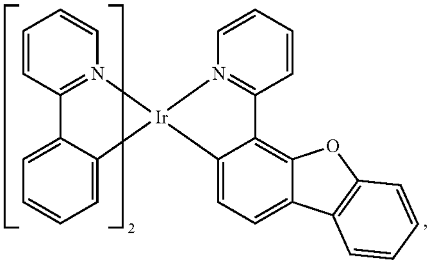
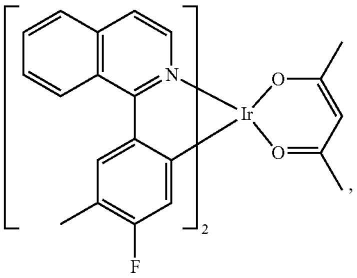
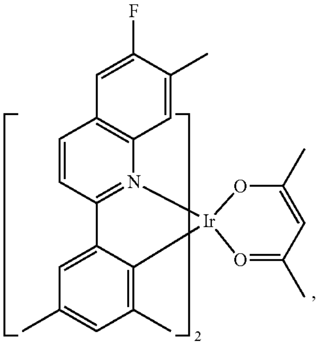
-continued
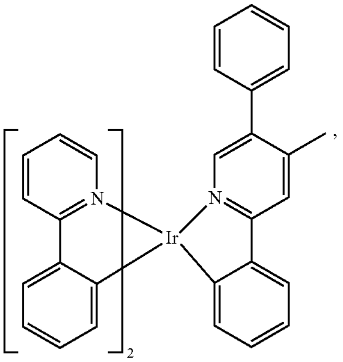
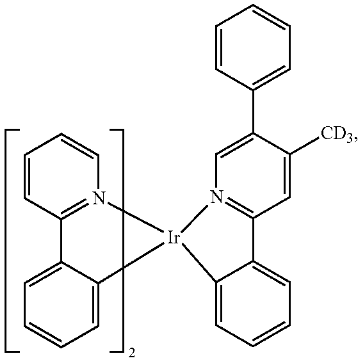
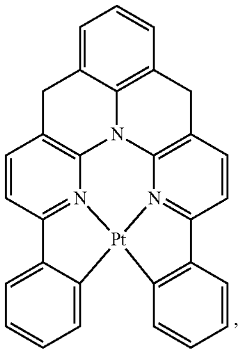
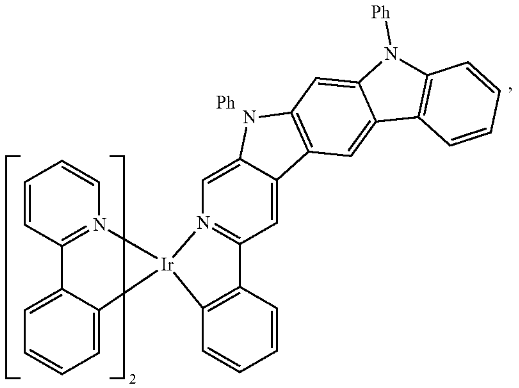

-continued
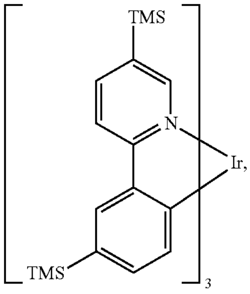
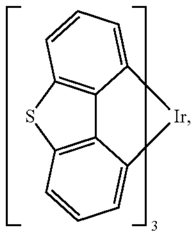
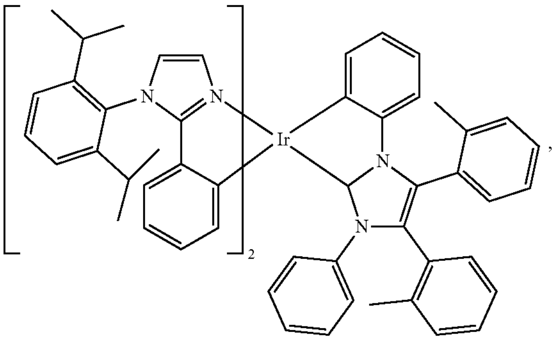
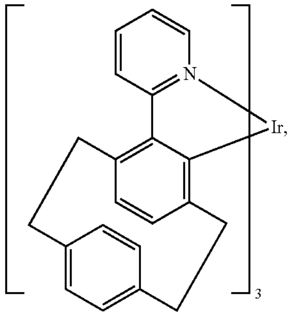
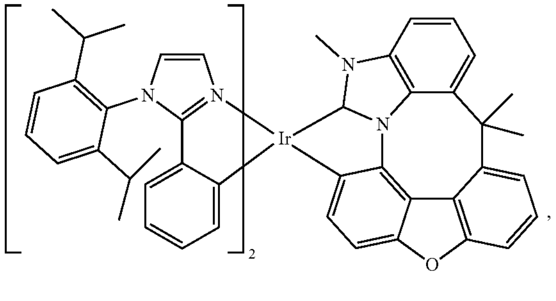
-continued
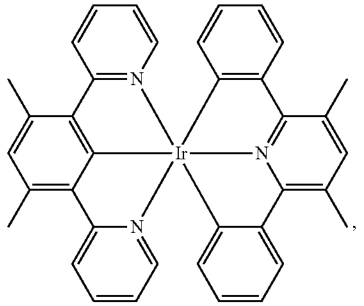
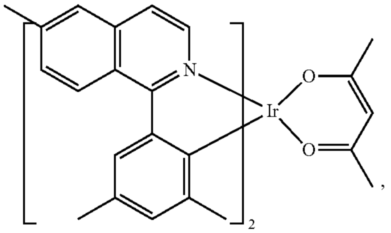
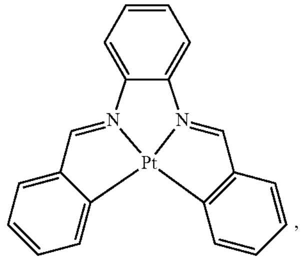
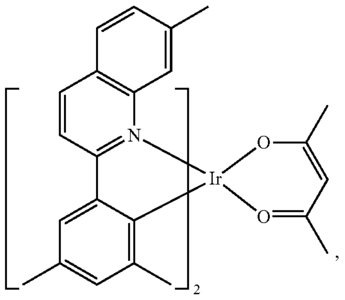
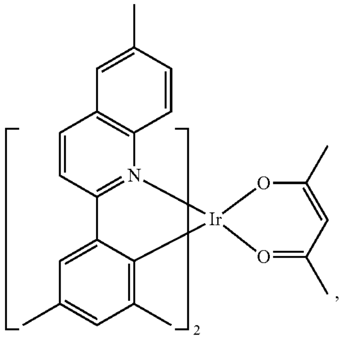
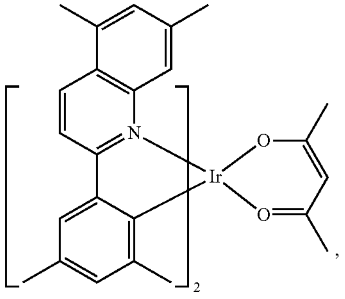

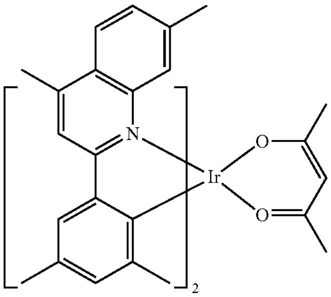
,
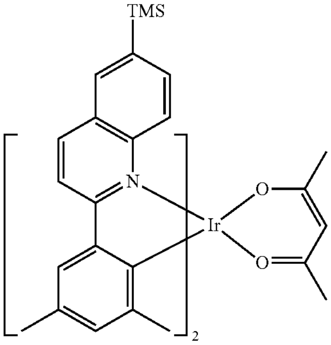
,
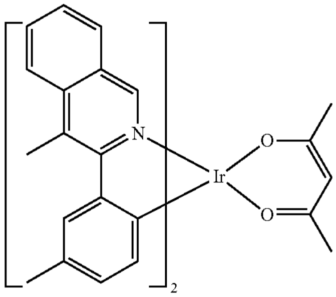
,
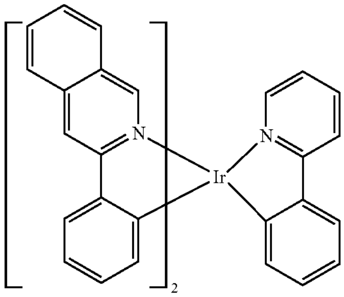
,
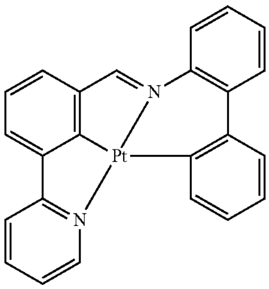
,
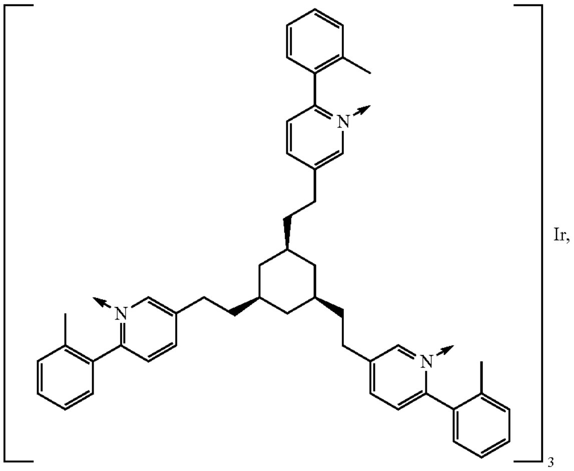
,
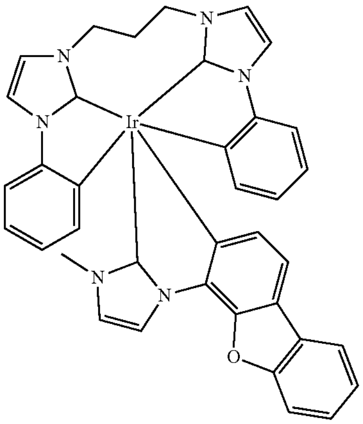
,
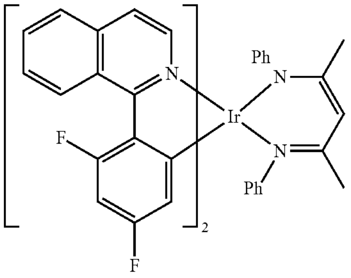
,
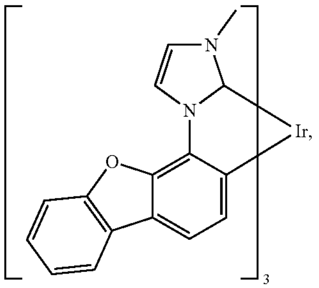
, -continued
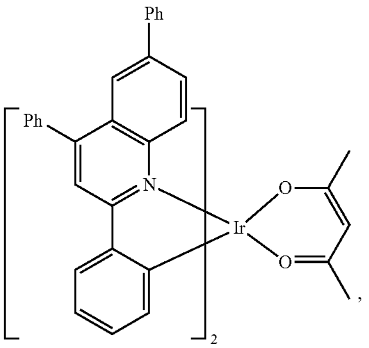
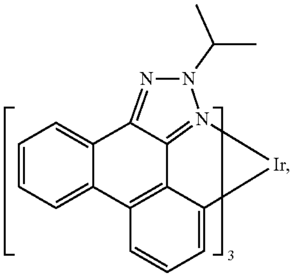
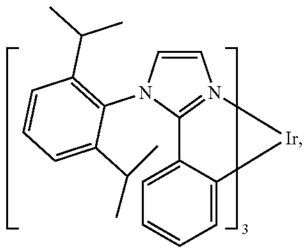
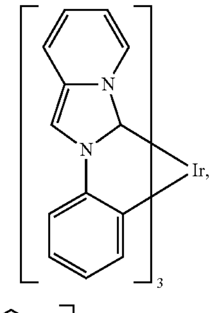
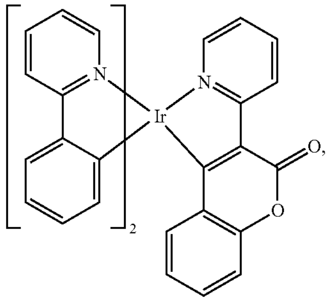
-continued
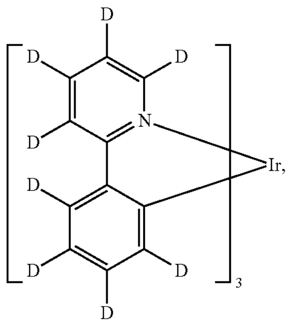
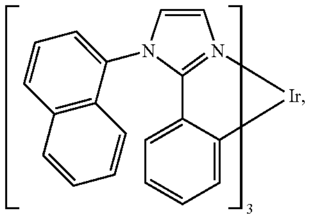
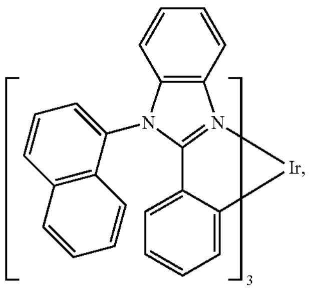
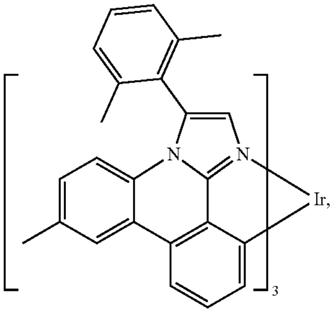
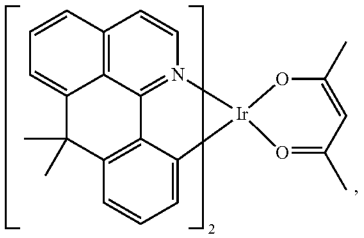
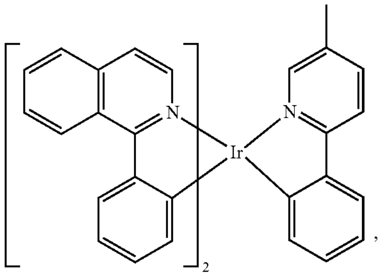

-continued

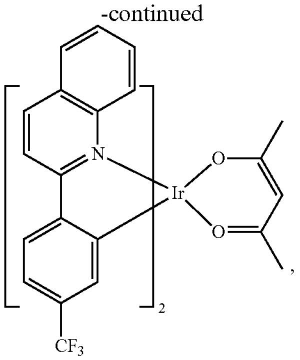

,

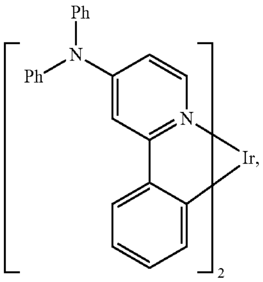

and

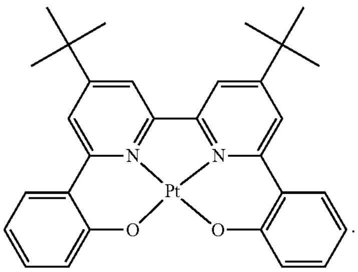

.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

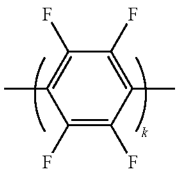

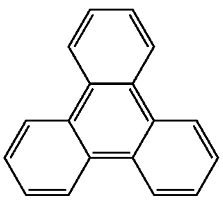

-continued

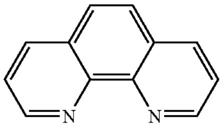

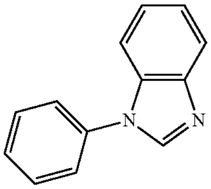

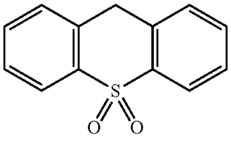

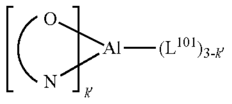

wherein k is an integer from 1 to 20; $L^{101}$ is an another ligand, k' is an integer from 1 to 3.

ETL

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

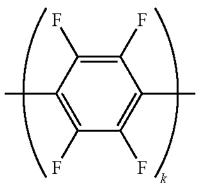

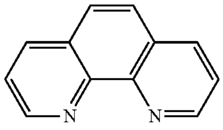

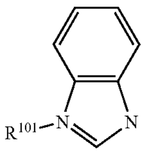

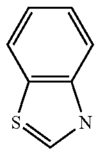

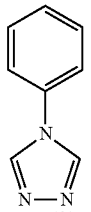

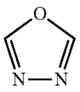

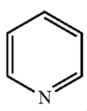

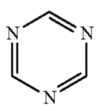

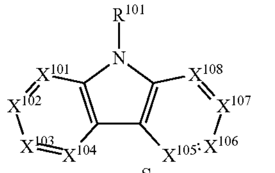

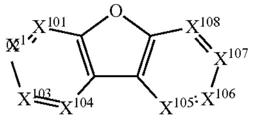

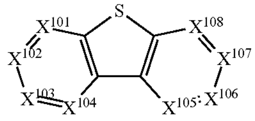

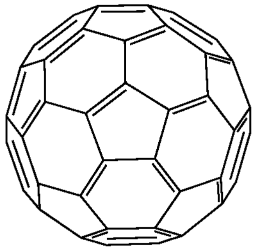

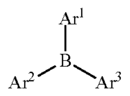

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, eteroa ryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

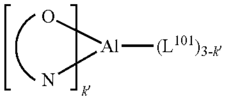

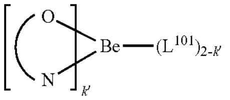

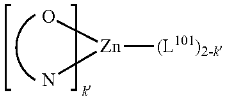

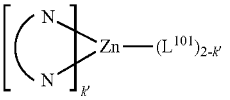

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EPO1602648, EPO1734038, EPO1956007, JP2004-022334, JP2005149918, JP2005-268199, KR0117693, KR20130108183, US20040036077, US20070104977, US2007018155, US20090101870, US200901 15316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

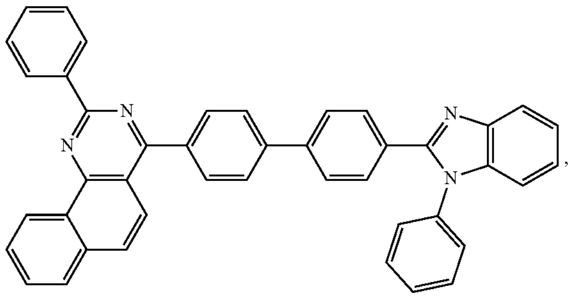

-continued

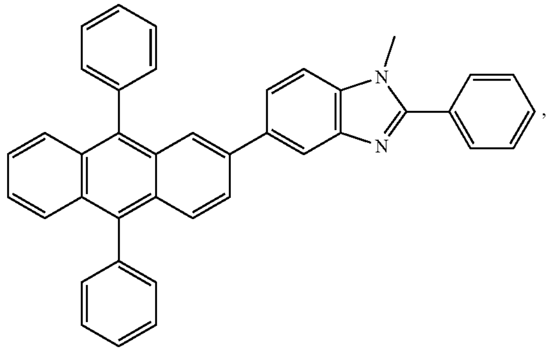

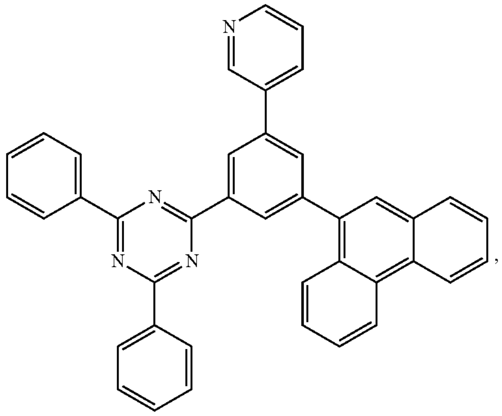

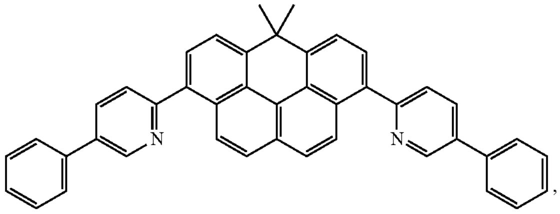

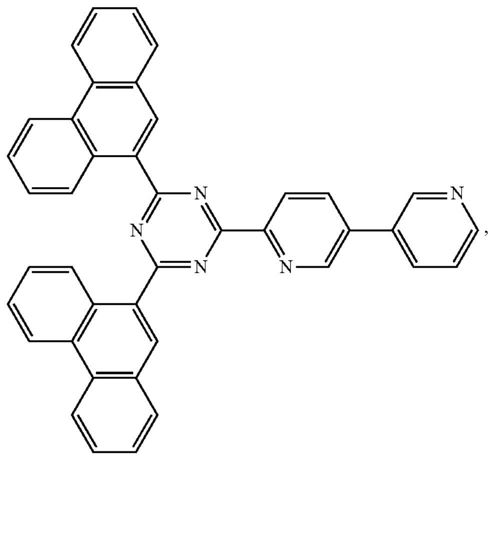

-continued
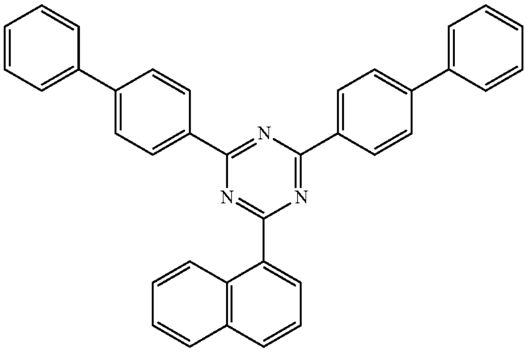
,
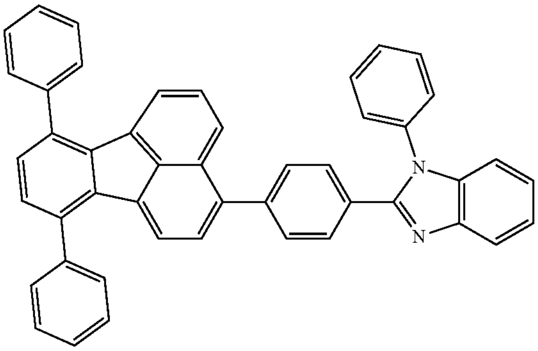
,
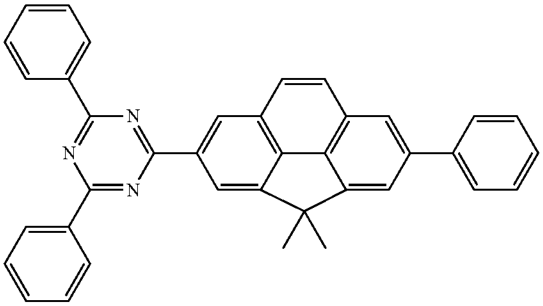
,
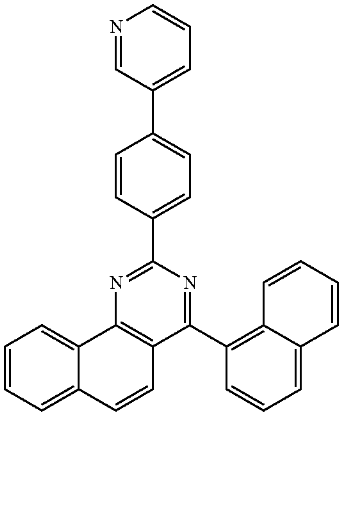
,
-continued
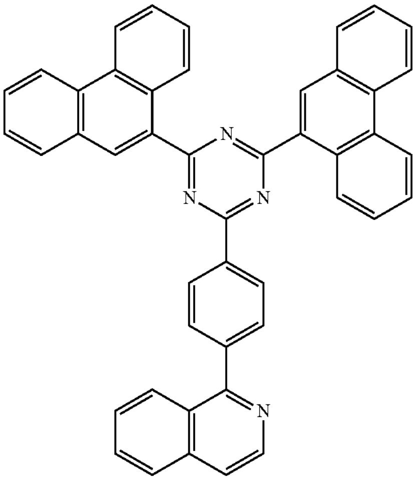
,
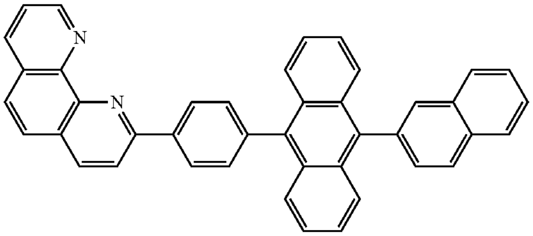
,
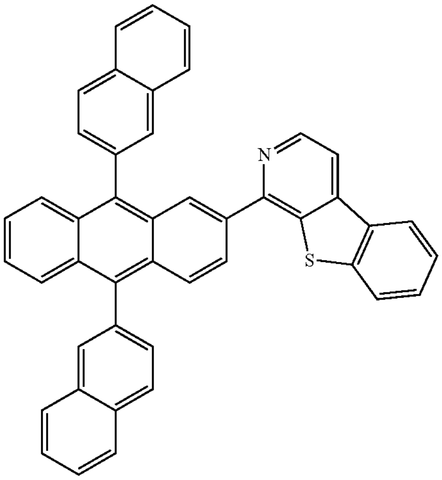
,
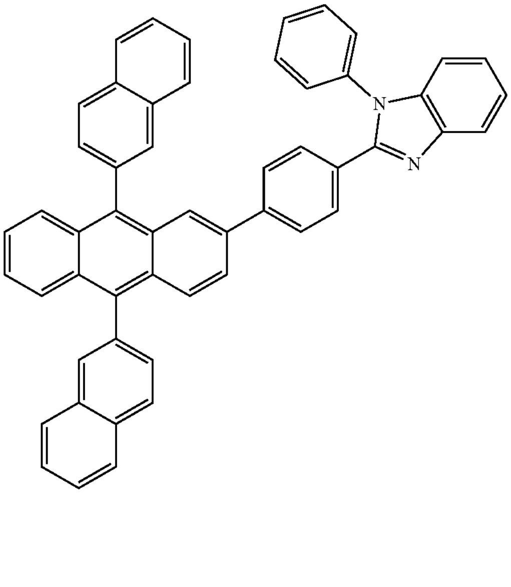
, -continued
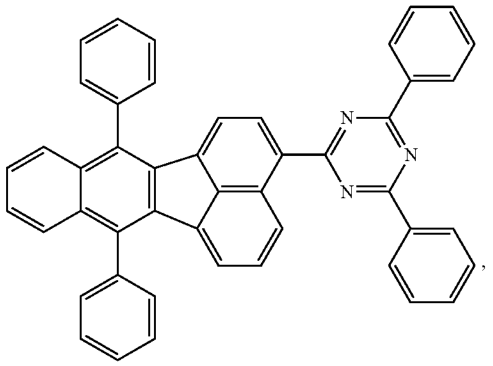
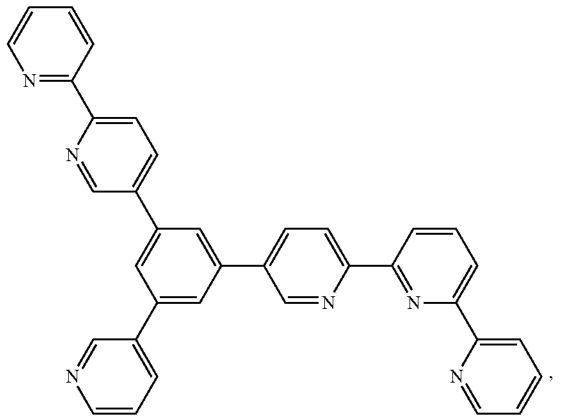
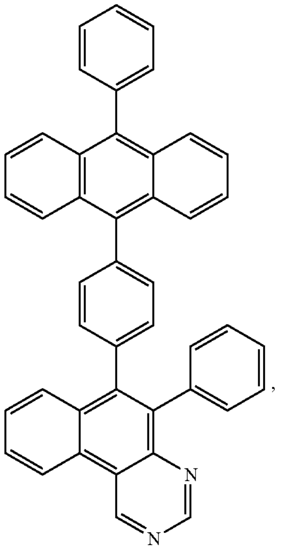
-continued
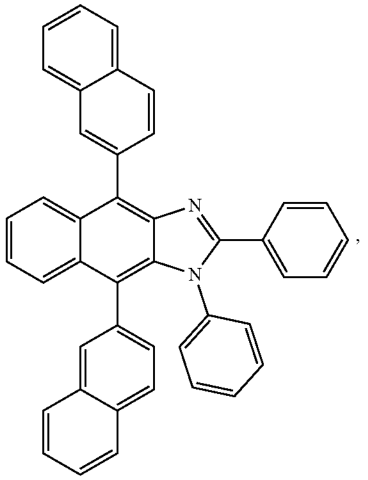
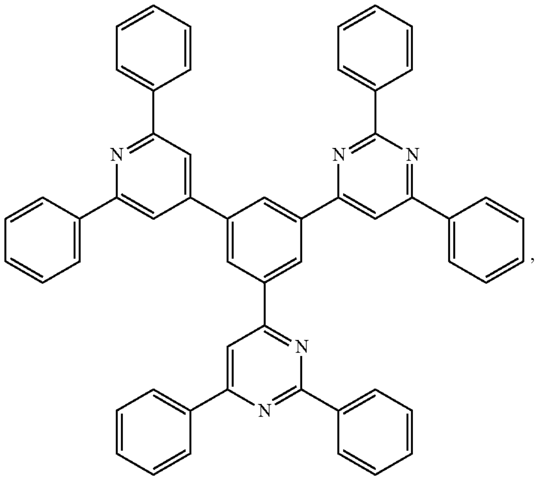
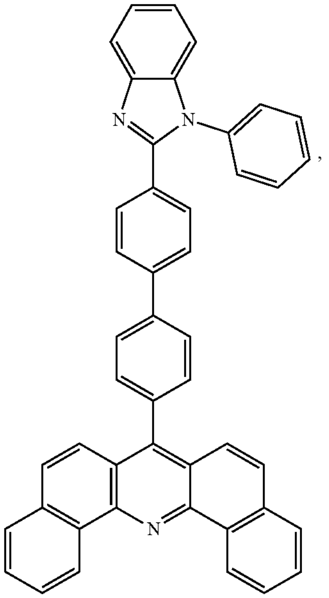

-continued
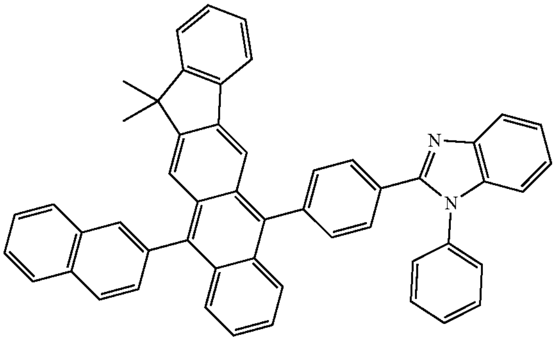
,
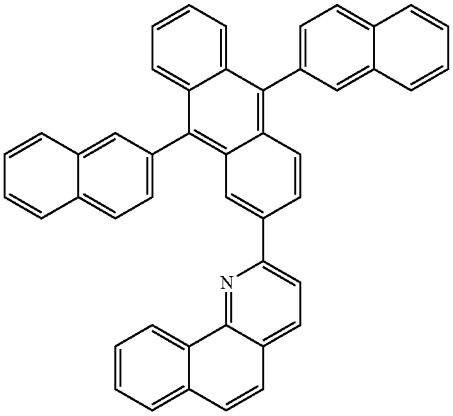
,
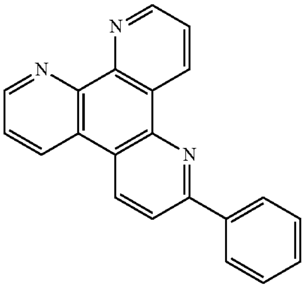
,
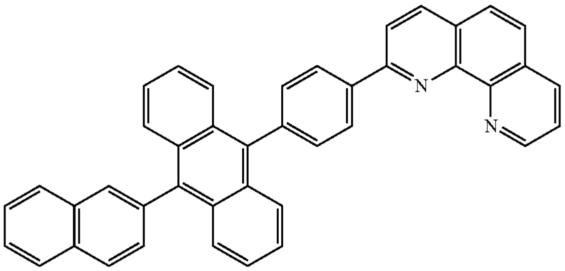
,
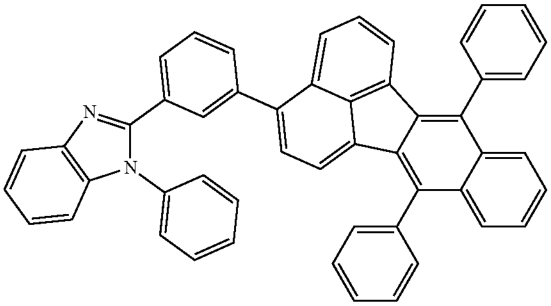
,
-continued
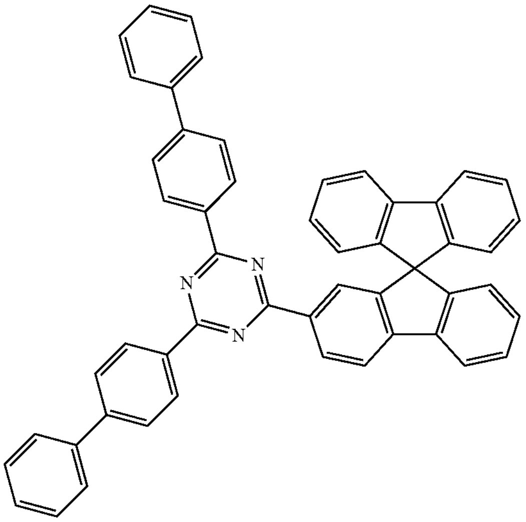
,
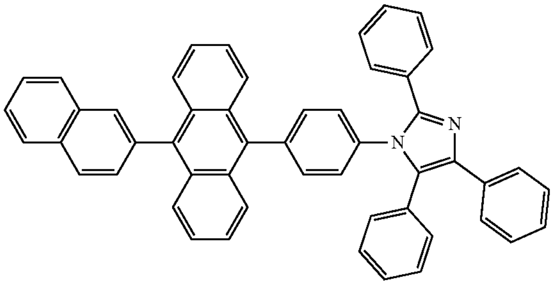
,
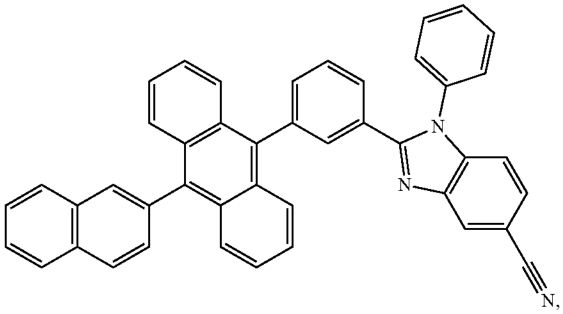
,
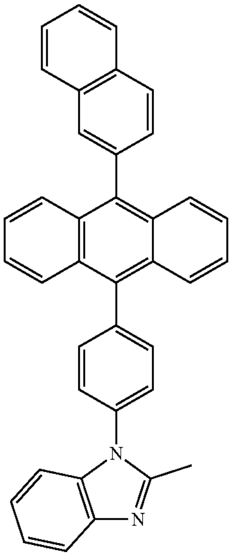
, -continued

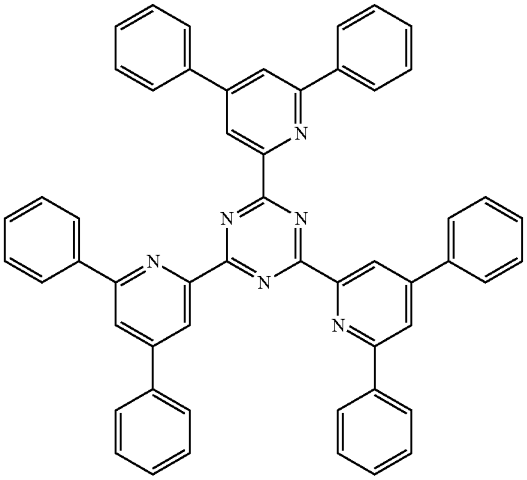

,

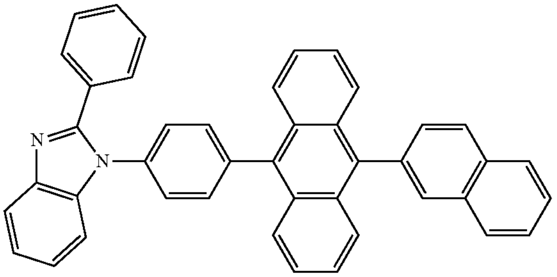

,

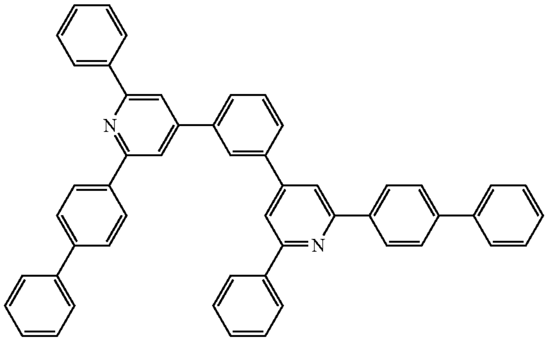

,

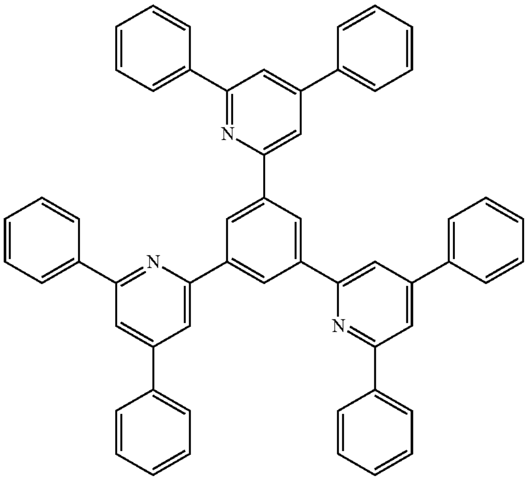

,

-continued

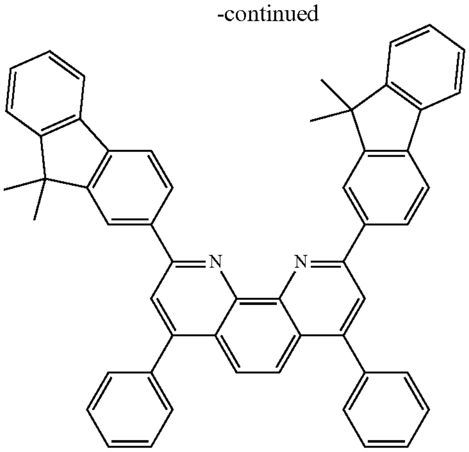

, and

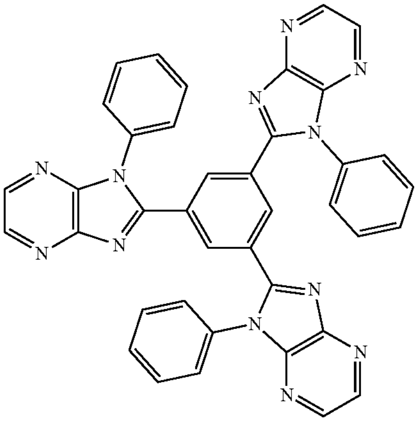

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

1. Synthesis of (MAAC*)CuCl (1a)

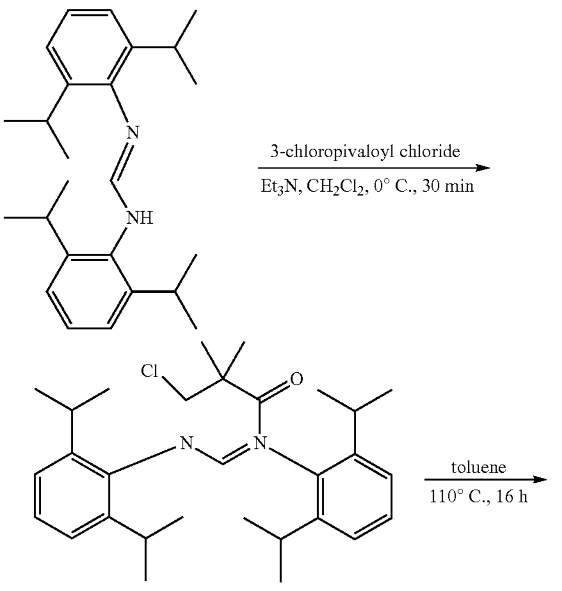

1c

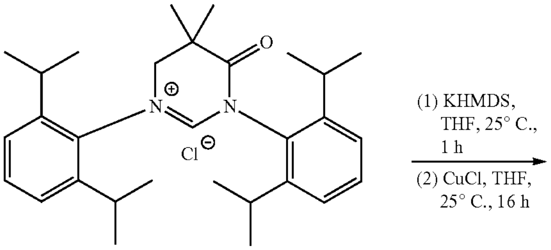

(MAAC*)Cl (1b)

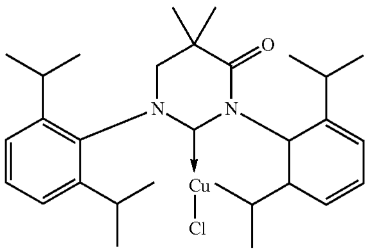

(MAAC*)CuCl (1a)

3-Chloro-N-(2,6-diisopropylphenyl)-N'-((2,6-diisopropylphenylimino)methyl)-2,2-dimethylpropanamide (1*c*). N,N'-bis(2,6-diisopropylphenyl) formamidine (500 mg, 1.37 mmol) and triethylamine (287 mL, 2.06 mmol) were dissolved in dichloromethane (20 mL) and stirred at 0° C. for 10 min, after which 3-chloropivaloyl chloride (0.195 mL, 1.51 mmol) was added dropwise. The solution mixture was stirred for 3 h at 0° C. The solvent was removed under reduced pressure to afford a white powder, which was extracted with toluene and filtered through Celite. Removal of the residual solvent afforded the product as a white solid. Yield: 650 mg (98%).

1,3-bis(2,6-diisopropylphenyl)-5,5-dimethyl-4-keto-tetrahydropyrimidin-1-ium chloride (1b). 1c (650 mg, 1.34 mmol) was dissolved in toluene (20 mL) and the solution was refluxed for 16 h at 110° C. during which a white precipitate formed. The reaction mixture was cooled to RT and the white precipitate was collected by vacuum filtration and washed with cold toluene. Yield: 450 mg (69%).

(N,N'-bis(diisopropylphenyl)-5,5-dimethyl-4-keto-tetrahydropyrimidin-2-ylidene)-Cu(I) chloride (MAAC*CuCl) (1a). KHMDS (136 mg, 0.68 mmol) was added to a THF solution (20 mL) of 1b (300 mg, 0.62 mmol) at RT and the solution was stirred for 1 h before CuCl (67 mg, 0.68 mmol) was added. The reaction mixture was stirred at RT for 16 h, filtered through Celite and the solvent was concentrated to 3 mL under reduced pressure. Hexane (20 mL) was added to the solution and a white precipitate formed. Yield: 300 mg (88%).

2. Synthesis of [(DAC*)Cu]$_2$Cl$_2$ (2a)

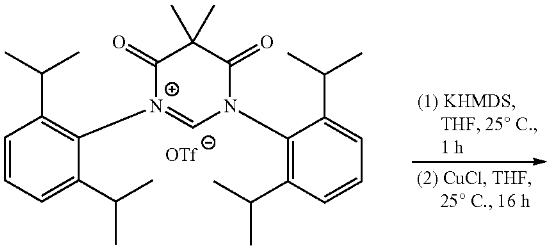

(DAC*)OTf (2b)

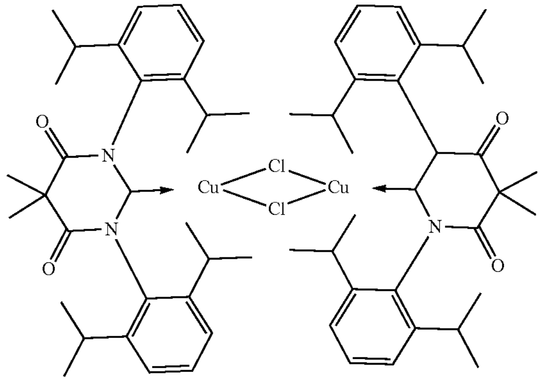

[(DAC*)Cu]$_2$Cl$_2$ (2a)

KHMDS (450 mg, 2.28 mmol) was added to a THF solution (20 mL) of 2b (1.39 g, 2.28 mmol) at RT and the solution was stirred for 1 h before CuCl (230 mg, 2.28 mmol) was added. The reaction mixture was stirred at RT for 16 h. The solvent was evaporated under reduced pressure, and the obtained red solid was re-dissolved in toluene (20 mL) and filtered through Celite. The filtrate was concentrated to 3 mL under reduced pressure. Hexane (20 mL) was added to the solution and a red precipitate formed. Yield: 400 mg (31%).

3. Synthesis of compounds 1-5

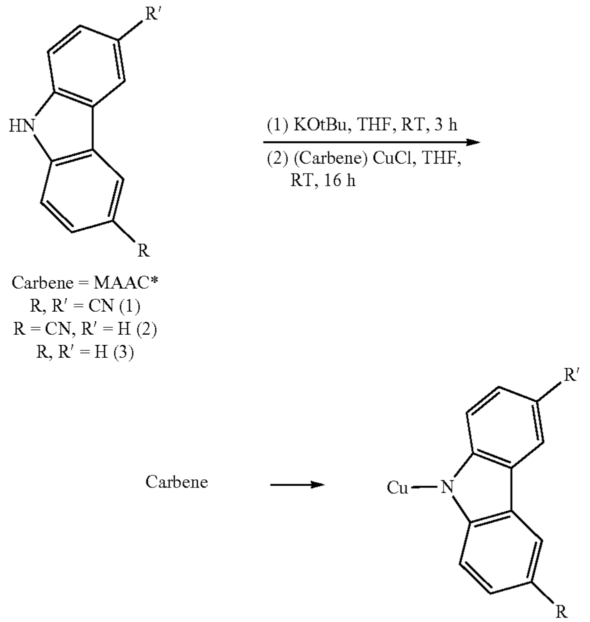

Carbene = MAAC*
R, R' = CN (1)
R = CN, R' = H (2)
R, R' = H (3)

Carbene = DAC*
R = CN, R' = H (4)
R, R' = H (5)

General procedure. Carbazole ligand and NaO'Bu were dissolved in THF and stirred for 3 h at RT. (carbene)CuCl was added to the reaction mixture and stirred for 16 h. The resulting mixture was filtered through Celite and the solvent was removed under reduced pressure to afford a solid. The solid was re-dissolved in dichloromethane and hexane was added to precipitate out the desired product.

(MAAC*)Cu($CzCN_2$) (1). The compound was made from (MAAC*)CuCl (160 mg, 0.29 mmol), $CzCN_2$ (64 mg, 0.29 mmol) and NaO'Bu (29 mg, 0.30 mmol) as a white solid. Yield: 168 mg (85%).

(MAAC*)Cu(CzCN) (2). The compound was made from (MAAC*)CuCl (200 mg, 0.37 mmol), CzCN (71 mg, 0.37 mmol) and NaO'Bu (36 mg, 0.37 mmol) as a white solid. Yield: 200 mg (78%).

(MAAC*)Cu(Cz) (3). The compound was made from (MAAC*)CuCl (2.0 g, 3.67 mmol), Cz (613 mg, 3.67 mmol) and NaO'Bu (353 mg, 3.67 mmol) as a yellow solid. Yield: 2.1 g (85%).

(DAC*)Cu(CzCN) (4). The compound was made from (DAC*)CuCl (200 mg, 0.36 mmol), CzCN (69 mg, 0.36 mmol) and NaO'Bu (35 mg, 0.36 mmol) as an orange solid. Yield: 200 mg (76%).

(DAC*)Cu(Cz) (5). The compound was made from (DAC*)CuCl (100 mg, 0.18 mmol), Cz (30 mg, 0.18 mmol) and NaO'Bu (18 mg, 0.19 mmol) as a purple solid. The compound was extremely air-sensitive.

($CAAC^{Men}$Cu($NPh_2$) (9). The compound was made from ($CAAC^{Men}$)CuCl (950 mg, 1.98 mmol), $HNPh_2$ (351 mg, 2.08 mmol) and NaO'Bu (200 mg, 2.08 mmol) as a bright yellow solid. Yield: 1.1 g (93%). The compound is exceedingly sensitive to moisture, especially in solution.

($CAAC^{Ad}$Cu($Me_2Cz$) (10b). The compound was made from ($CAAC^{Ad}$)CuCl(250 mg, 0.52 mmol), $Me_2Cz$ (109 mg, 0.52 mmol) and KOBu (59 mg, 0.53 mmol) as a pale yellow solid. The solid was washed with ether, extracted with toluene, then washed with pentane. Yield: 311 mg (93%). The compound is exceedingly sensitive to moisture, especially in solution.

(BzI-Cu(Cz) (11). The compound was made from (BzI)CuCl (120 mg, 0.22 mmol), Cz (39 mg, 0.23 mmol) and NaO'Bu (23 mg, 0.23 mmol) as a white solid. Yield: 135 mg (90.5%).

Scheme

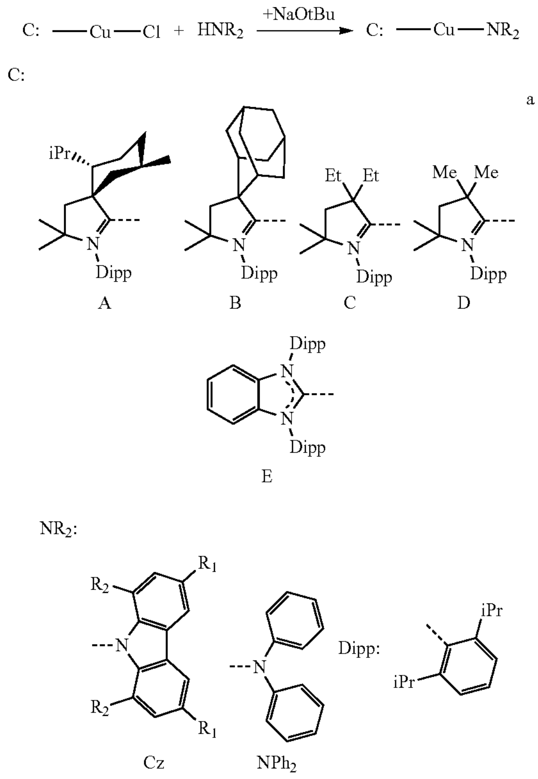

A-D: CAAC
E: Bzl

| | carbene | $NR_2$ |
|---|---|---|
| 6a | A | Cz ($R_1$, $R_2$ = H) |
| 6b | B | Cz ($R_1$, $R_2$ = H) |
| 6c | C | Cz ($R_1$, $R_2$ = H) |
| 6d | D | Cz ($R_1$, $R_2$ = H) |
| 10b | B | Cz ($R_1$ = H, $R_2$ = Me) |
| 7 | A | Cz ($R_1$ = CN, $R_2$ = H) |
| 8 | A | Cz ($R_1$ = OMe, $R_2$ = H) |
| 9 | A | $NPh_2$ |
| 11 | E | Cz ($R_1$, $R_2$ = H) |

(MAAC*)CuCz (3) based green OLED devices

Figure 15:
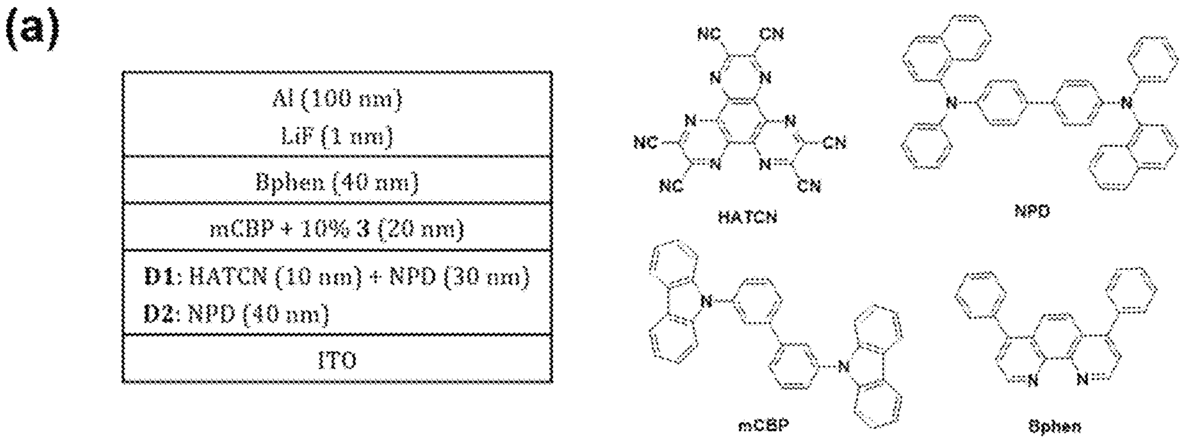
FIG. 15. OLED architecture and the molecular structures of the compounds used in Device 1 (D1) and Device 2 (D2). D1 includes HATCN as hole-injecting layer (HIL) and NPD as hole-transport layer (HTL). D2 has the same layer structure as D1 except no HATCN HIL.
Figure 16:
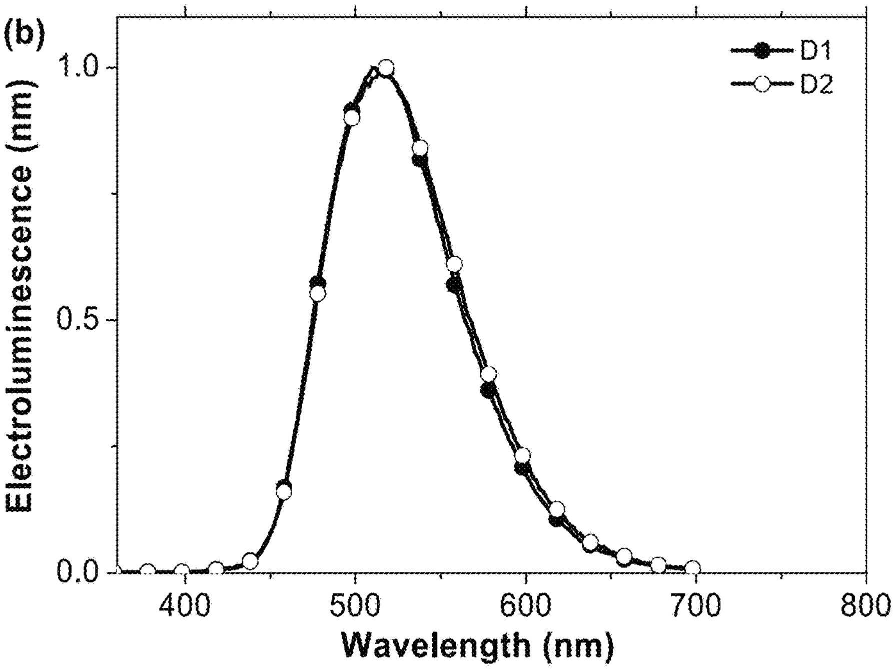
FIG. 16. Electroluminescent spectra for D1 and D2.

Devices 1 and 2. Device 1 is fabricated using HATCN as hole injecting layer (HIL) and NPD as hole-transporting layer (HTL), FIG. 15*a*. The emissive layer (EML) includes 10 wt. % of compound 3 doped in mCBP host. Bphen was used for hole-blocking (HBL) and electron transporting (ETL). Device 2 has a similar structure as device 1 except that the hole injecting layer, HATCN, is absent. The electroluminescence spectra are consistent with the photoluminescent spectra, FIG. 16. The maximum external quantum efficiency (EQE) of the two devices are ~6% even though the internal quantum efficiency is 100%. This is likely due to the lower triplet energy of NPD (2.30 eV) than that of the dopant (2.75 eV). Therefore, HTL with higher triplet energy or exciton blocking layer between HTL and EML is needed to prevent exciton leaking into HTL.

Figure 17A:
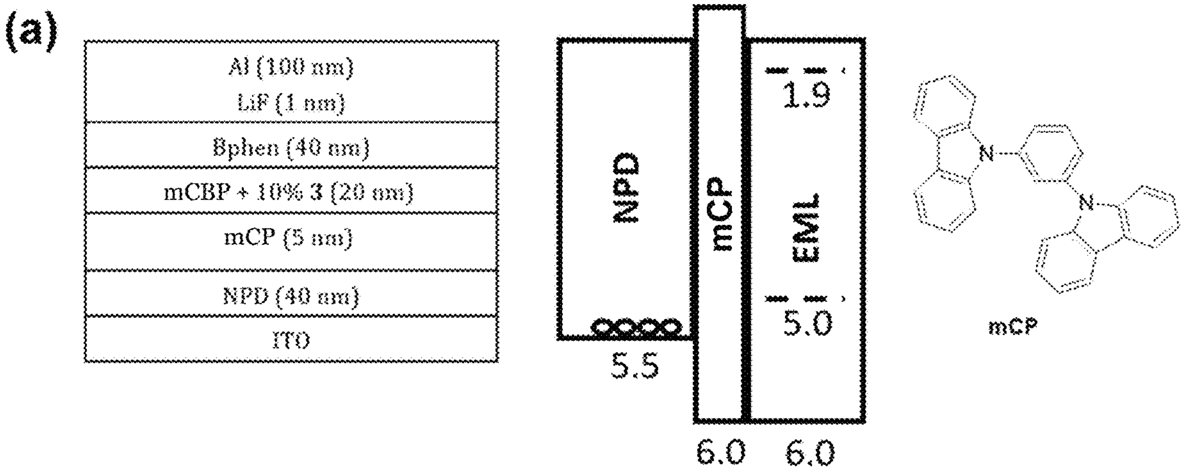
FIG. 17*a*. OLED architecture and the molecular structures of the compounds used in Device 3 (D3).
Figure 17B:
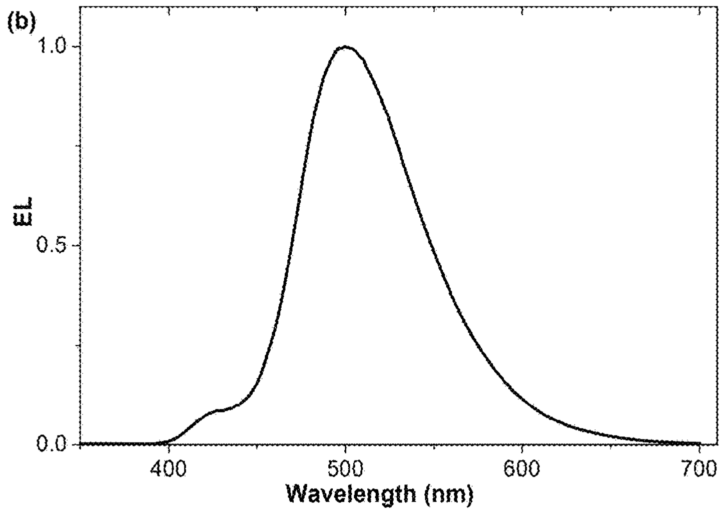
FIG. 17*b*. Electroluminescent spectra of D3.

Device 3. mCP ($E_T$=2.90 eV) is used as an exciton blocking layer between HTL and EML, FIG. 17*a*. There is an extra peak in the EL at ~420 nm which is attributed to NPD emission, FIG. 17*b*. This occurred due to the deep HOMO (6.0 eV) of mCP that slowed down the hole-transporting rate which leads to charge recombination in NPD layer.

Figure 18A:
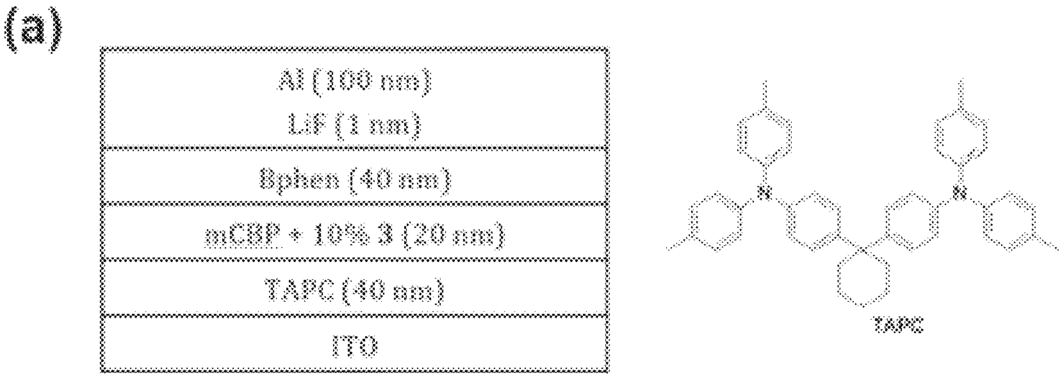
FIG. 18*a*. OLED architecture and the molecular structures of the compounds used in Device 4 (D4).
Figure 18B:
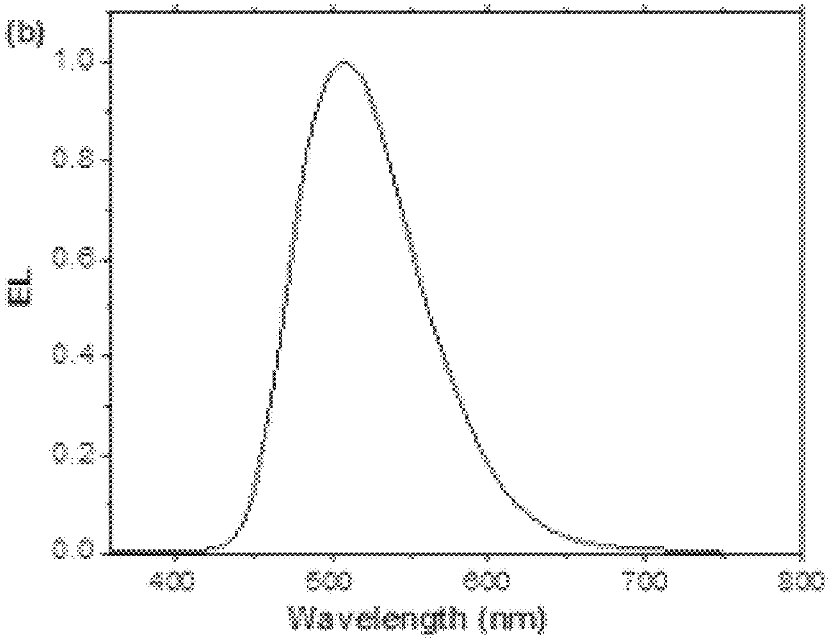
FIG. 18*b*. Electroluminescent spectra of D4.

Device 4. High-triplet material TAPC ($E_T$=2.87 eV) was used as HTL, FIG. 18*a*. The EQE is 8.1%, which is higher that with NPD as HTL (devices 1 and 2). The electroluminescence comes exclusively from the dopant, FIG. 18*b*.

Figure 19A:
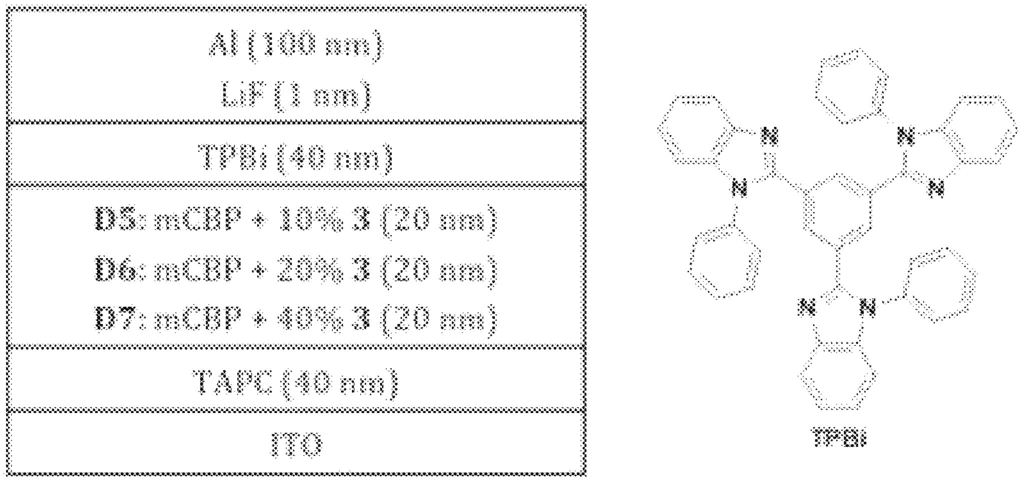
FIG. 19*a*. OLED architecture and the molecular structures of the compounds used in Device 5 (D5), Device 6 (D6), and Device 7 (D7), with compound 3 doped at 10%, 20%, and 40%, by volume, respectively.
Figure 19B:
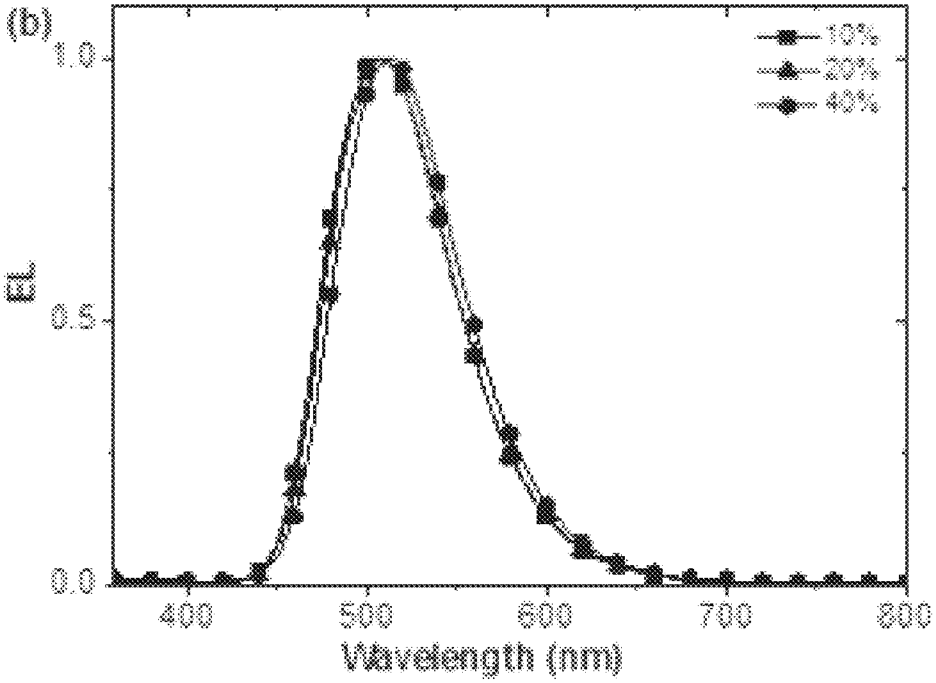
FIG. 19*b*. Electroluminescent spectra for D5, D6, and D7.
Figure 20:
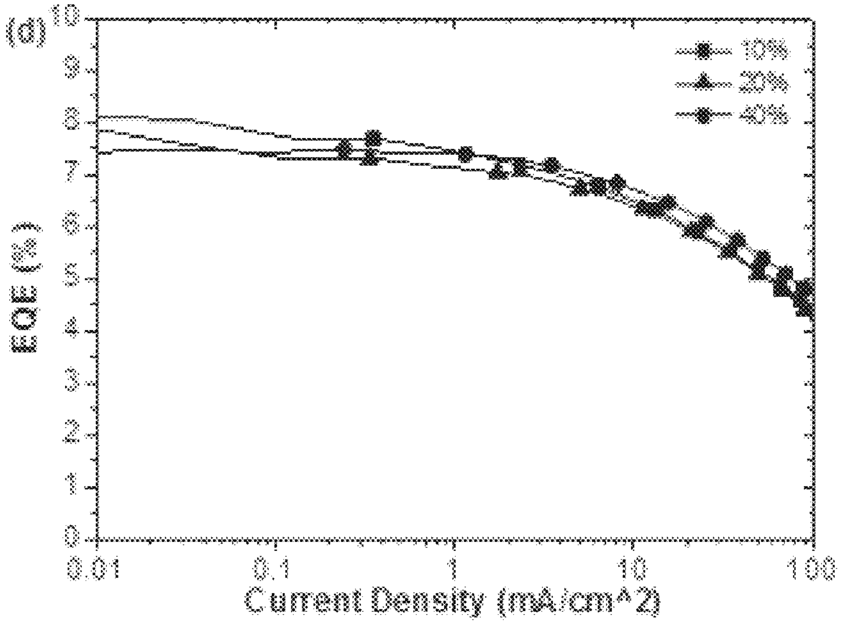
FIG. 20. External quantum efficiency data data for D5, D6, and D7.

Devices 5, 6 and 7. High triplet material TPBi ($E_T$=2.73 eV) was used as HBL instead of Bphen ($E_T$=2.50 eV), FIG. 19*a*. The EQE of of the TPBi device (D5) turned out to be very similar to that of the Bphen device (D4) with the same doping concentration, FIG. 19*b*. In addition, the EQE was not changing as the doping concentration was increased to 20% and 40%, FIG. 20. Therefore, 10% doping concentration will be used for the following devices.

Figure 21A:
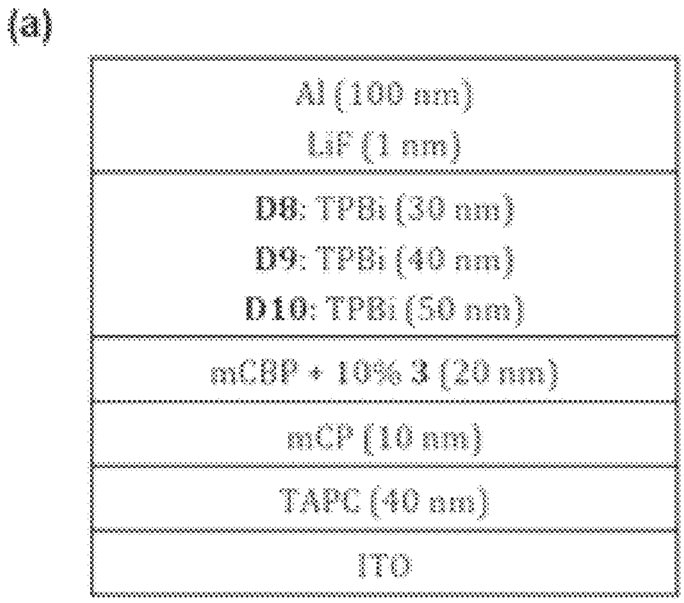
FIG. 21*a*. OLED architecture and the molecular structures of the compounds used in Device 8 (D8), Device 9 (D9), and Device 10 (D10), each doped at 10% by volume of compound 3 in TPBi with a layer thickness of 30 nm, 40 nm, and 50 nm, respectively.
Figure 21B:
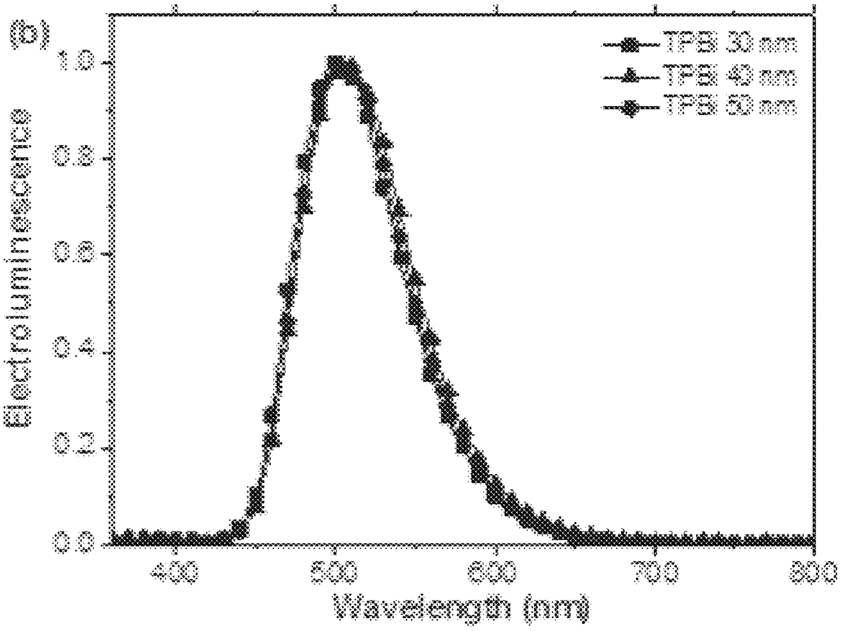
FIG. 21*b* Electroluminescent spectra for D8, D9, and D10.

Devices 8, 9 and 10. mCP was used as an exciton blocking layer. The ETL thickness varied from 30 nm, 40 nm to 50 nm, FIG. 21*a*. D9 and D5 show similar EQE (same ETL thickness), which indicates that mCP layer was not necessary. As the ETL thickness increases from 30 nm to 50 nm, the EQE increases from 8% to 10%, FIG. 21*b*. Therefore, 50 nm is the optimum ETL thickness to get efficient light outcoupling.

(MAAC*)Cu(CzCN) (2) based blue OLED devices

The triplet of (MAAC*)Cu(CzCN) is 3.1 eV (onset) which is much higher than that of mCBP (2.87

TABLE 7

Turn-on voltage ($V_T$, defined at brightness of 1 cd/m$^2$), maximum external quantum efficiency ($EQE_{max}$), maximum current efficiency ($\eta_{c,max}$), maximum power efficiency ($\eta_{p,max}$), maximum brightness ($B_{max}$), and emission maximum ($\lambda_{max}$) of the OLEDs with different dopants.

| Dopant | Device | $V_T$ (V) | $EQE_{max}$ (%) | $\eta_{c,max}$ (cd/A) | $\eta_{p,max}$ (lm/W) | $B_{max}$ (cd/m$^2$) | $\lambda_{max}$ (nm) |
|---|---|---|---|---|---|---|---|
| 3 | 1 | 3.3 | 6.1 | 18.5 | 15.2 | 27600 | 510 |
| | 2 | 3.3 | 5.5 | 17.0 | 14.5 | 25217 | 518 |
| | 3 | 3.1 | 9.3 | 24.8 | 21.5 | 23527 | 500 |
| | 4 | 2.6 | 8.1 | 24.9 | 23.9 | 43304 | 508 |
| | 5 | 2.5 | 8.1 | 23.4 | 27.5 | 31800 | 508 |
| | 6 | 2.5 | 7.6 | 22.4 | 27.0 | 31715 | 510 |
| | 7 | 2.4 | 7.5 | 23.0 | 28.8 | 33643 | 512 |
| | 8 | 2.8 | 6.0 | 16.3 | 17.5 | 26916 | 500 |
| | 9 | 2.8 | 8.1 | 23.6 | 25.8 | 31597 | 506 |
| | 10 | 2.8 | 10.2 | 29.1 | 31.7 | 36911 | 502 |
| 2 | 11 | 2.8 | 1.1 | 1.9 | 1.7 | 1077 | 466 |
| 6a | 12 | 3.5 | 5.8 | 10.9 | 7.8 | 466 | 456 |

eV). Therefore, the EQE is only about 1%. High triplet host material is needed.

Compound 9

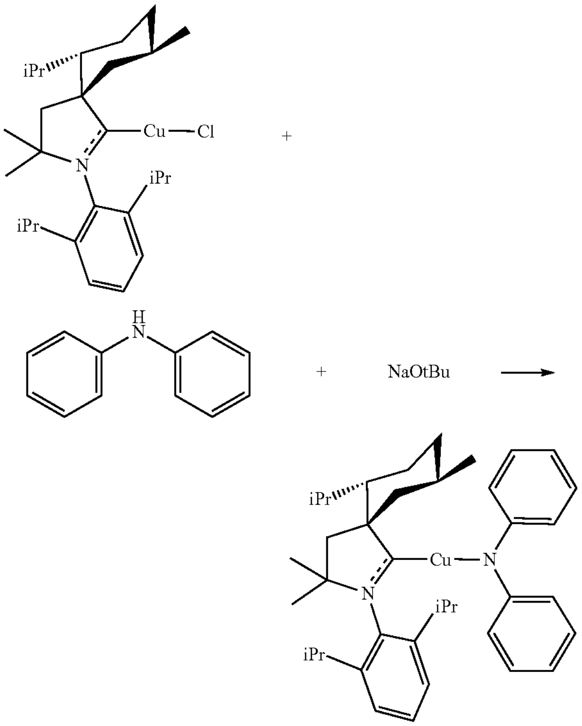

Around bottom flask equipped with a stir bar was charged with CAAC$^{Men}$-CuCl (950 mg, 1.98 mmol); diphenylamine (351 mg, 2.1 mmol); NaOtBu (199 mg, 2.1 mmol) under N2 atmosphere. THF was added and the reaction mixture was stirred at room temperature overnight. The mixture was then filtered through a plug of Celite® and the solvent was evaporated under reduced pressure. The resulting bright yellow powder was washed with pentane and dried under vacuum. 1.12 mg, 96% yield.

Compound 11

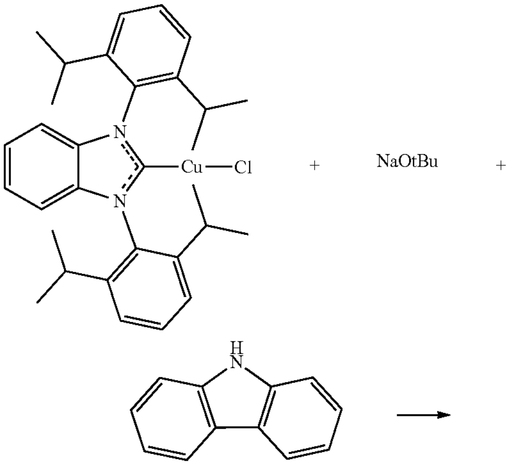

-continued

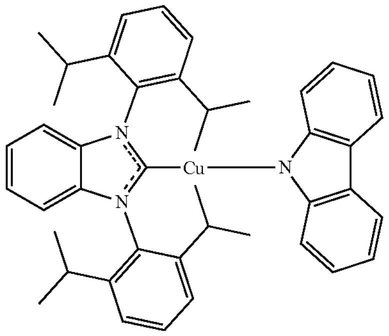

A round bottom flask equipped with a stir bar was charged with BzI-CuCl (120 mg, 0.22 mmol); carbazole (39 mg, 0.23 mmol); NaOtBu (22 mg, 0.23 mmol) under $N_2$ atmosphere. THF was added and the reaction mixture was stirred at room temperature overnight. The mixture was then filtered through a plug of Celite® and the solvent was evaporated under reduced pressure. The resulting grey solid was washed with pentane and dried under vacuum. 135 mg, 90.5% yield.

Compound 12a

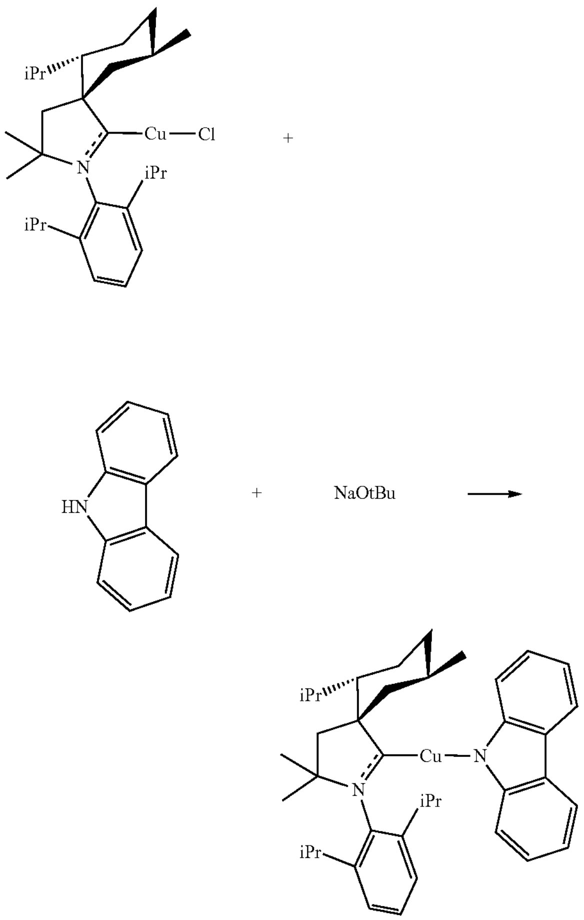

A round bottom flask equipped with a stir bar was charged with $CAAC^{Men}$-CuCl (200 mg, 0.42 mmol); carbazole (73 mg, 0.44 mmol); NaOtBu (42 mg, 0.44 mmol) under $N_2$ atmosphere. THF was added and the reaction mixture was stirred at room temperature overnight. The mixture was then filtered through a plug of Celite® and the solvent was evaporated under reduced pressure. The resulting pale yellow solid was washed with pentane and dried under vacuum. 228 mg, 90% yield.

Compounds 12*b*, 12c, and 12d

Compounds 12*b*, 12c, and 12d were also prepared as described for compound 12a with the corresponding substituted carbazoles indicated below, and the carbene ligand of compound 12a.

12b

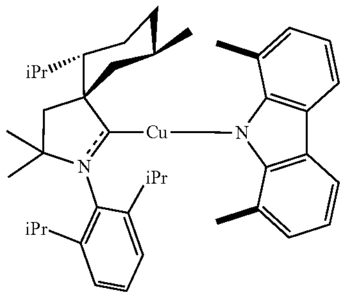

12c

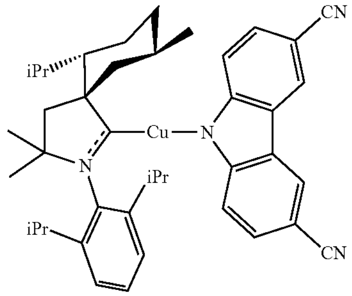

12d

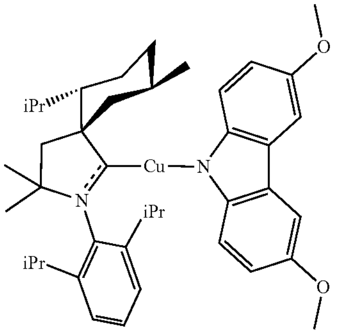

Figure 22:
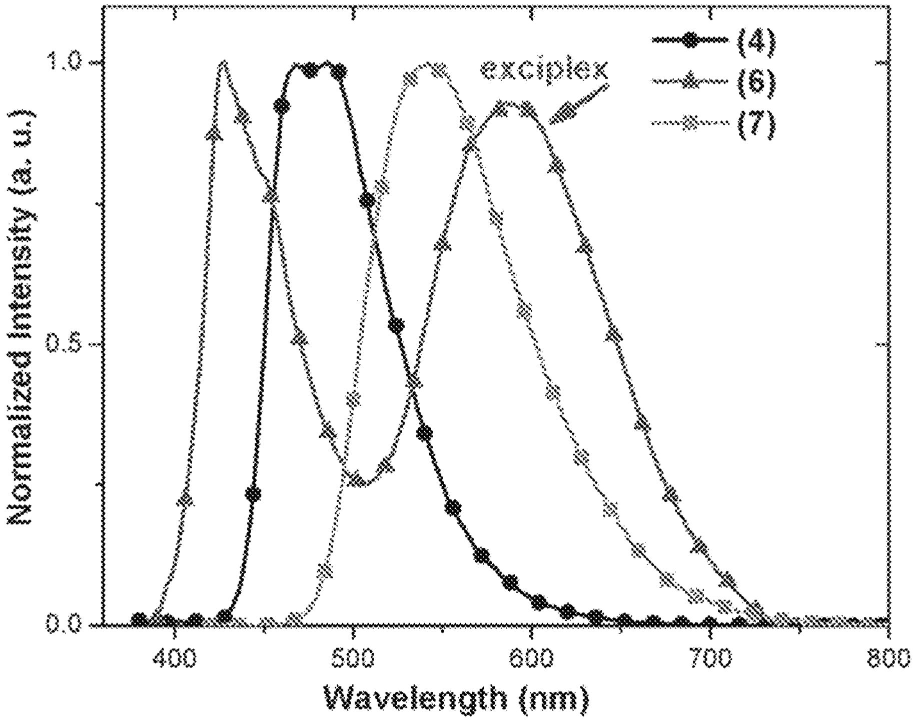
FIG. 22 Emission spectra of compounds 12*a* (labeled 4), compound 12*c* (labeled 6), and compound 12*d* (labeled 7) in MeCy at room temperature.

FIG. 22 is the emission spectra of compounds 12*a* (labeled 4), compound 12c (labeled 6), and compound 12d (labeled 7) in MeCy at room temperature.

Compound 13

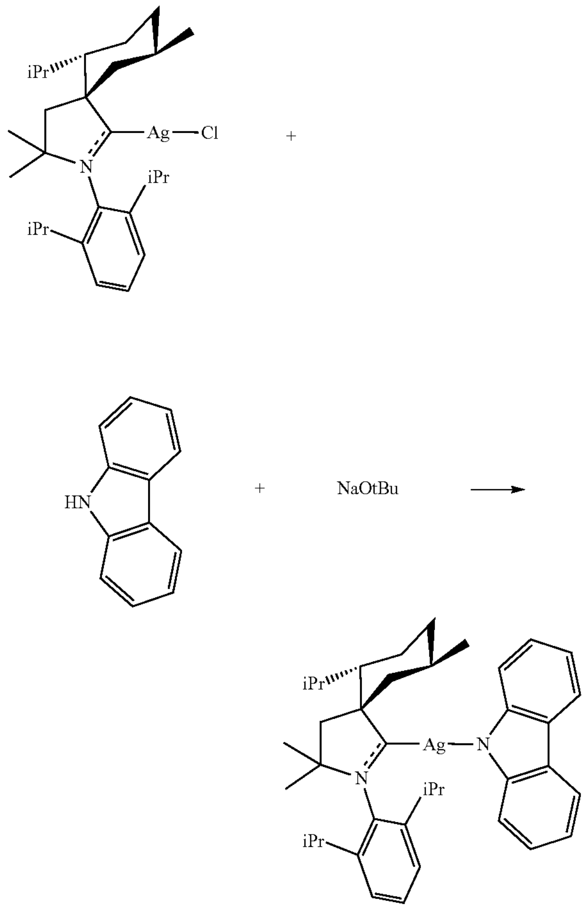

A round bottom flask equipped with a stir bar was charged with CAAC$^{Men}$-AgCl (100 mg, 0.19 mmol); carbazole (33 mg, 0.2 mmol); NaOtBu (19 mg, 0.2 mmol) under $N_2$ atmosphere. THF was added and the reaction mixture was stirred at room temperature overnight. The mixture was then filtered through a plug of Celite® and the solvent was evaporated under reduced pressure. The resulting white solid was washed with pentane and dried under vacuum. 120 mg, 96% yield.

Compound 14

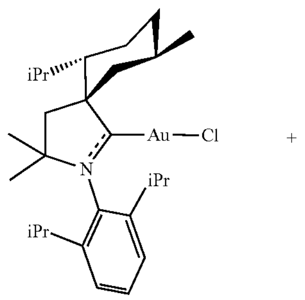

-continued

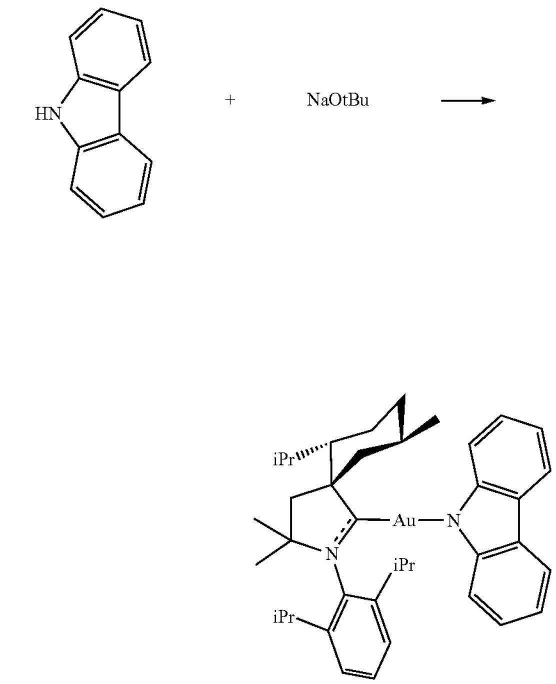

Figure 23:
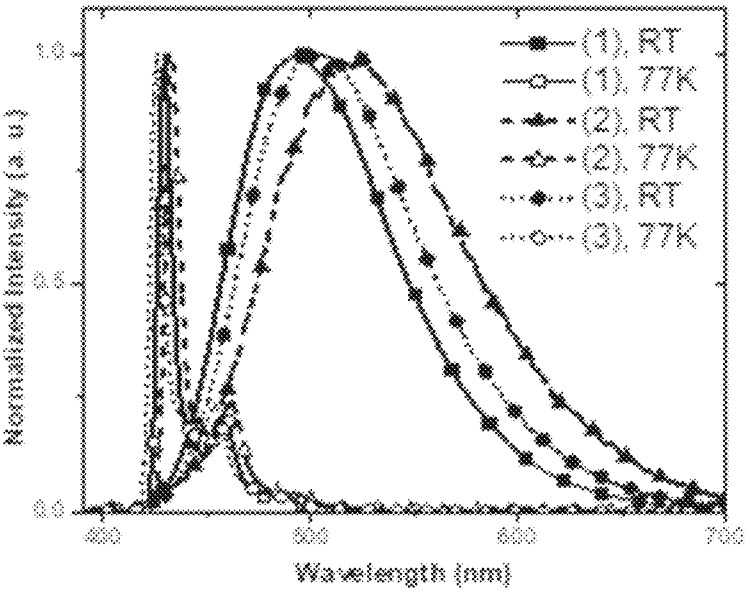
FIG. 23. Emission spectra THF (left), and in MeTHF (right) of compounds 12*a* (spectrum 1), compound 13 (spectrum 2), and compound 14 (spectrum 3) at RT and 77K.
Figure 24:
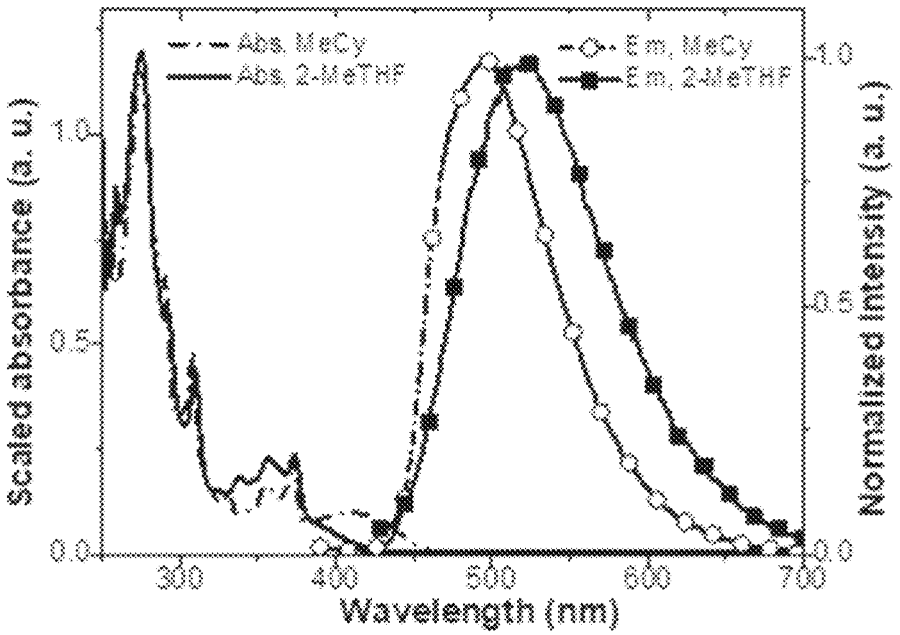
FIG. 24. Absorption and emission spectra of compound 12 in MeCy (dashed lines) and 2-MeTHF (solid lines) at RT.

A round bottom flask equipped with a stir bar was charged with CAAC$^{Men}$-AuCl (100 mg, 0.16 mmol); carbazole (28 mg, 0.17 mmol); NaOtBu (16 mg, 0.17 mmol) under $N_2$ atmosphere. THF was added and the reaction mixture was stirred at room temperature overnight. The mixture was then filtered through a plug of Celite® and the solvent was evaporated under reduced pressure. The resulting greyish-white solid was washed with pentane and dried under vacuum. 128 mg, >100% yield, due to excess Cz. FIG. 23 is the emission spectra of compounds 12 (spectrum 1), compound 13 (spectrum 2), and compound 14 (spectrum 3) at THF, 77K (left), and in MeTHF, RT (right) RT. FIG. 24 is the absorption and emission spectra of compound 12 in MeCy (dashed lines) and 2-MeTHF (solid lines) at RT.

Compound 15

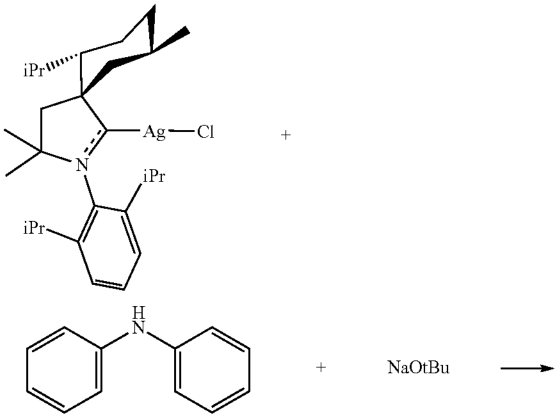

-continued

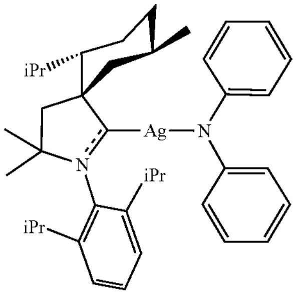

A round bottom flask equipped with a stir bar was charged with CAAC$^{Men}$-AgCl (200 mg, 0.38 mmol); diphenylamine (68 mg, 0.4 mmol); NaOtBu (38 mg, 0.4 mmol) under $N_2$ atmosphere. THF was added and the reaction mixture was stirred at room temperature overnight. The mixture was then filtered through a plug of Celite® and the solvent was evaporated under reduced pressure. The resulting pale yellow solid was washed with pentane and dried under vacuum. 194 mg, 77% yield. Compound 16

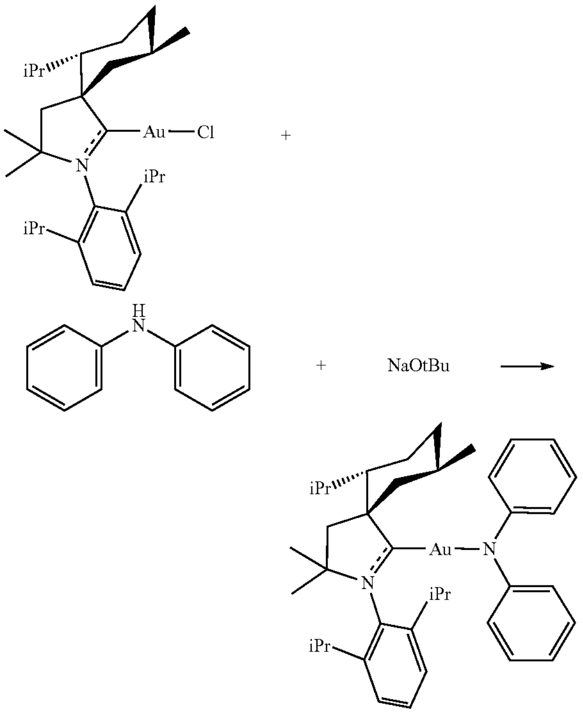

Figure 25:
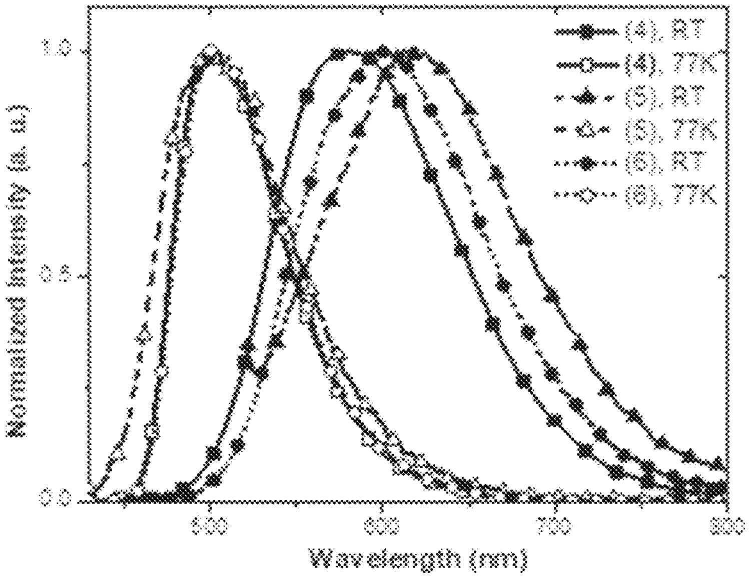
FIG. 25. Emission spectra in THF (left), and in 2-MeTHF (right), of compound 9 (spectrum 4), compound 15 (spectrum 5), and compound 16 (spectrum 6), at room temperature and 77K.

A round bottom flask equipped with a stir bar was charged with CAAC$^{Men}$-AuCl (200 mg, 0.32 mmol); diphenylamine (58 mg, 0.34 mmol); NaOtBu (33 mg, 0.34 mmol) under $N_2$ atmosphere. THF was added and the reaction mixture was stirred at room temperature overnight. The mixture was then filtered through a plug of Celite® and the solvent was evaporated under reduced pressure. The resulting bright yellow solid was washed with pentane and dried under vacuum. 180 mg, 74% yield. FIG. 25 is the emission spectra in THF (left), and in 2-MeTHF (right), of compound 9 (spectrum 4), compound 15 (spectrum 5), and compound 16 (spectrum 6), at room temperature and 77K.

Compound 17

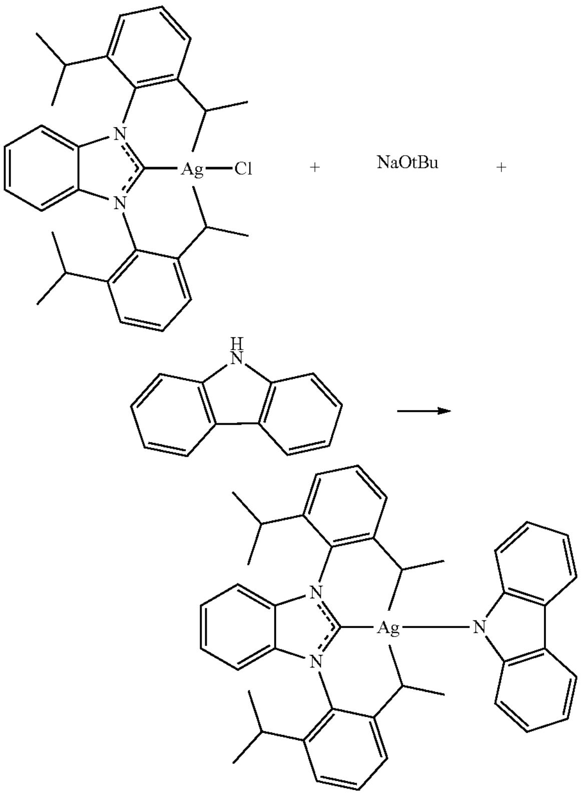

A round bottom flask equipped with a stir bar was charged with BzI-AgCI (150 mg, 0.26 mmol); carbazole (47 mg, 0.28 mmol); NaOtBu (27 mg, 0.28 mmol) under $N_2$ atmosphere. THE was added and the reaction mixture was stirred at room temperature overnight. The mixture was then filtered through a plug of Celite® and the solvent was evaporated under reduced pressure. The resulting grey solid was washed with pentane and dried under vacuum. 130 mg, 71% yield.

Compound 18

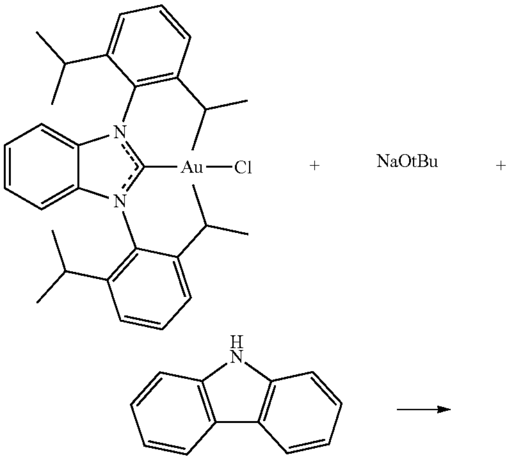

-continued

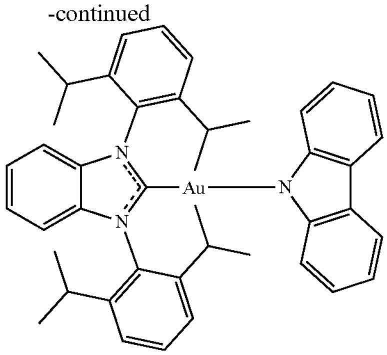

Figure 26:
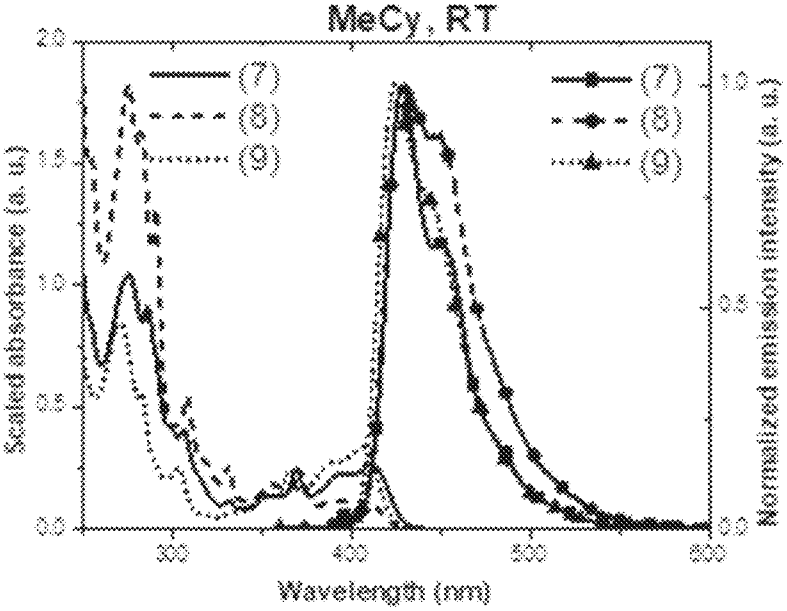
FIG. 26. Absorption and emission spectra of compound 11 (spectrum 7), compound 17 (spectrum 8), and compound 18 (spectrum 9) in MeCy at room temperature.

A round bottom flask equipped with a stir bar was charged with BzI-AuCl (120 mg, 0.18 mmol); carbazole (33 mg, 0.2 mmol); NaOtBu (19 mg, 0.2 mmol) under $N_2$ atmosphere. THF was added and the reaction mixture was stirred at room temperature overnight. The mixture was then filtered through a plug of Celite® and the solvent was evaporated under reduced pressure. The resulting grey solid was washed with pentane and dried under vacuum. 116 mg, 81% yield. FIG. 26 is the absorption and emission spectra of compound 11 (spectrum 7), compound 17 (spectrum 8), and compound 18 (spectrum 9) in MeCy at room temperature.

Compound 19

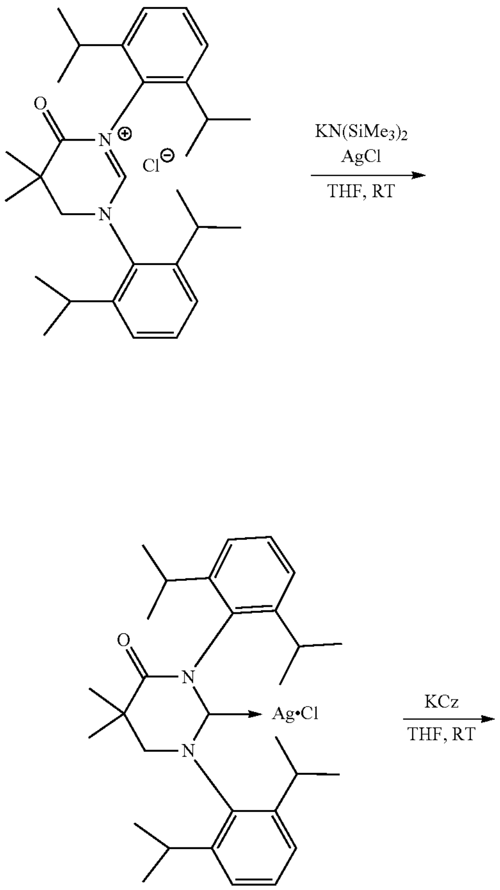

MAAC*AgCl

-continued

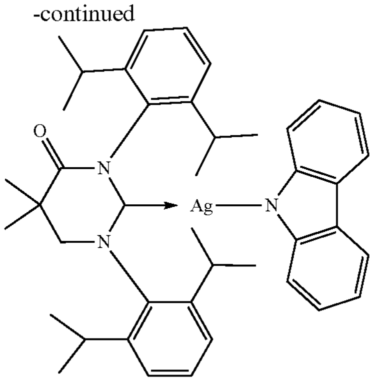

MAAC*AgCz (MAAC*)Ag(Cz) (11). MAAC*AgCl (100 mg, 0.17 mmol) and KCz (35 mg, 0.17 mmol) were dissolved in THF (20 mL) and the reaction mixture was stirred at RT overnight, filtered through Celite and the solvent was concentrated to 3 mL under reduced pressure. Hexane (20 mL) was added to the solution and a yellow precipitate formed. The solid was dried under vacuum.

Figure 27:
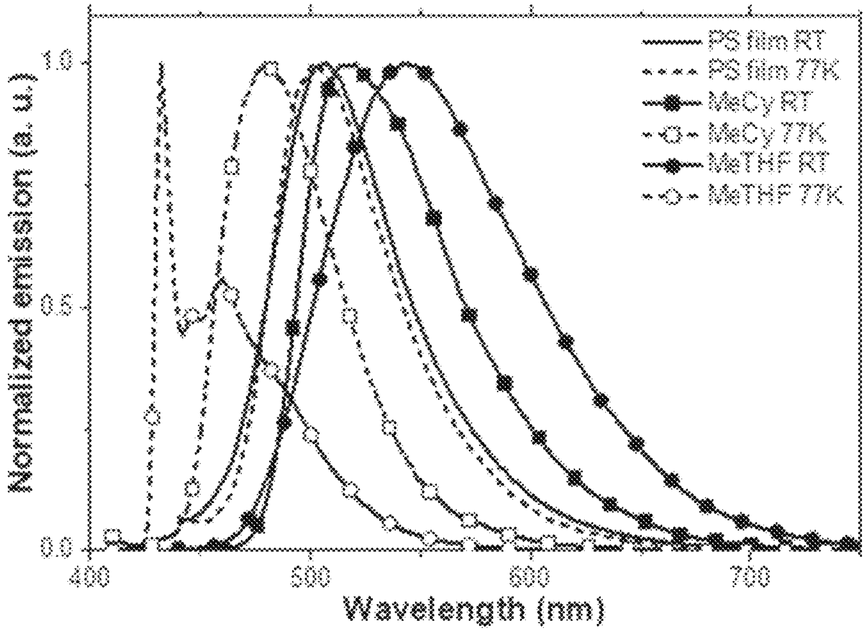
FIG. 27. Emission spectra of compound 3 at room temperature and at 77K in 2-MeTHF, MeCy, and as 1% PS film.
Figure 28:
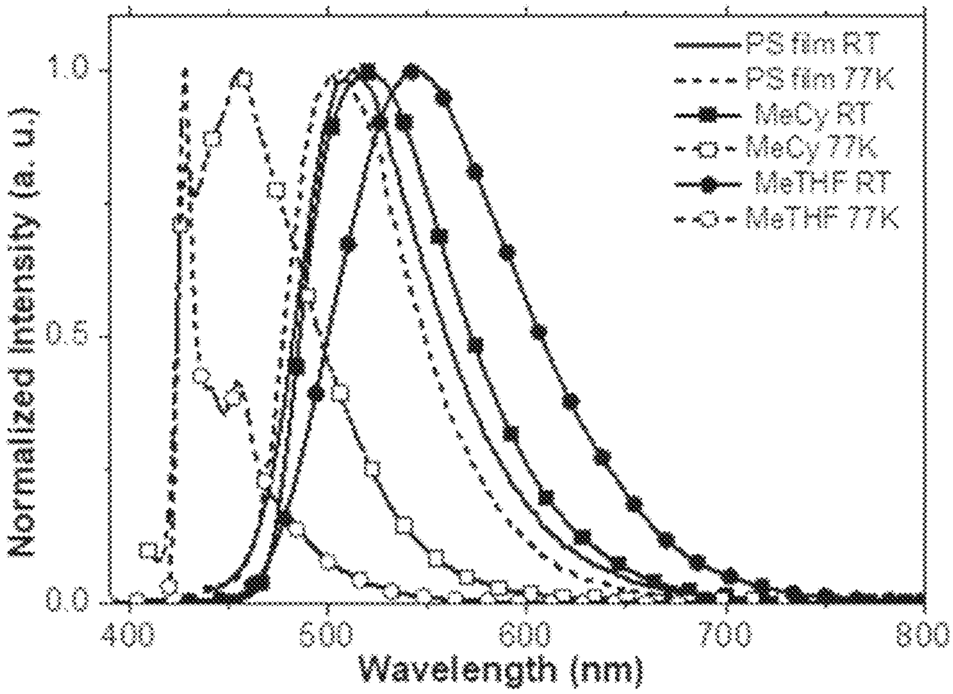
FIG. 28. Emission spectra of compound 19 at room temperature and at 77K in 2-MeTHF, MeCy, and as 1% PS film.
Figure 29A:
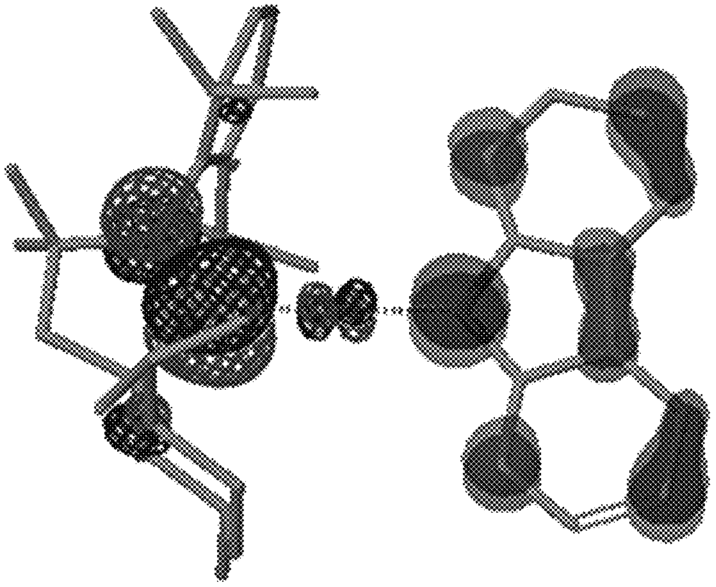
FIGS. 29A through 29F show calculated structures of the carbozilide compounds 12, 13, 14, 11, 17, and 18 respectively.
Figure 29B:
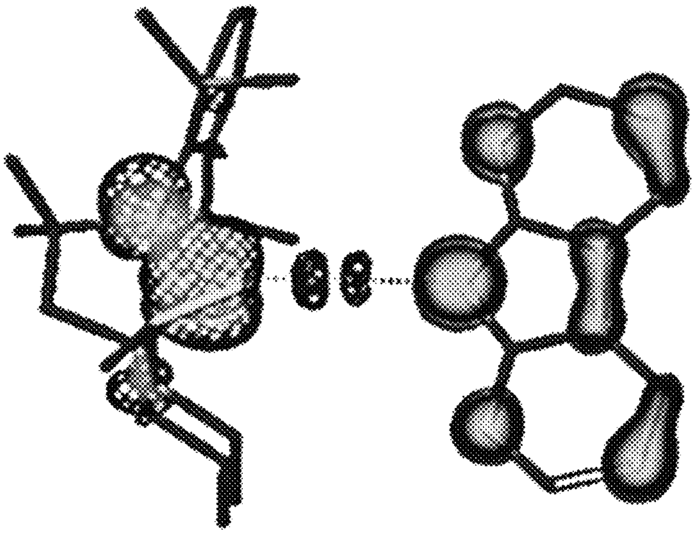
Figure 29C:
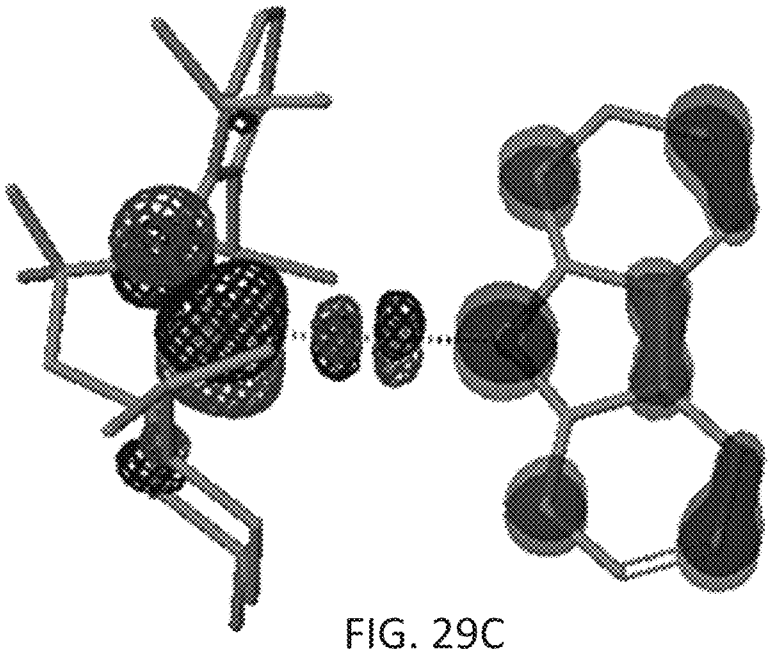
Figure 29D:
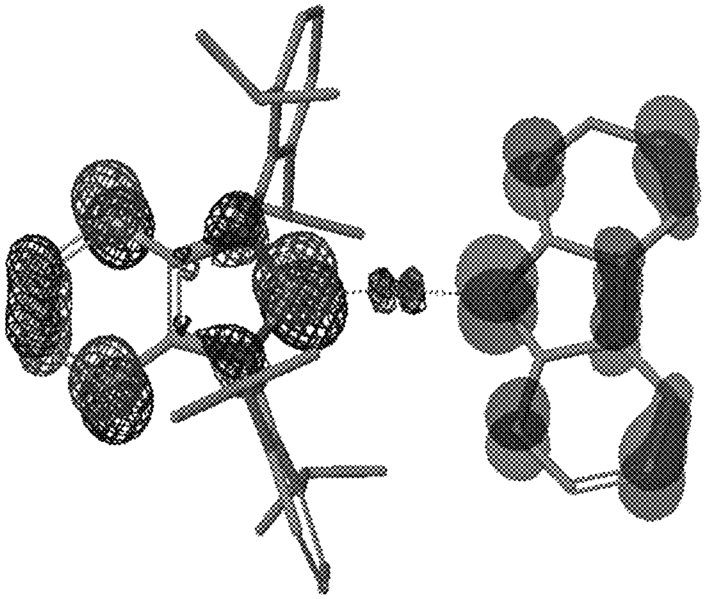
Figure 29E:
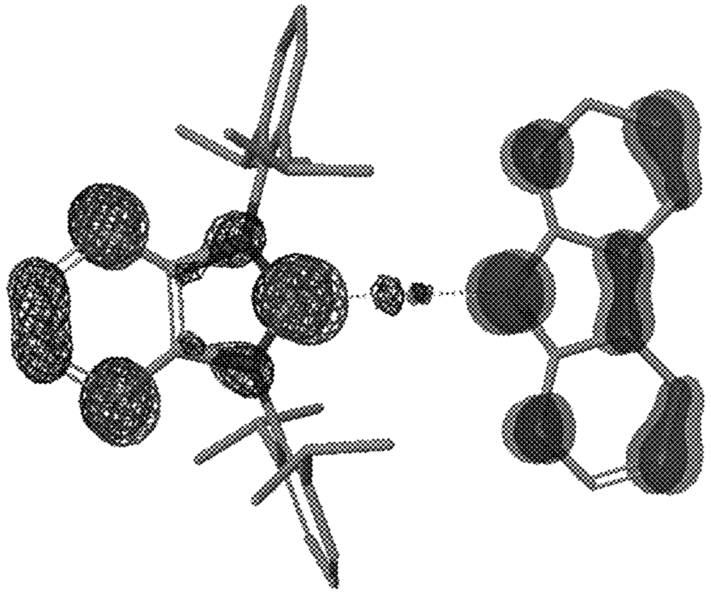
Figure 29F:
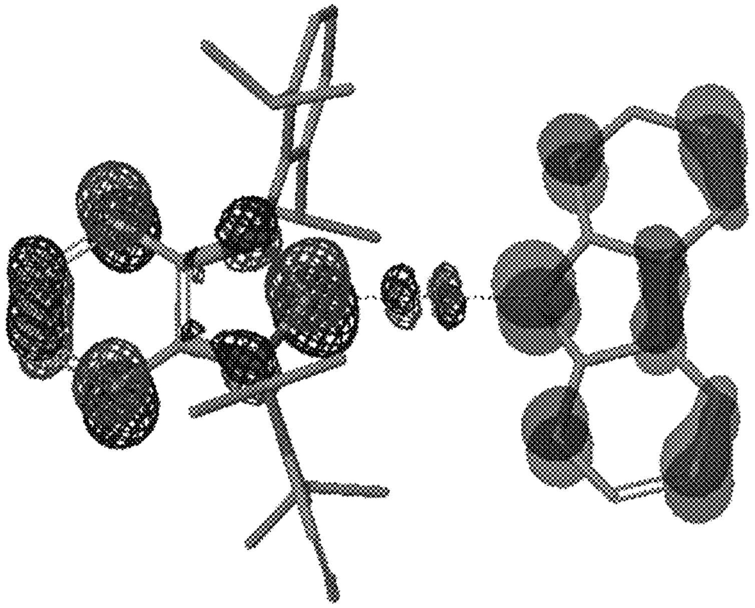

FIG. 27 is the emission spectra of compound 3 at room temperature and at 77K in 2-MeTHF, MeCy, and as 1% PS film._FIG. 28 is the emission spectra of compound 19 at room temperature and at 77K in 2-MeTHF, MeCy, and as 1% PS film.

Compound 20

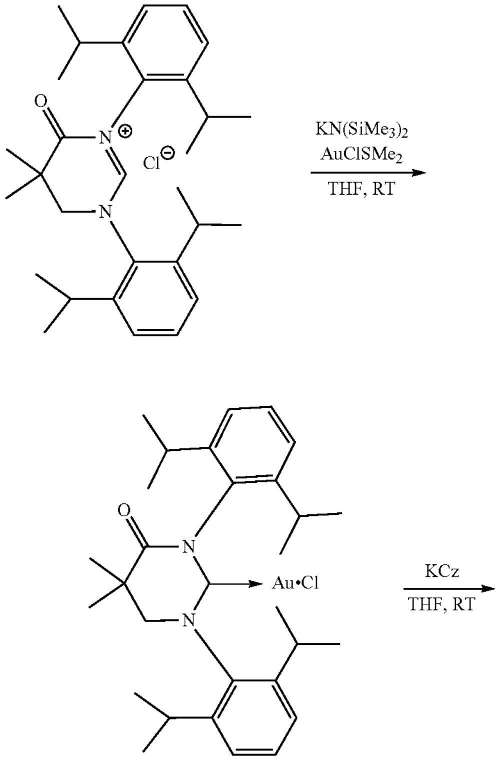

MAAC*AuCl

-continued

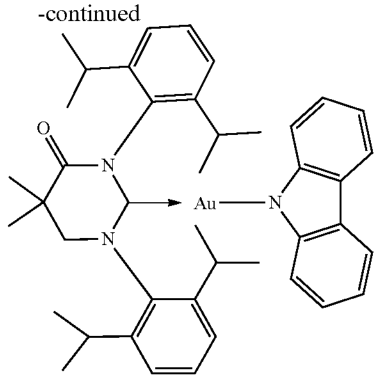

MAAC*AuCz

Compound 21

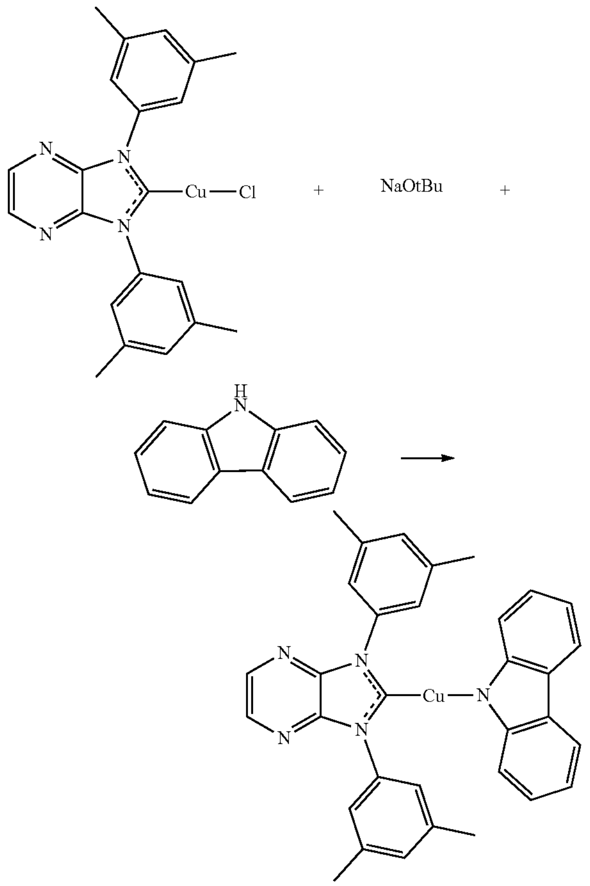

A round bottom flask equipped with a stir bar was charged with pzl-CuCl (54 mg, 0.126 mmol); carbazole (22 mg, 0.133 mmol); and NaOtBu (13 mg, 0.133 mmol) under $N_2$ atmosphere. THF was added and the reaction mixture was stirred at room temperature overnight. The mixture was then filtered through a plug of Celite® and the solvent was evaporated under reduced pressure. The resulting bright yellow solid was washed with pentane and dried under vacuum. 50 mg, 71% yield.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having Formula I

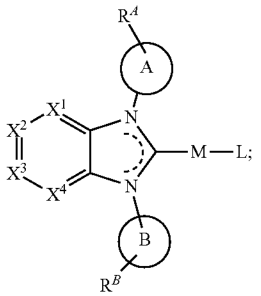

wherein $X^1$ and $X^4$ can be both C or both N;

$X^2$ and $X^3$ are C;

ring A and ring B are each a benzene ring with at least one substituent at ortho position;

L is a monodentate ligand with a coordinating member selected from the group consisting of C, N, O, S, and P;

M is a metal selected from the group consisting of Au and Ag; and each of $R^A$ and $R^B$ represents mono-substituted or di-substituted alkyl.

2. The compound of claim 1, wherein L is selected from the group consisting of:

$NR^XR^Y$, $PR^XR^Y$, $CR^XR^YR^Z$, substituted phenyl, $OR^X$, and $SR^X$, wherein $R^X$, $R^Y$, and $R^Z$ are independently selected from the group consisting of hydrogen, deuterium, alkyl, cycloalkyl, heteroalkyl, heterocycloalkyl, aryl, heteroaryl, and combinations thereof, each of which is optionally substituted, or optionally, $R^X$ and $R^Y$ can join to form five-membered or six-membered, carbocyclic or heterocyclic ring, which is optionally substituted.

3. The compound of claim 2, wherein L is $NR^XR^Y$ and is selected from the group consisting of:

an optionally substituted carbazolyl, or an aza-derivative thereof;

an optionally substituted diphenylamino, or an aza-derivative thereof;

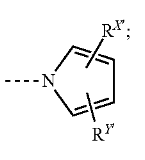 ; 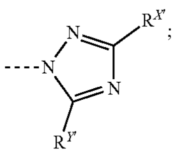 ; 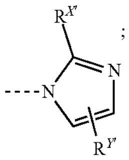 ;

-continued

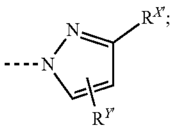

;

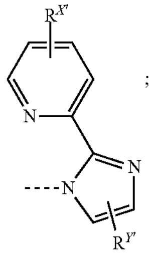

;

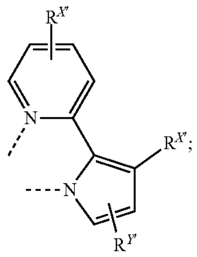

and

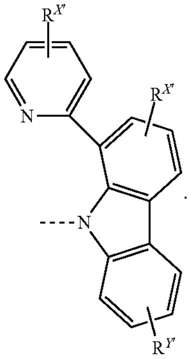

wherein $R^{x'}$ and $R^{y'}$ are independently selected from the group consisting of hydrogen, deuterium, halogen, alkyl, cycloalkyl, heteroalkyl, arylalkyl, amino, silyl, aryl, heteroaryl, and combinations thereof, and $R^k$ and $R^1$ are as defined above.

4. The compound of claim 2, wherein $R^X$ and/or $R^Y$ is selected from the group consisting of: an aryl optionally substituted with deuterium, alkyl, or an electron donating substituent group; a heteroaryl optionally substituted with deuterium, alkyl, or an electron donating substituent group; and an alkyl optionally substituted with one or more deuterium atoms.

5. The compound of claim 1, with an emission lifetime selected from the group consisting of 0.05 μs to 10 μs, and 0.05 μs to 2 μs, as measured as a polystyrene film at 23° C.

6. The compound of claim 1, whose energy separation (ΔE) between the lowest excited singlet state and triplet states is from 10 meV and 150 meV as determined by temperature dependent emission lifetime measurement.

7. The compound of claim 1, with an emission spectra spanning from 400 nm to 550 nm as measured in MeCy at RT.

8. The compound of claim 1, being an E-type delayed fluorescent emitter.

9. The compound of claim 1, wherein the metal is Ag.

10. The compound of claim 1, wherein the metal is Au.

11. The compound of claim 1, selected from the group consisting of:

Compound 17

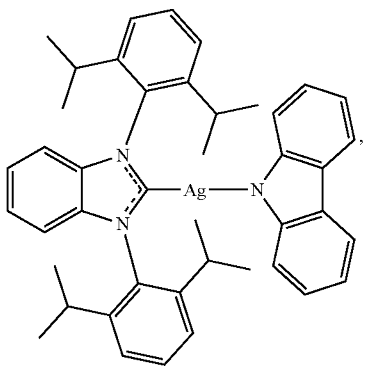

, and

Compound 18

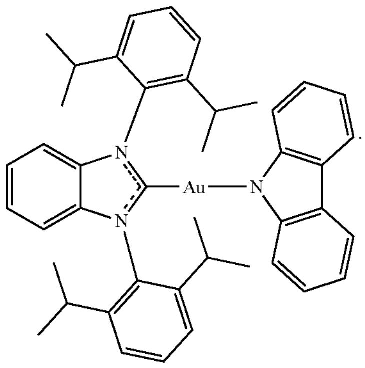

.

12. An organic electroluminescent device (OLED) that includes an anode, a cathode, and an organic layer comprising a compound having Formula I

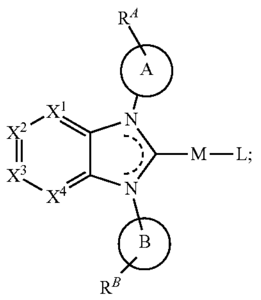

wherein $X^1$ and $X^4$ can be both C or both N;

$X^2$ and $X^3$ are C;

ring A and ring B are each a benzene ring with at least one substituent at ortho position;

L is a monodentate ligand with a coordinating member selected from the group consisting of C, N, O, S, and P;

M is a metal selected from the group consisting of Au and Ag; and each of $R^A$ and $R^B$ represents a mono-substituted or di-substituted alkyl.

13. The OLED of claim 12, wherein the device emits a luminescent radiation at room temperature when a voltage is applied across the organic light emitting device, and the luminescent radiation comprises a first radiation component that arises from a delayed fluorescent process or triplet exciton harvesting process.

14. The OLED of claim 12, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

15. The OLED of claim 12, wherein the organic layer further comprises a host, wherein the host is selected from the group consisting of:

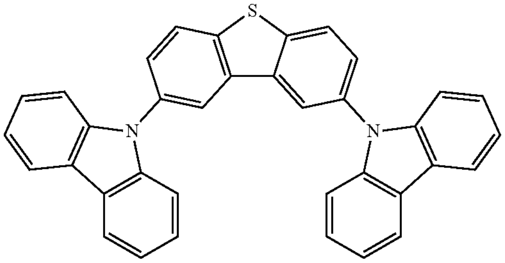
,

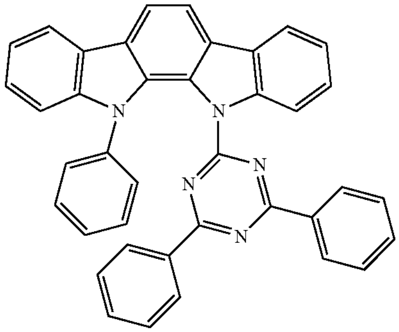
,

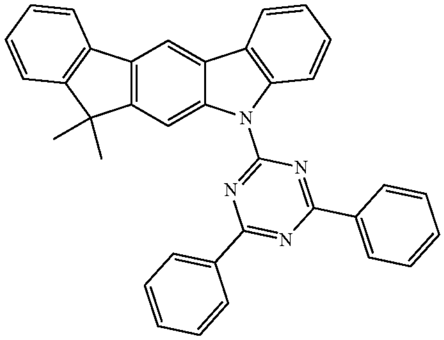
,

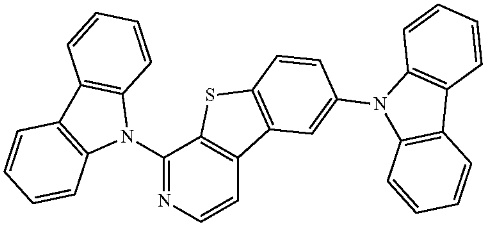
,

-continued

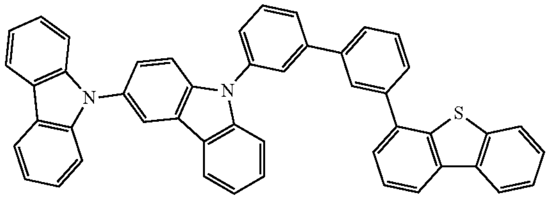
,

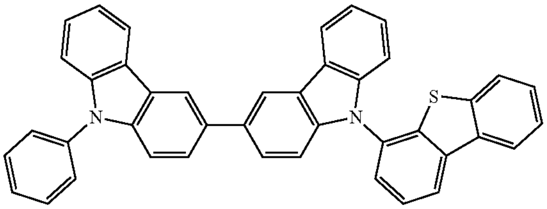
,

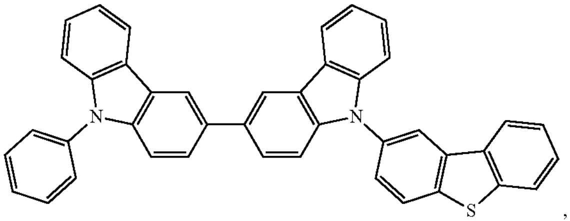
,

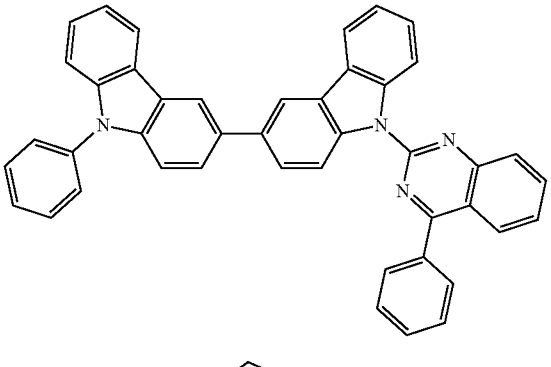
,

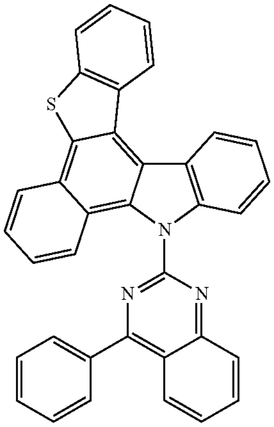
,

-continued
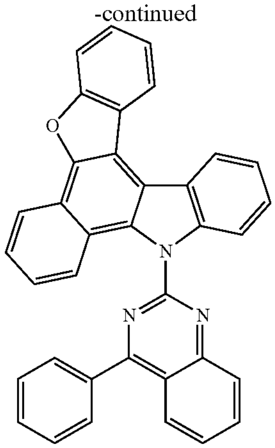
,
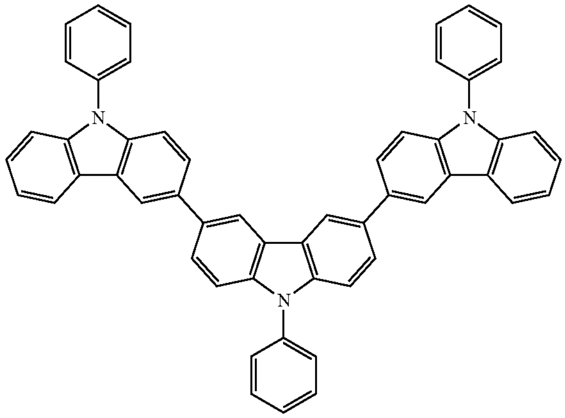
,
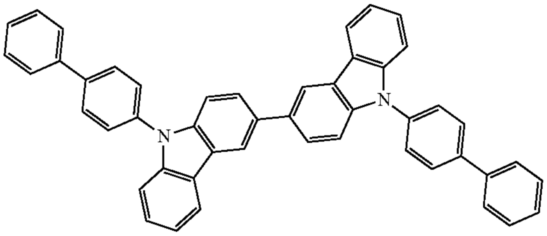
,
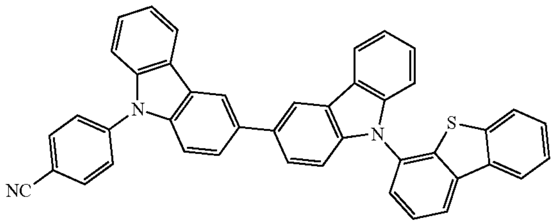
,
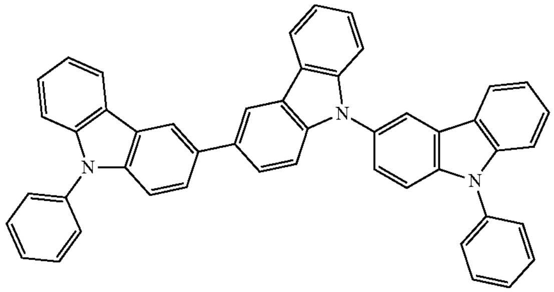
,
-continued
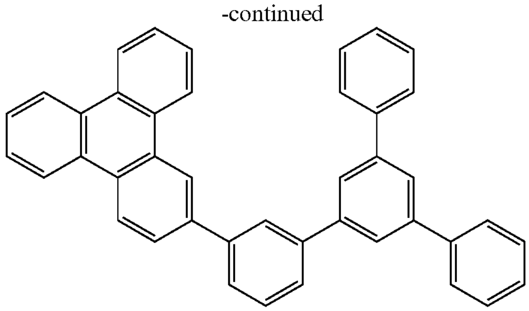
,
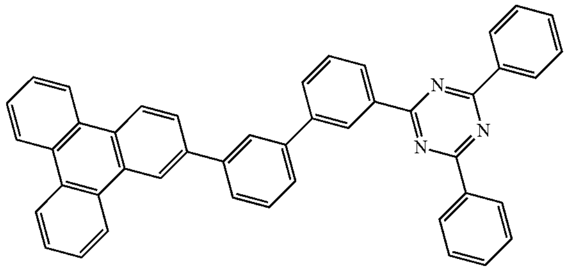
,
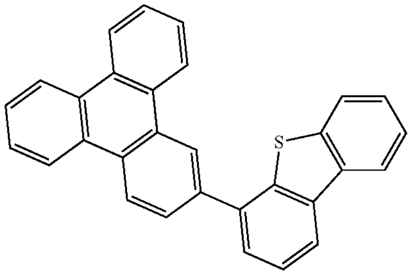
,
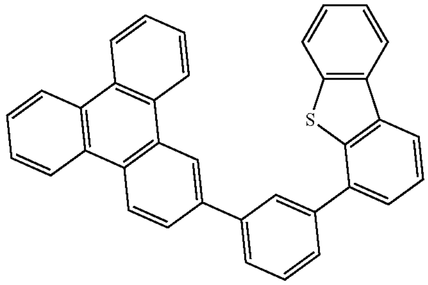
,
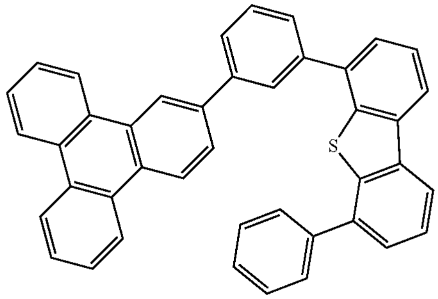
,
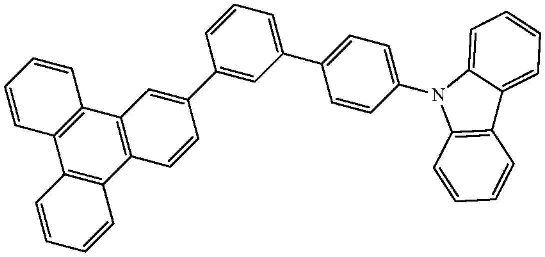
, -continued

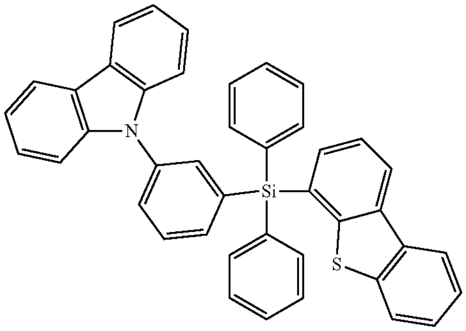

,

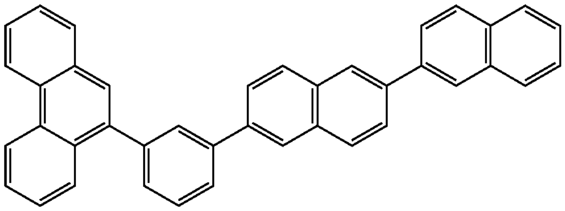

,

16. A consumer product comprising an organic light-emitting device (OLED), the OLED including an anode, a cathode, and an organic layer comprising A compound having Formula I

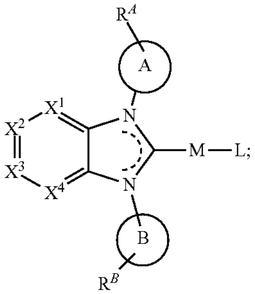

wherein $X^1$ and $X^4$ can be both C or both N;

$X^2$ and $X^3$ are C;

ring A and ring B are each a benzene ring with at least one substituent at ortho position;

L is a monodentate ligand with a coordinating member selected from the group consisting of C, N, O, S, and P;

M is a metal selected from the group consisting of Au and Ag; and each of $R^A$ and $R^B$ represents a mono-substituted or di-substituted alkyl.

17. The compound of claim 1, wherein each of $R^A$ and $R^B$ is a di-substituted alkyl wherein the di-substituted alkyl is isopropyl.

* * * * *